(12) United States Patent
Kim et al.

(10) Patent No.: US 9,728,729 B2
(45) Date of Patent: Aug. 8, 2017

(54) ORGANIC LIGHT-EMITTING DEVICE

(71) Applicant: SAMSUNG DISPLAY CO., LTD., Yongin, Gyeonggi-Do (KR)

(72) Inventors: Seul-Ong Kim, Yongin (KR); Youn-Sun Kim, Yongin (KR); Dong-Woo Shin, Yongin (KR); Jung-Sub Lee, Yongin (KR); Naoyuki Ito, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 414 days.

(21) Appl. No.: 14/458,431

(22) Filed: Aug. 13, 2014

(65) Prior Publication Data

US 2015/0318511 A1 Nov. 5, 2015

(30) Foreign Application Priority Data

May 2, 2014 (KR) ........................ 10-2014-0053612

(51) Int. Cl.
*H01L 51/50* (2006.01)
*H01L 51/00* (2006.01)
*H01L 27/32* (2006.01)

(52) U.S. Cl.
CPC ...... *H01L 51/0072* (2013.01); *H01L 27/3244* (2013.01); *H01L 51/0052* (2013.01); *H01L 51/0058* (2013.01); *H01L 51/0059* (2013.01); *H01L 51/0067* (2013.01); *H01L 51/5004* (2013.01); *H01L 51/5028* (2013.01); *H01L 51/0054* (2013.01); *H01L 51/0074* (2013.01);

(Continued)

(58) Field of Classification Search
None
See application file for complete search history.

(56) References Cited

U.S. PATENT DOCUMENTS

2003/0197467 A1* 10/2003 Adachi ............... H01L 51/5088
   313/504
2005/0121666 A1* 6/2005 Kondakova ......... H01L 51/0085
   257/40

(Continued)

FOREIGN PATENT DOCUMENTS

KR     10-0879477 B1    1/2009
KR     10-2012-0057611 A   6/2012

(Continued)

*Primary Examiner* — Gregory Clark
(74) *Attorney, Agent, or Firm* — Lee & Morse, P.C.

(57) ABSTRACT

An organic light-emitting device and a flat panel display, the device including an anode; a cathode; and an organic layer therebetween, the organic layer including an EML, the EML including a first host and a second host that are different from one another, a hole transport region between the anode and the EML, the hole transport region including at least one of a hole injection layer (HIL), a hole transport layer (HTL), a buffer layer, or an electron blocking layer (EBL), an electron transport region between the EML and the cathode, the electron transport region including at least one of a hole blocking layer (HBL), an electron transport layer (ETL), or an electron injection layer (EIL), and an intermediate layer between the EML and the electron transport region; wherein the intermediate layer includes a compound having an electron affinity of more than 0 eV and less than 2.5 eV.

21 Claims, 1 Drawing Sheet

10

| 190 |
|:---:|
| 150 |
| 110 |

(52) U.S. Cl.
CPC ...... *H01L 51/0081* (2013.01); *H01L 51/0085* (2013.01); *H01L 51/0094* (2013.01); *H01L 51/5096* (2013.01); *H01L 2251/5384* (2013.01); *H01L 2251/552* (2013.01)

(56) References Cited

U.S. PATENT DOCUMENTS

| | | | |
|---|---|---|---|
| 2006/0124924 A1* | 6/2006 | Suh | H01L 51/002 |
| | | | 257/40 |
| 2009/0096357 A1 | 4/2009 | Lee et al. | |
| 2010/0237334 A1* | 9/2010 | Ma | C07D 307/91 |
| | | | 257/40 |
| 2012/0032155 A1* | 2/2012 | Mitsuya | H01L 27/3209 |
| | | | 257/40 |
| 2012/0126205 A1 | 5/2012 | Kawamura et al. | |
| 2012/0138915 A1 | 6/2012 | Nishimura et al. | |
| 2012/0153268 A1 | 6/2012 | Kawamura et al. | |
| 2013/0112952 A1 | 5/2013 | Adamovich et al. | |

FOREIGN PATENT DOCUMENTS

| | | |
|---|---|---|
| KR | 10-2012-0092550 A | 8/2012 |
| KR | 10-2012-0100709 A | 9/2012 |
| KR | 10-2013-0073023 A | 7/2013 |

\* cited by examiner

10

| 190 |
|---|
| 150 |
| 110 |

ORGANIC LIGHT-EMITTING DEVICE

CROSS-REFERENCE TO RELATED APPLICATION

Korean Patent Application No. 10-2014-0053612, filed on May 2, 2014, in the Korean Intellectual Property Office, and entitled: "Organic Light-Emitting Device," is incorporated by reference herein in its entirety.

BACKGROUND

1. Field

Embodiments relate to an organic light-emitting device.

2. Description of the Related Art

Organic light-emitting devices (OLEDs), which are light-emitting devices, may have advantages such as wide viewing angles, excellent contrast, quick response, high brightness, excellent driving voltage characteristics, and may provide muilticolored images.

An organic light-emitting device may have a structure of a first electrode, a hole transport region, an emission, an electron transport region, and a second electrode that are sequentially stacked on a substrate. Holes injected from the first electrode may move to the emission layer via the hole transport region, and electrons injected from the second electrode may move to the emission layer via the electron transport region. Carriers, such as the holes and electrons, may recombine in the emission layer to generate excitons. When the excitons drop from an excited state to a ground state, light is emitted.

SUMMARY

Embodiments are directed to an organic light-emitting device.

According to one or more embodiments, an organic light-emitting device that includes an anode; a cathode; and an organic layer that is disposed between the anode and the cathode and includes an emission layer (EML), wherein the organic layer includes i) a hole transport region that is disposed between the anode and the EML, and includes at least one selected from a hole injection layer, a hole transport layer, a buffer layer, and an electron blocking layer; and ii) an electron transport region that is disposed between the EML and the cathode, and includes at least one selected from a hole blocking layer, an electron transport layer, and an electron injection layer;

the EML includes two different hosts;

an intermediate layer is disposed between the EML and the electron transport region; and the intermediate layer includes a compound having an electron affinity of more than 0 eV or less than 2.5 eV.

According to another embodiment, a flat panel display apparatus includes the organic light-emitting device, wherein the first electrode of the organic light-emitting device is electrically connected to a source electrode or a drain electrode.

BRIEF DESCRIPTION OF THE DRAWING

Features will be apparent to those of skill in the art by describing in detail exemplary embodiments with reference to the attached drawings in which:

FIG. 1 illustrates a schematic view of a structure of an organic light-emitting device according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

According to an embodiment, an organic light-emitting device may include an anode; a cathode; and an organic layer between the anode and the cathode and includes an emission layer (EML).

The organic layer may include i) a hole transport region between the anode and the EML and includes at least one selected from a hole injection layer (HIL), a hole transport layer (HTL), a buffer layer, and an electron blocking layer (EBL) and ii) an electron transport region between the EML and the cathode and includes at least one selected from a hole blocking layer (HBL), an electron transport layer (ETL), and an electron injection layer (EIL).

The EML may include two different hosts, e.g., a first host and a second host that are different from one another.

An intermediate layer may be included between the EML and the electron transport region.

In an implementation, the intermediate layer may include a compound having an electron affinity of more than 0 eV and less than 2.5 eV.

The intermediate layer may include a compound having a carbide-based or carbazole-containing group or an arylamine-based electron donating group (EDG) that has the capability of hole transport. For example, a compound formed of an electron withdrawing group (EWG) that has capability of electron transport and a hydrocarbon-based ring may be used on a side of a negative electrode (cathode) from the EML.

In an implementation, a compound for the intermediate layer may be formed of or may include an EDG and may have a low electron affinity, e.g., of less than 2.5 eV. Such a material for the intermediate layer may be exceptionally used in consideration of general use of a material that has a high electron affinity of about 3.0 eV in the electron transport region. In this regard, there may be an energy barrier of the electron injection to the EML from the ETL, and such an energy barrier may be appropriately adjusted to facilitate a charge balance of the entire organic light-emitting device.

When the numbers of holes injected from a positive electrode (anode) are not in balance with respect to the number of electrons injected from a negative electrode (cathode), the electrons or the holes that fail to produce excitons in the EML may be accumulated in the EML or may leak through adjacent layers from the EML. Such carriers that fail to produce excitons may interrupt oxidation and reduction in the EML or may reduce a lifespan of the organic light-emitting device by affecting adjacent layers from the EML. According to an embodiment, the electrons may be trapped in the intermediate layer of the organic light-emitting device. Thus, the transport of the electrons to the EML may be slowed down. In addition, on the basis of appropriate adjustment in the charge balance, the leakage of the electrons is reduced and excitons may be efficiently confined within the EML.

In addition, the intermediate layer of the organic light-emitting device according to an embodiment may have a higher triplet energy than that of a phosphorescent dopant to help reduce and/or prevent diffusion of the excitons in the EML to adjacent layers from the EML. The intermediate layer may also block emission at an interlace between the EML and the ETL to help prevent color mixing of EL spectrum and help improve stability of the organic light-emitting device to efficiently increase a lifespan thereof.

In an exemplary embodiment, the EML may be a phosphorescent EML.

As noted above, the two different hosts may include a first host and a second host. A relationship of electron affinities (EA) and ionization potentials (IP) of the first host and the second host may satisfy at least one of the following expressions.

$$EA_{host1} \geq EA_{host2} + 0.3 \text{ eV} \quad (1)$$

$$IP_{host2} \geq IP_{host1} + 0.3 \text{ eV} \quad (2)$$

In an exemplary embodiment, the EML may be a phosphorescent EML, and the phosphorescent EML may include two different hosts and a dopant that emits phosphorescence having a main peak of at least 450 nm. The dopant may be, e.g., a compound capable of emitting phosphorescence having a main peak in a range of about 450 nm to above 700 nm.

In an exemplary embodiment, the EML may be a phosphorescent EML, and the phosphorescent EML may include two different hosts and a dopant that emits phosphorescence having a main peak of at least 450 nm. At least one of the two different hosts may be a compound that includes a triphenylene moiety or a carbazole moiety.

In an exemplary embodiment, the intermediate layers may contact the EML, and a compound for the intermediate layer may include a carbazole moiety or an arylamine moiety and may have an electron affinity of more than 0 eV and less than 2.5 eV.

In an exemplary embodiment, an electron affinity of a compound for the intermediate layer [$EA_{intermediate\ layer}$] and an electron affinity of a compound for the ETL [$EA_{ETL}$] may satisfy a relationship represented by the following expression.

$$EA_{ETL} \geq EA_{intermediate\ layer} + 0.3 \text{ eV}$$

In an exemplary embodiment, a triplet energy of the compound for the intermediate layer [$E^T_{IL}(eV)$] may be greater than that of the phosphorescent dopant [$E^T_d(eV)$], e.g., in a relationship represented by the following expression.

$$E^T_{IL}(eV) > E^T_d(eV)$$

In an exemplary embodiment, in consideration of triplet energies of the hosts and the dopant in the adjacent EML, the compound for the intermediate layer may have a triplet energy of at least 2.2 eV, e.g., in a range of about 2.2 eV to about 4 eV, in an EML emitting red phosphorescence, e.g., in a red phosphorescent EML. In an implementation, the compound for the intermediate layer may have a triplet energy of at least 2.4 eV, e.g., in a range of about 2.4 eV to about 4 eV, in the EML emitting green phosphorescence, e.g., in a green phosphorescent EML. Alternatively, the compound for the intermediate layer may have a triplet energy of at least 2.6 eV, e.g., in a range of 2.6 eV to about 4 eV, in the EML emitting blue phosphorescence, e.g., in a blue phosphorescent EML.

In an exemplary embodiment, the EML may be a phosphorescent EML and may include an Ir-complex, Pt-complex, Cu-complex, or Os-complex as a dopant. The dopant may be, e.g., represented by formula 401 described below.

In an exemplary embodiment, the compound for the intermediate layer may be represented by formula 1 below.

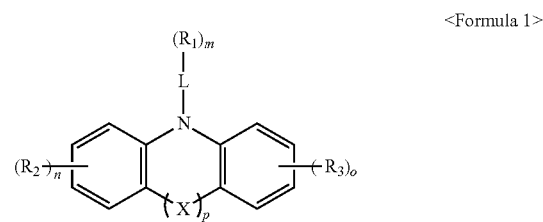

<Formula 1>

In Formula 1, X may be a single bond or $NR_4$.

$R_1$ to $R_4$ may be each independently a hydrogen, a deuterium, $-P(=O)R_{51}R_{52}$, a substituted or unsubstituted $C_1$-$C_{60}$ alkyl group, a substituted or unsubstituted $C_1$-$C_{60}$ heteroalkyl group, a substituted or unsubstituted $C_6$-$C_{60}$ aryl group, a substituted or unsubstituted $C_2$-$C_{60}$ heteroaryl group, a substituted or unsubstituted $C_6$-$C_{60}$ condensed polycyclic group, or a $C_6$-$C_{30}$ arylamine group.

In an implementation, adjacent substituents of $R_2$ and $R_3$ may link together to form a ring.

L may be a single bond, a substituted or unsubstituted $C_6$-$C_{60}$ arylene group, a substituted or unsubstituted $C_1$-$C_{60}$ heteroarylene group, or a linkage connecting 2 to 5 of the arylene groups or the heteroarylene groups.

$R_{51}$ and $R_{52}$ may be each independently a substituted or unsubstituted $C_1$-$C_{60}$ alkyl group, a substituted or unsubstituted $C_1$-$C_{60}$ heteroalkyl group, a substituted or unsubstituted $C_6$-$C_{60}$ aryl group, a substituted or unsubstituted $C_2$-$C_{60}$ heteroaryl group, a substituted or unsubstituted $C_6$-$C_{60}$ condensed polycyclic group, or a $C_6$-$C_{30}$ arylamine group.

m, n, and o may be each independently an integer selected from 1 to 4. In an implementation, when each or any of m, n, and o is 2 or greater, $R_1$ to $R_3$ may be identical to or different from each other.

p may be an integer selected from 0 and 1. In an implementation, when p is 0, the benzene moiety substituted with $R_2$ and a benzene moiety substituted with $R_3$ are not meant to be, e.g., may not be, connected in an X-shape.

For example, when p is 0, formula 1 may be represented by Formula 2 below.

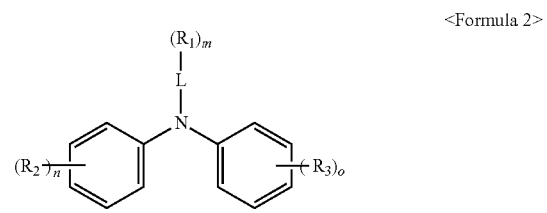

<Formula 2>

In an exemplary embodiment, $R_1$ to $R_4$ may be each independently a hydrogen, a deuterium, a substituted or unsubstituted $C_1$-$C_{30}$ alkyl group, a substituted or substituted $C_1$-$C_{30}$ heteroalkyl group, a substituted or unsubstituted $C_6$-$C_{30}$ arylamine group, or a group represented by one of Formulae 2a to 2x below.
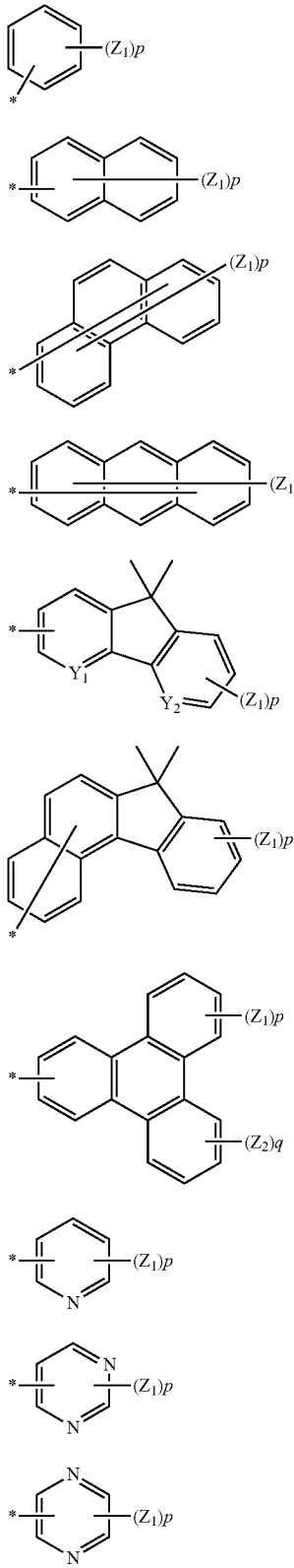
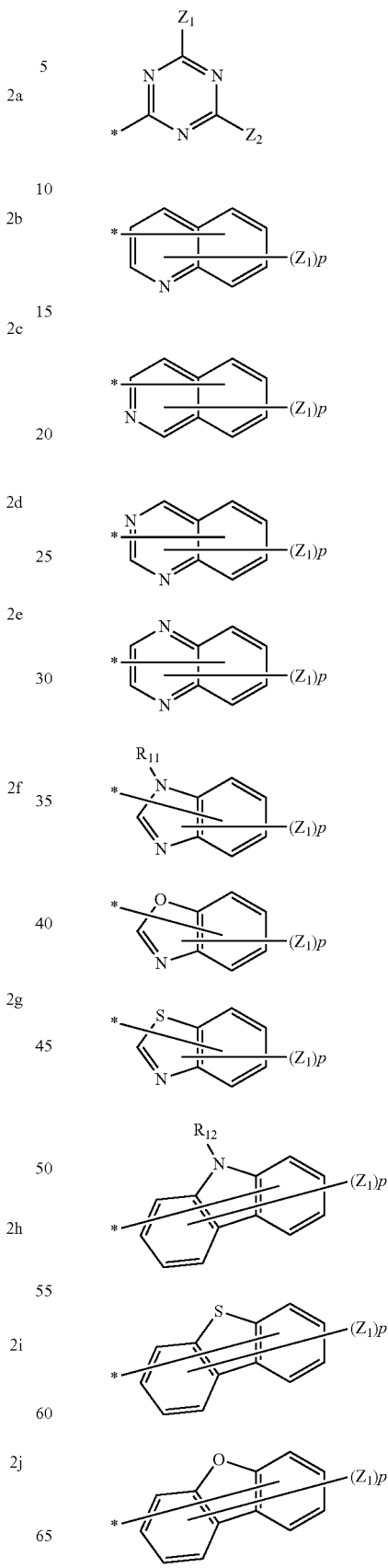

-continued

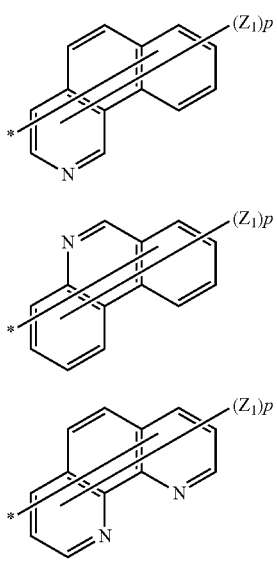

2v 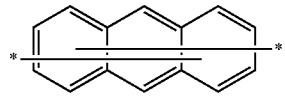

2w 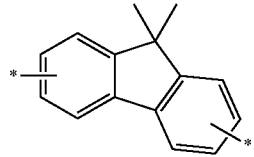

2x 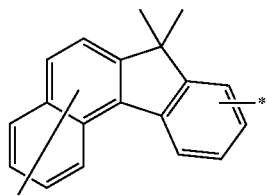

In Formulae 2a to 2x, $R_{11}$, $R_{12}$, $Z_1$, and $Z_2$ be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted monovalent non-aromatic condensed polycyclic group, and a substituted or unsubstituted monovalent non-aromatic hetero-condensed polycyclic group.

$Y_1$ and $Y_2$ may be each independently CH or N.

p and q may be each independently an integer selected from 1 to 9.

In an implementation, when p and/or q are 2 or greater, a plurality of $Z_1$ and/or $Z_2$ may be identical to or different from each other.

* indicates a binding site with a neighboring atom.

In an exemplary embodiment, L may be a single bond or a group represented by one of formulae 3a to 3z below.

3a 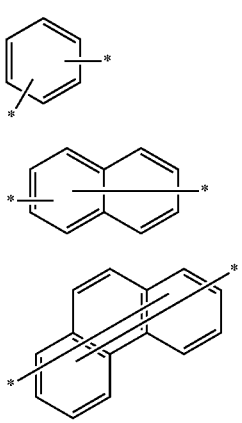

3b

3c

3d 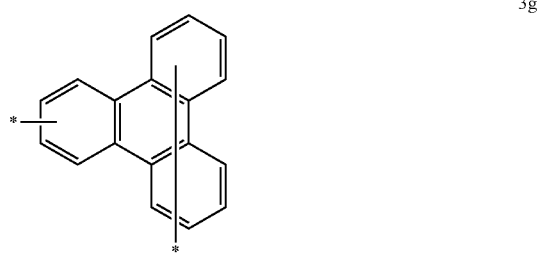

3e

3f 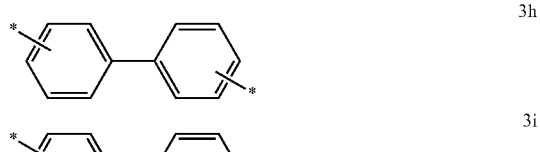

3g 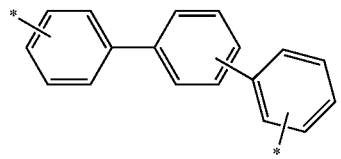

3h 

3i 

3j 

3k 

3l

3m 

3n

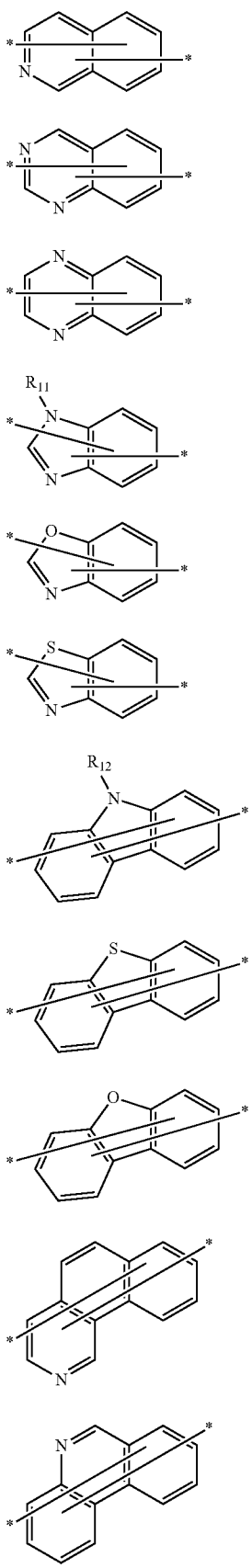

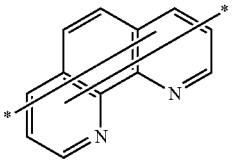

In Formulae 3a to 3z, $R_{11}$ and $R_{12}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted monovalent non-aromatic condensed polycyclic group, and a substituted or unsubstituted monovalent non-aromatic hetero-condensed polycyclic group.

* indicates a binding site with a neighboring atom.

Hereinafter, definitions of representative substituents used herein will now be described (In this regard, the number of carbons restricting a substituent is not limited, and does not limit properties of the substituent, and unless defined otherwise, the definition of the substituent is consistent with a general definition thereof).

As used herein, a $C_1$-$C_{60}$ alkyl group denotes a monovalent linear or branched aliphatic hydrocarbon group, and detailed examples of thereof include a methyl group, an ethyl group, a propyl group, an isobutyl group, a sec-butyl group, a tert-butyl group, a pentyl group, an iso-amyl group, and a hexyl group. As used herein, a $C_1$-$C_{60}$ alkylate group includes a divalent group that has the same structure as the $C_1$-$C_{60}$ alkyl group.

As used herein, a $C_1$-$C_{60}$ heteroaryl group denotes a compound group having at least one selected from sulfur (S), nitrogen (N), oxygen (O), phosphorous (P), and silicon (Si).

As used herein, a $C_1$-$C_{60}$ alkoxy group denotes a monovalent group having a formula of —$OA_{101}$ (here, $A_{101}$ is the $C_1$-$C_{60}$ alkyl group), and detailed examples thereof include a methoxy group, an ethoxy group, and an isopropyloxy group.

As used herein, a $C_2$-$C_{60}$ alkenyl group has a structure including at least one carbon-carbon double bond in the middle or at an end of the $C_2$-$C_{60}$ alkyl group, and detailed examples of the $C_2$-$C_{60}$ alkenyl group include an ethenyl group, a propenyl group, and a butenyl group. As used herein, a $C_2$-$C_{60}$ alkenylene group denotes a divalent group that has the same structure as the $C_2$-$C_{60}$ alkenyl group.

As used herein, a $C_2$-$C_{60}$ alkynyl group has a structure including at least one carbon-carbon triple bond in the middle or at an end of the $C_2$-$C_{60}$ alkyl group, and detailed examples thereof include an ethynyl group and a propynyl group. As used herein, a $C_2$-$C_{60}$ alkynylene group denotes a divalent group that has the same structure as the $C_2$-$C_{60}$ alkynyl group.

As used herein, a $C_3$-$C_{10}$ cycloalkyl group denotes a $C_3$-$C_{10}$ monovalent saturated hydrocarbon, monocyclic group, and detailed examples thereof include a cyclopropyl group, a cyclobutyl group, a cyclopentyl group, a cyclohexyl group, and a cycloheptyl group. As used herein, a $C_3$-$C_{10}$ cycloalkylene group denotes a divalent group that has the same structure as the $C_3$-$C_{10}$ cycloalkyl group.

As used herein, the $C_2$-$C_{10}$ heterocycloalkyl group denotes a $C_2$-$C_{10}$ monovalent monocyclic group including at least one hetero atom selected from N, O, P, and S as a ring-forming atom, and detailed examples of the $C_2$-$C_{10}$ heterocycloalkyl group include a tetrahydrofuranyl group and a tetrahydrothiophenyl group. As used herein, a $C_2$-$C_{10}$ heterocycloalkylene group denotes a divalent group that has the same structure as the $C_2$-$C_{10}$ heterocycloalkyl group.

As used herein, a $C_3$-$C_{10}$ cycloalkenyl group denotes a $C_3$-$C_{10}$ monovalent monocyclic group having at least one double bond in the ring while not losing its aromacity, and detailed examples of the $C_3$-$C_{10}$ to cycloalkenyl group include a cyclopentyl group, a cyclohexenyl group, and a cycloheptenyl group. As used herein, the $C_3$-$C_{10}$ cycloalkenylene group denotes a divalent group that has the same structure as the $C_3$-$C_{10}$ cycloalkenyl group.

As used herein, a $C_2$-$C_{10}$ heterocycloalkenyl group denotes a $C_2$-$C_{10}$ monovalent monocyclic group including at least one hetero atom selected from N, O, P, and S as a ring-forming atom and at least one double bond in the ring, and detailed examples of the $C_2$-$C_{10}$ heterocycloalkenyl group include a 2,3-hydrofuranyl group and a 2,3-hydrothiophenyl group. As used herein, a $C_2$-$C_{10}$ heterocycloalkenylene group denotes a divalent group that has the same structure as the $C_2$-$C_{10}$ heterocycloalkenyl group.

As used herein, a $C_6$-$C_{10}$ aryl group denotes a monovalent group having a $C_6$-$C_{60}$ carbocyclic aromatic system, and a $C_6$-$C_{60}$ arylene group denotes a divalent group that has a $C_6$-$C_{60}$ carbocyclic aromatic system. Detailed examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group include two or more rings, the rings may be fused to each other.

As used herein, a $C_2$-$C_{60}$ heteroaryl group denotes a monovalent group including at least one heteroatom selected from N, O, P, and S as a ring-forming atom and having a $C_2$-$C_{60}$ carbocyclic aromatic system, and a $C_1$-$C_{60}$ heteroarylene group denotes a divalent group including at least one heteroatom selected from N, O, P, and S as a ring-forming atom and having a $C_2$-$C_{60}$ carbocyclic aromatic system. Detailed examples of the heteroaryl group include a pyridinyl group, a pyrimidinyl group, a pyrazinyl group, a pyridazinyl group, a triazinyl group, a quinolinyl group, and an isoquinolinyl group. When the $C_2$-$C_{60}$ heteroaryl group and a $C_2$-$C_{60}$ heteroarylene group include at two or more rings, the rings may be fused to each other.

As used herein, a $C_6$-$C_{60}$ aryloxy group denotes —$OA_{102}$ (here, $A_{102}$ is the $C_6$-$C_{60}$ aryl group), and a $C_6$-$C_{60}$ arylthio group denotes —$SA_{103}$ (here, $A_{103}$ is the $C_6$-$C_{60}$ aryl group).

As used herein, a monovalent non-aromatic condensed polycyclic group denotes a monovalent group having two or more rings that are condensed to each other, including only carbon as a ring-forming atom (e.g., the number of the included carbon atoms may be 8 to 60), and having non-aromaticity, as a whole molecule. Detailed examples of the non-aromatic condensed polycyclic group include a fluorenyl group. As used herein, a divalent non-aromatic condensed polycyclic group denotes a divalent group that has the same structure as the monovalent non-aromatic condensed polycyclic group.

As used herein, a monovalent non-aromatic hetero-condensed polycyclic group denotes a monovalent group having two or more rings that are condensed to each other, including a hetero atom selected from N, O, P, and S in addition to carbon as a ring-forming atom (e.g., the number of the included carbon atoms included may be 2 to 60), and having non-aromacity as a whole molecule. An example of the non-aromatic hetero-condensed polycyclic group includes a carbazolyl group. As used herein, a divalent non-aromatic hetero-condensed polycyclic group denotes a divalent group that has the same structure as the monovalent non-aromatic hetero-condensed polycyclic group.

As used herein, at least one substituent of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted divalent non-aromatic condensed polycyclic group, the substituted divalent non-aromatic hetero-condensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkenyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_2$-$C_{60}$ heteroaryl group, the substituted monovalent non-aromatic condensed polycyclic group, and the substituted monovalent non-aromatic hetero-condensed polycyclic group is selected from, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, nitro group, an amino group, an amidino group, a hydrazine group, a hydrozone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy, a $C_6$-$C_{60}$ arylthio, a $C_2$-$C_{60}$ heteroaryl group, a monovalent non-aromatic condensed polycyclic group, a monovalent non-aromatic hetero-condensed polycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy, a $C_6$-$C_{60}$ arylthio, a $C_2$-$C_{60}$ heteroaryl group, a monovalent non-aromatic condensed polycyclic group, and a monovalent non-aromatic hetero-condensed polycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy, a $C_2$-$C_{60}$ arylthio, a $C_2$-$C_{60}$ heteroaryl group, a monovalent non-aromatic condensed polycyclic group, and a monovalent non-aromatic hetero-condensed polycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy, a $C_6$-$C_{60}$ arylthio, a $C_2$-$C_{60}$ heteroaryl group, a monovalent non-aromatic condensed polycyclic group, a monovalent non-aromatic hetero-condensed polycyclic group, $N(Q_{21})(Q_{22})$, —$Si(Q_{23})(Q_{24})(Q_{25})$, and —$B(Q_{26})(Q_{27})$; and —$N(Q_{31})(Q_{32})$, —$Si(Q_{33})(Q_{34})(Q_{35})$, and —$B(Q_{36})(Q_{37})$; and $Q_1$ to $Q_7$, $Q_{11}$ to $Q_{17}$, $Q_{21}$ to $Q_{27}$, and $Q_{31}$ to $Q_{37}$ are, each independently, selected from a hydrogen, —F, —Cl, —Br, —I, a hydroxyl group, a cyano group, a nitro group, an amino group, and amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_2$-$C_{60}$ heteroaryl group, a monovalent non-aromatic condensed polycyclic group, and a monovalent non-aromatic hetero-condensed polycyclic group.

For example, a least one substituent of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted divalent non-aromatic condensed polycyclic group, the substituted divalent non-aromatic hetero-condensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_2$-$C_{60}$ heteroaryl group, the substituted monovalent non-aromatic condensed polycyclic group, and the substituted monovalent non-aromatic hetero-condensed polycyclic group is selected from, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group.

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, a amino group, an amidino group, a hydrazine group, a hydrazone group, a carboxylic acid or a salt thereof, a sulfonic acid or a salt thereof, a phosphoric acid or a salt thereof, a cyclopentyl group, a cyclohexyl group, a cycloheptyl group, a cyclopentenyl group, a cycloheptenyl group, a cyclohexenyl group, a phenyl group, a pentalenyl group, and indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coroneryl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, —$N(Q_{11})(Q_{12})$, —$Si(Q_{13})(Q_{14})(Q_{15})$, and —$B(Q_{16})(Q_{17})$;

a cyclopentyl group, a cyclohexyl group, a cycloheptyl group, a cyclopentenyl group, a cycloheptenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coroneryl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzooxazolyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group;

a cyclopentyl group, a cyclohexyl group, a cycloheptyl group, a cyclopentenyl group, a cycloheptenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coroneryl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group-, a $C_2$-$C_{60}$ alkynyl group, a $C_1$-$C_{60}$ alkoxy group, a cyclopentyl group, a cyclohexyl group, a cycloheptyl group, a cyclopentenyl group, a cycloheptenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coroneryl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an naphthyridinyl group, an indolyl group, an indazolyl group, a purinyl group, quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, —N($Q_{21}$)($Q_{22}$), —Si($Q_{23}$)($Q_{24}$)($Q_{25}$), and —B($Q_{26}$)($Q_{27}$); and —N($Q_{33}$)($Q_{32}$), —Si($Q_{33}$)($Q_{34}$)($Q_{35}$), and —B($Q_{36}$)($Q_{37}$); and $Q_1$ to $Q_7$, $Q_{11}$ to $Q_{17}$, $Q_{21}$ to $Q_{27}$, and $Q_{31}$ to $Q_{37}$ are, each independently, selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a cyclopentyl group, a cyclohexyl group, a cycloheptyl group, a cyclopentenyl group, a cycloheptenyl group, a cyclohexenyl group, a phenyl group, a pentalenyl group, an indenyl group, a naphthyl group, a azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coroneryl group, an ovalenyl group, a pyrrolyl group, thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group.

The term "Ph" used herein refers to a phenyl group, the term "Me" used herein refers to a methyl group, the term "Et" sed herein refers to an ethyl group, and the term "ter-Bu" or "Bu'" used herein refers to a tert-buryl group.

The expression "(an organic layer) includes at least one condensed cyclic compound" used herein includes a case in which "(an organic layer) includes one condensed cyclic compound of Formula 1 or a case in which (an organic layer) includes two or more different condensed cyclic compounds of Formula 1".

The term "organic layer" used herein denotes a single layer and/or all multi-layers disposed between the first electrode and the second electrode in the organic light-emitting device. A material included in a layer of the "organic layer" is not limited to an organic material.

FIG. 1 schematically illustrate a cross-sectional view of an organic light-emitting device 10 according to an embodiment. The organic light-emitting device 10 may include a first electrode 110, an organic layer 150, and a second electrode 190.

Hereinafter, a structure and a preparation method of an organic light-emitting device are described by referring to FIG. 1.

In an implementation, a substrate may be additionally disposed on a lower part of the first electrode 110 or an upper part of the second electrode 190 of the organic light-emitting device 10 shown in FIG. 1. The substrate may be a glass substrate or a transparent plastic substrate having excellent mechanical strength, thermal stability, transparency, surface smoothness, ease of handling, and water resistance.

The first electrode 110 may be formed by, e.g., depositing or sputtering a first electrode material on the substrate. When the first electrode 110 is an anode, the first electrode material may be selected from materials having a high work function to facilitate hole injection. The first electrode 110 may be a reflective electrode, a semi-transmissive (e.g., semi-transparent) electrode, or a transmissive (e.g., transparent) electrode. Examples of the first electrode material may include indium-tin oxide (ITO), indium-zinc-oxide (IZO), tin oxide (SnO$_2$), and zinc oxide (ZnO). Also, at least one selected from magnesium (Mg), aluminum (Al), aluminum-lithium (Al—Li), a Calcium (Ca), magnesium-indium (Mg—In), and magnesium-silver (Mg—Ag) may be selected as the first electrode material to form the first electrode 110 as a semi-transmission electrode or a transmission electrode.

The first electrode 110 may have a single-layered structure or a multi-layered structure including a plurality of layers. For example the first electrode 110 may have a three-layered structure of ITO/Ag/ITO, but a structure of the first electrode 110 is not limited thereto.

The organic layer 150 may be disposed on the first electrode 110. The organic layer 150 may include an EML.

The organic layer 150 may further include a hole transport region that is between the first electrode 110 and the EML, an electron transport region that is between the EML and the second electrode 190, and an intermediate layer that is between the EML and the electron transport region.

The hole transport region may include at least one selected from an HIL, an HTL, a buffer layer, and an EBL. The electron transport region may include at least one selected from an HBL, and ETL, and an EIL, but the hole transport region and the electron transport region are not limited thereto.

The hole transport region may have a single-layered structure formed of one material, a single-layered structure formed of a plurality of different materials, or a multiple-layered structure formed of a plurality of different materials.

For example, the hole transport region may have a single-layered structure formed of a plurality of different materials or a structure of HIL/HTL, a structure of HIL/HTL/buffer layer, a structure of HIL/buffer layer, a structure of HTL/buffer layer, or a structure of HIL/HTL/EBL, wherein layers of each structure are sequentially stacked on the first electrode in the stated order, but a structure of the hole transport region is not limited thereto.

When the hole transport region includes an HIL, the HIL may be formed on the first electrode 110 by using various methods such as vacuum deposition, spin coating, casting, Langmuir-Blodgett (LB) deposition, inkjet printing, laser printing, or laser induced thermal imaging (LITI).

When the HIL is formed by vacuum deposition, the deposition conditions may be selected from ranges of, e.g., a deposition temperature of about 100° C. to about 500° C., a degree of vacuum of about $10^{-8}$ to about $10^{-3}$ torr, and a deposition speed of about 0.01 to about 100 Å/sec, in consideration of a desired compound for the HIL and a desired structure of the HIL.

When the HIL is formed by spin coating, the coating conditions may be selected from ranges of, e.g., a coating speed of about 2,000 rpm to about 5,000 rpm and a heat treatment temperature of about 8° C. to about 200° C., in consideration of a desired compound for the HIL and a desired structure of the HIL.

When the hole transport region includes the HTL, the HTL may be formed on the first electrode 110 or on the HIL by using various methods such as vacuum deposition, spin coating, casting, LB deposition, inkjet printing, laser printing, or LITI. When the HTL is formed by vacuum deposition and spin coating, the deposition conditions and the coating conditions of the HTL may be referred to the deposition conditions and the coating conditions of the HIL.

The hole transport region may include at least one of m-MTDATA, TDATA, 2-TNATA, NPB, β-NPB, TPD, Spiro-TPD, Spiro-NPB, α-NPB, TAPC, HMTPD, 4,4',4"-tris(N-carbazolyl)triphenylamine) (TCTA), polyaniline/Dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), polyaniline/poly(4-styrenesulfonate (PANI/PSS), a compound represented by Formula 201, and a compound represented by Formula 202:

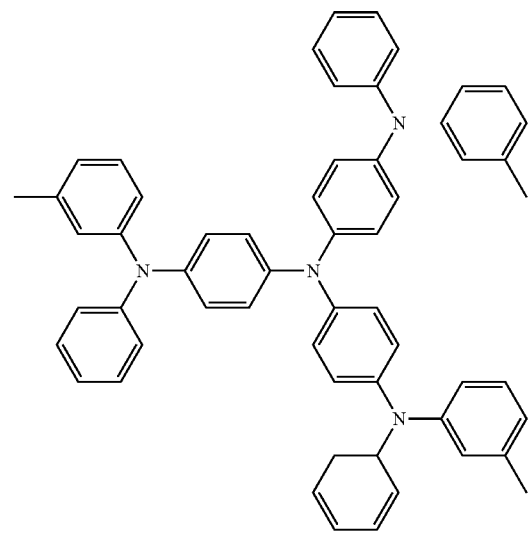

m-MTDATA

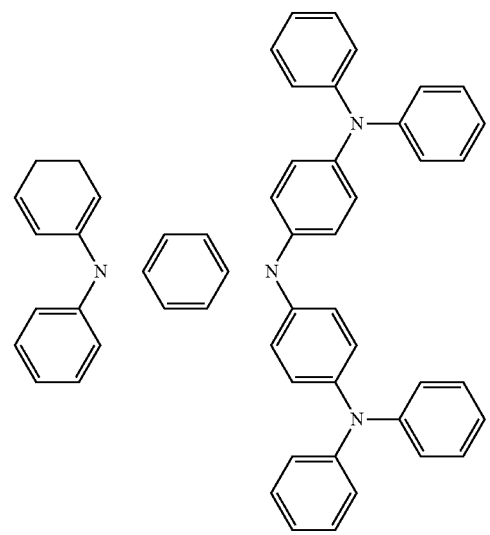

TDATA

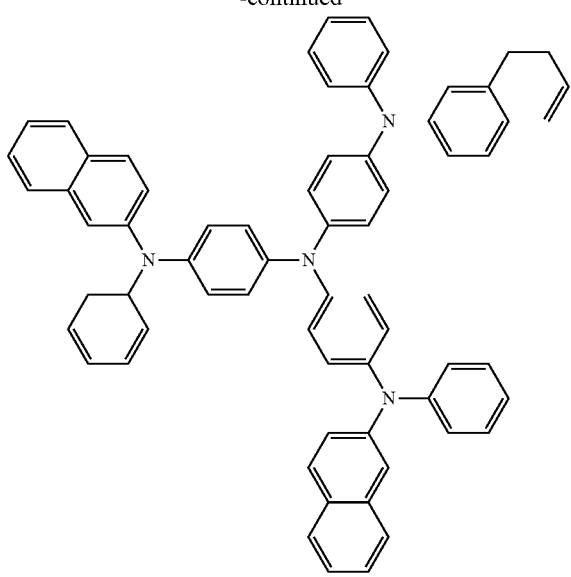
2-TNATA
NPB
β-NPB
TPD
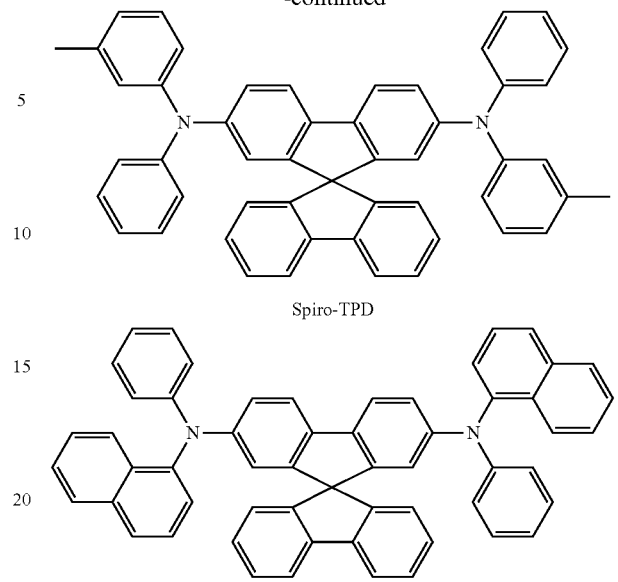
Spiro-TPD
Spiro-NPB
α-NPB
TAPC
HMTPD
<Formula 201>
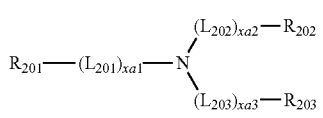

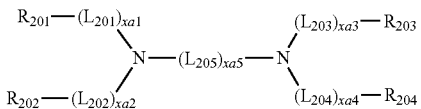

<Formula 202>

In Formulae 201 and 202, $L_{201}$ to $L_{205}$ may be each independently defined in the same manner as L or Formula 1.

xa1 to xa4 may be each independently an integer selected from 0, 1, 2, and 3.

xa5 may be an integer selected from 1, 2, 3, 4, and 5.

$R_{201}$ to $R_{204}$ may be each independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted monovalent non-aromatic condensed polycyclic group, and a substituted or unsubstituted monovalent non-aromatic hetero-condensed polycyclic group.

For example, in Formulae 201 and 202, $L_{201}$ to $L_{205}$ may be each independently selected from, a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 may be each independently an integer selected from 0, 1, and 2;

xa5 may be an integer selected from 1, 2, and 3;

$R_{201}$ to $R_{204}$ may be each independently selected from, but are not limited to, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, a anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

The compound represent by Formula 201 may be represented by Formula 201A below, but the compound is not limited thereto.

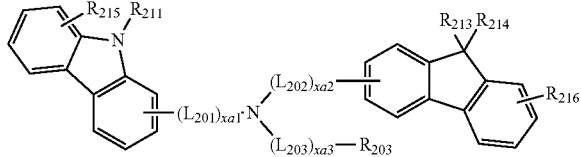

<Formula 201A>

For example, the compound represented by Formula 201 may be represented by Formula 201A-1 below.

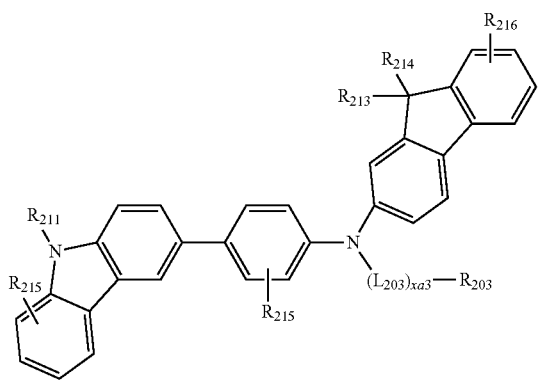

<Formula 201A-1>

The compound represented by Formula 202 may be represented by Formula 202A below, but the compound is not limited thereto.

<Formula 202A>

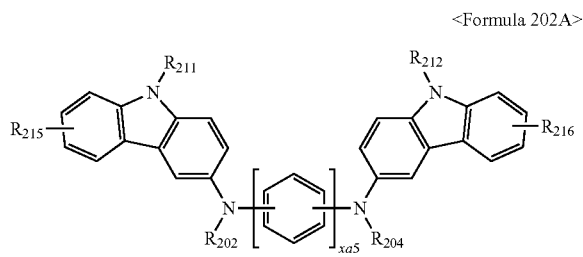

In Formulae 201A, 201A-1, and 202A, descriptions of $L_{201}$ to $L_{203}$, xa1 to xa3, xa5, and $R_{202}$ to $R_{204}$ may be referred to or defined the same as corresponding L, x, and R groups above. Description of $R_{211}$ may be referred to the description of $R_{203}$, $R_{213}$ to $R_{216}$ may be each independently selected from, but are not limited to, a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic hetero-condensed polycyclic group.

For example, in Formula 201A, 201A-1, and 202A.

$L_{201}$ to $L_{203}$ may be each independently selected from, a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 may be each independently an integer selected from 0 and 1;

$R_{203}$, $R_{211}$, and $R_{212}$ may be each independently selected from.

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ may be each independently selected from,
a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenzyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyrdinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{216}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, a isoquinolinyl group, a quinoxalinyl group, a quinazolinyl group, a carbazolyl group, and a triazinyl group; and xa5 may be an integer selected from 1 and 2.

In an implementation, in Formulae 201A and 201A-1, $R_{213}$ and $R_{214}$ may link to each other and form a saturated ring or an unsaturated ring.

The compound represented by Formula 201 and the compound represented by Formula 202 may each independently include one of Compounds HT1 to HT20 below, but the compounds are not limited thereto.

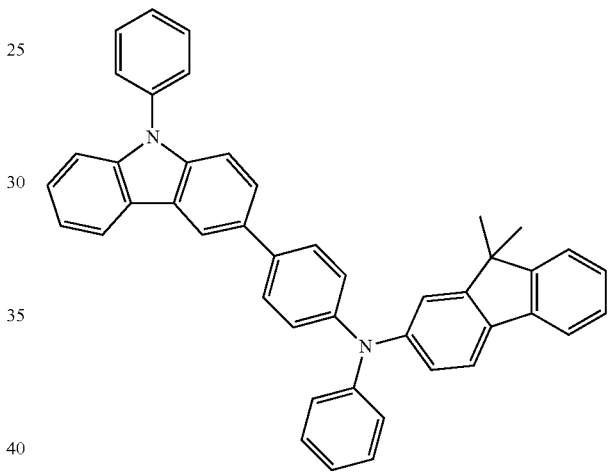

HT1

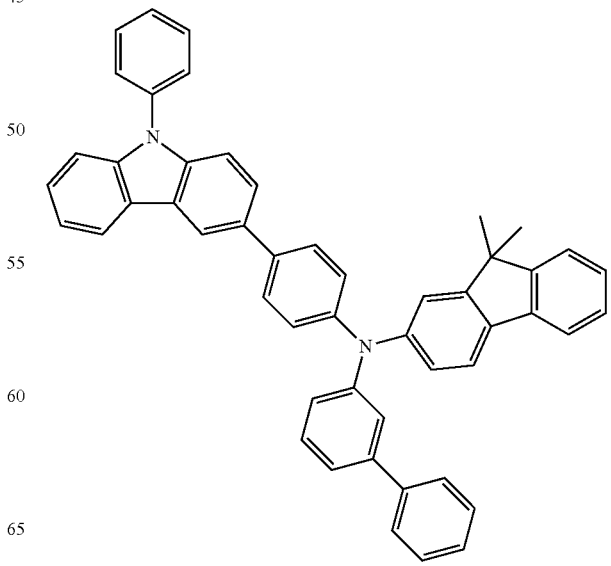

HT2

HT3
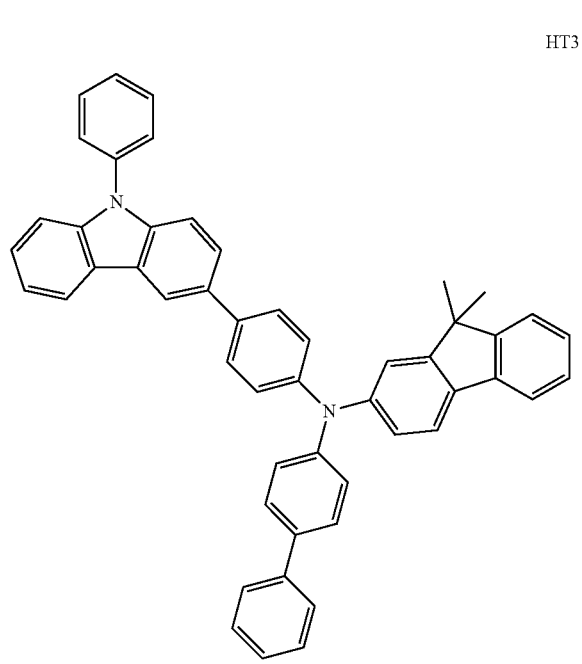
HT4
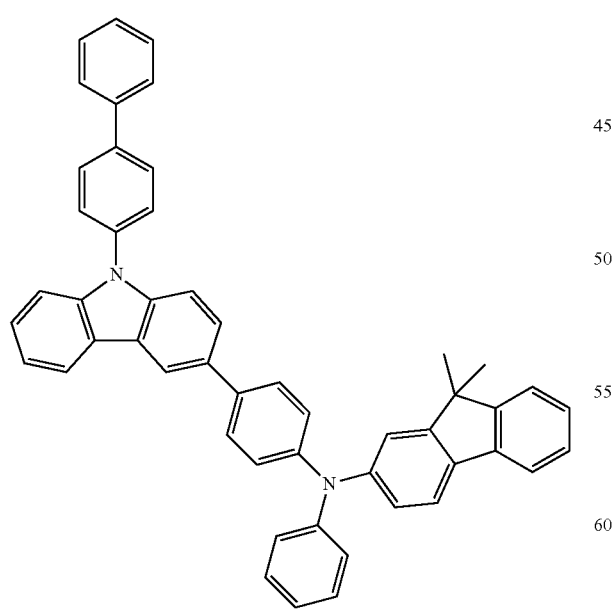
HT5
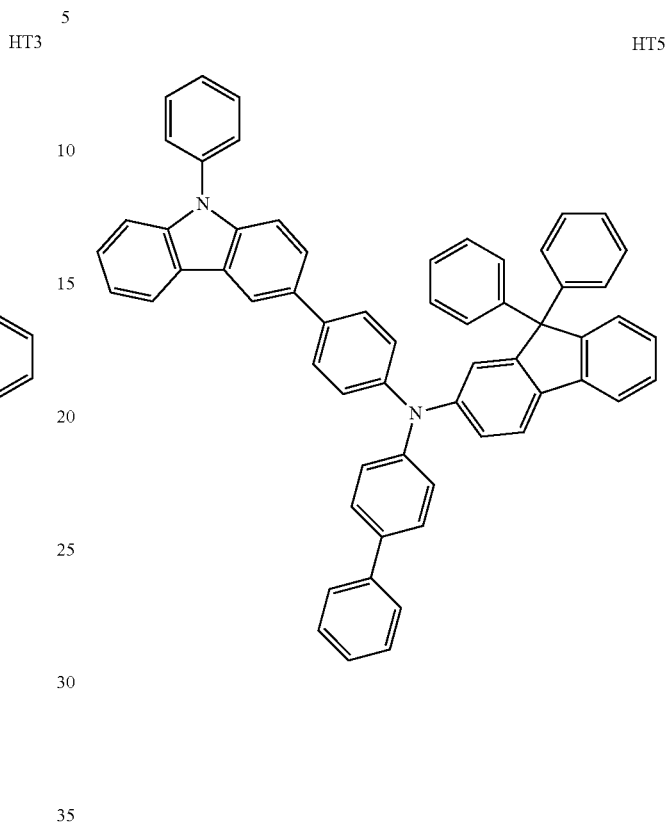
HT6

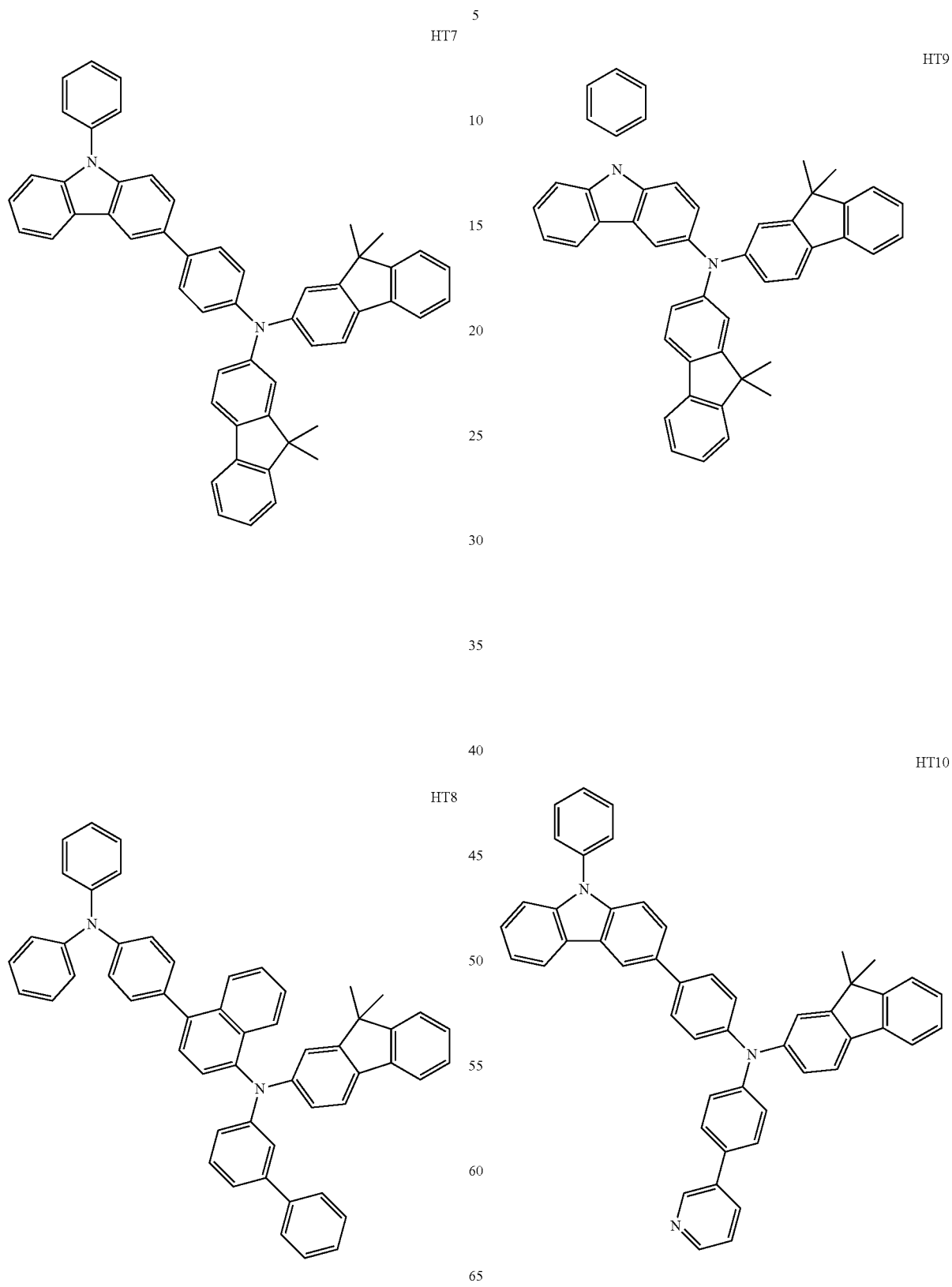

HT11
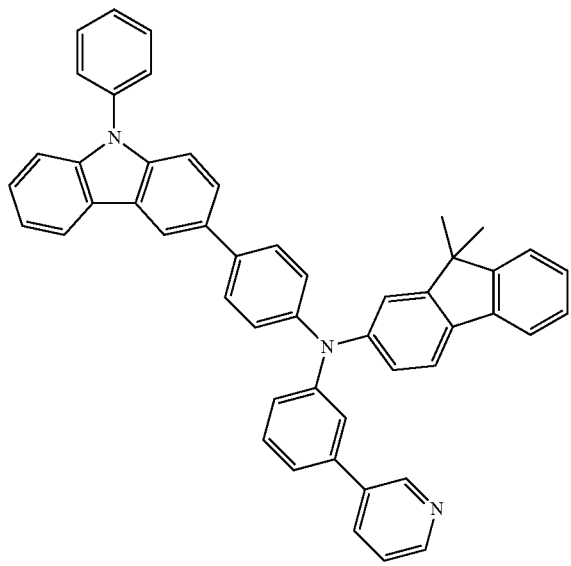
HT14
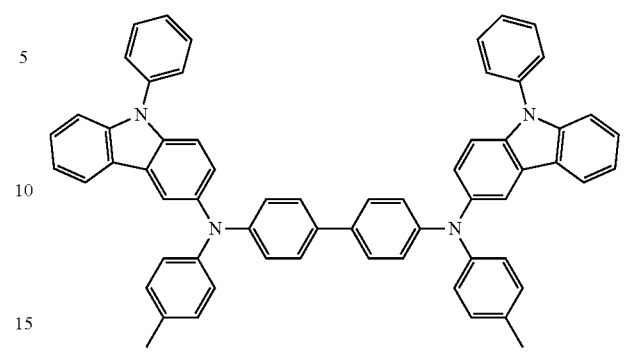
HT15
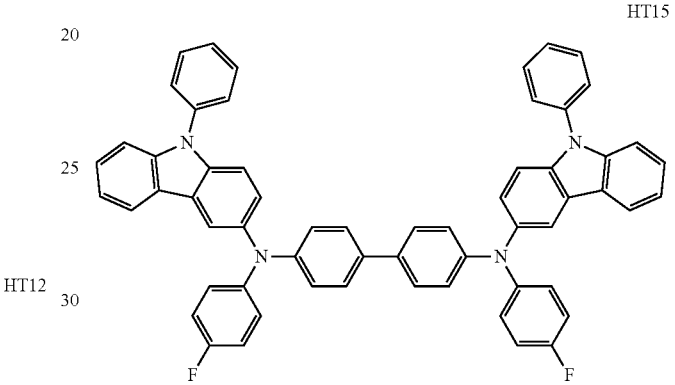
HT12
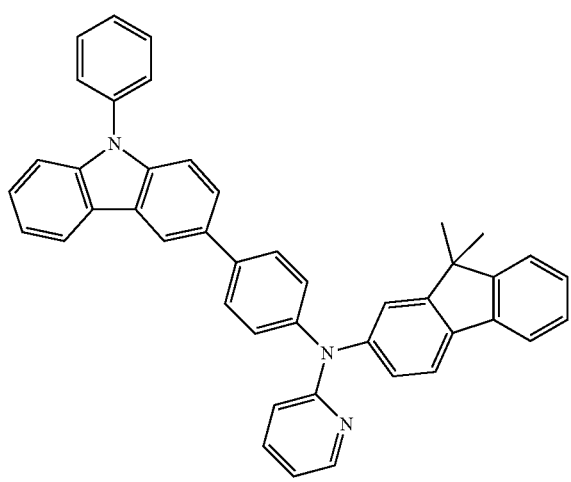
HT16
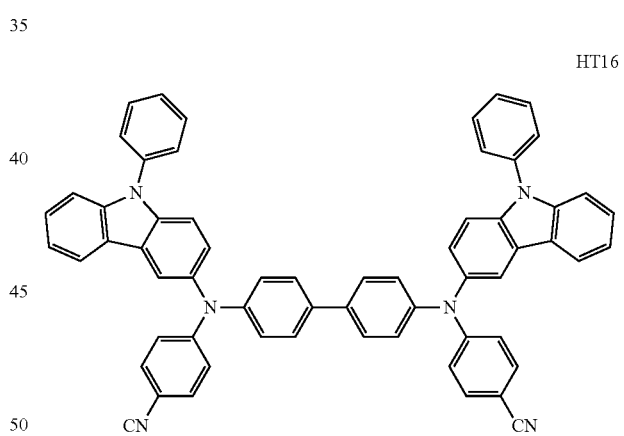
HT13
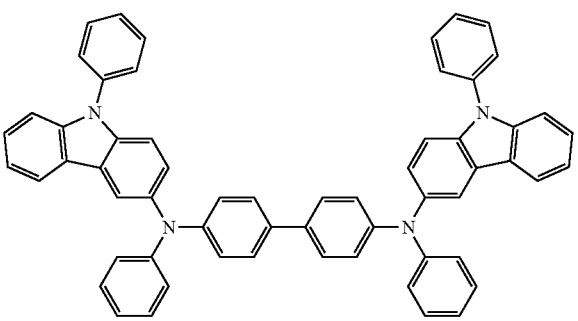
HT17
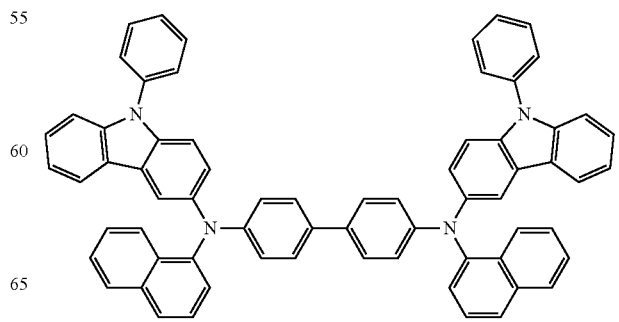

-continued

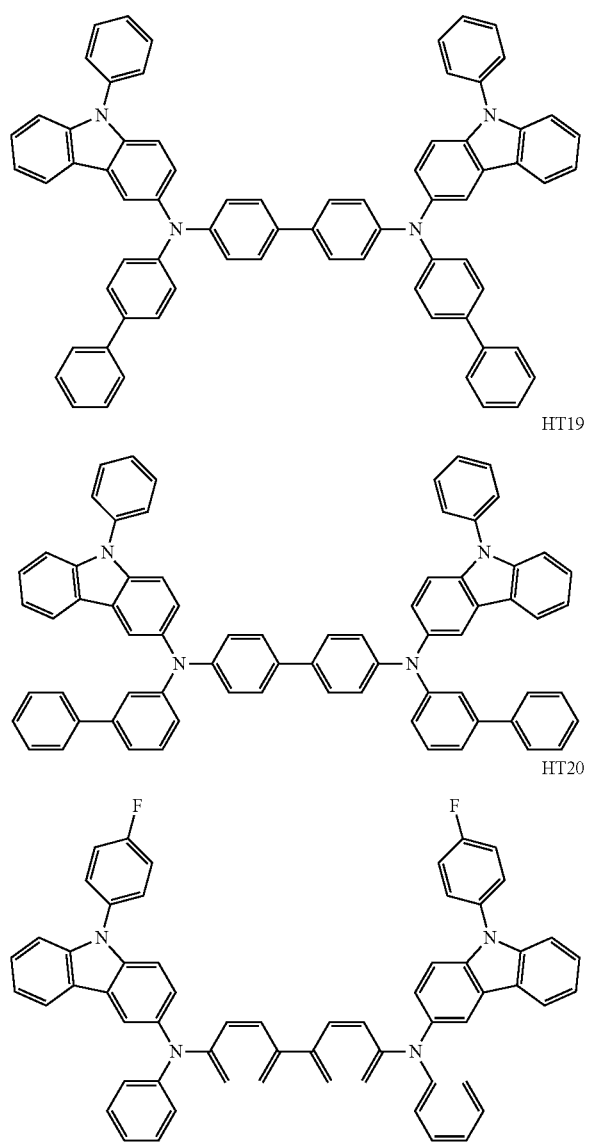

HT18

HT19

HT20

A thickness of the hole transport region may be in a range of about 100 Å to about 10,000 Å, e.g., about 100 Å to about 1,000 Å. When the hole transport region includes both the HIL and the HTL, a thickness of the HIL may be in a range of about 100 Å to about 10,000 Å, e.g., about 100 Å to about 1,000 Å, and a thickness of the HTL may be in a range of about 50 Å to about 2,000 Å, e.g., about 100 Å to about 1,500 Å. When thicknesses of the hole transport region, the HIL, and the HTL are within these ranges, satisfactory hole transporting properties of the organic light-emitting device may be obtained without substantial increase in driving voltage.

The hole transport region may further include a charge-generating material in addition to the materials above, to help improve conductivity. The charge-generating material may be homogenously or unhomogenously (e.g., heterogeneously) dispersed in the hole transport region.

The charge-generating material may be or may include, e.g., a p-dopant. The p-dopant may include one of a quinone derivative, a metal oxide, and a cyano group-containing compound, but the p-dopant is not limited thereto. Examples of the p-dopant may include a quinone derivative, such as a tetracyanoquinonedimethane (TCNQ) and 2,3,5,6-tetrafluoro-tetracyano-1,4-benzoquinondimethane (F4-TCNQ); a metal oxide, such as a tungsten oxide or a molybden oxide; and a Compound HT-D1 below, but the examples are not limited thereto.

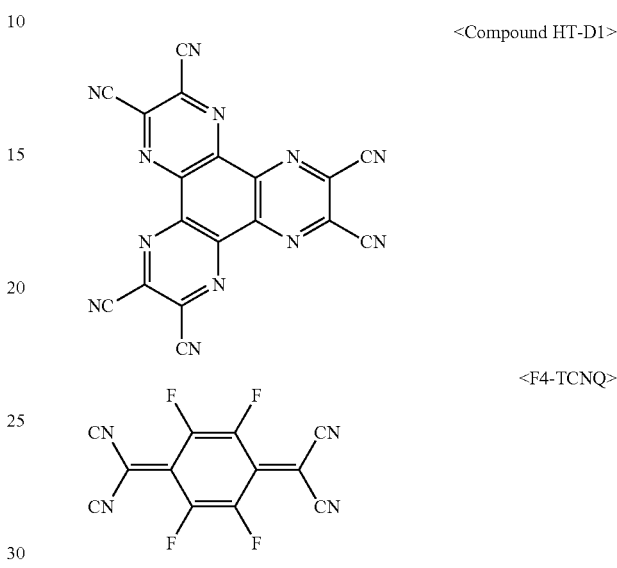

<Compound HT-D1>

<F4-TCNQ>

The hole transport region may further include at least one of a buffer layer or an EBL, in addition to the HIL and the HTL. The buffer layer may help increase light-emitting efficiency by compensating an optical resonance distance according the wavelength of light emitted from the EML. The buffer layer may include a material that may be included in the hole transport region. The EBL may block injection of electrons from the electron transport region.

The HTL may include a first hole transport layer and a second hole transport layer, and the first hole transport layer and the second hole transport layer may be formed of the same material or different materials from each other.

The EML may be formed on the first electrode 110 or on the hole transport region by using various methods such as vacuum deposition, spin coating, casting, LB deposition, inkjet printing, laser printing, or LITI. When the EML is formed by vacuum deposition and spin coating, the deposition conditions and the coating conditions of the EML may be referred to the deposition conditions and the coating conditions of the HIL.

When the organic light-emitting device 10 is a full-color organic light-emitting device, the EML may be patterned according to individual sub-pixels, such as a red EML, a green EML, and a blue EML. Alternatively, the EML may have a stacked structure of the red EML, the green EML, and the blue EML or a single-layered structure including a red light-emitting material, a green light-emitting material, and a blue light-emitting material formed, thereby emitting white light.

The EML may include two different hosts, and detailed examples thereof may be selected from, e.g., the following compounds or structures, but are not limited thereto.

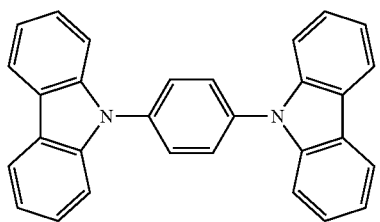
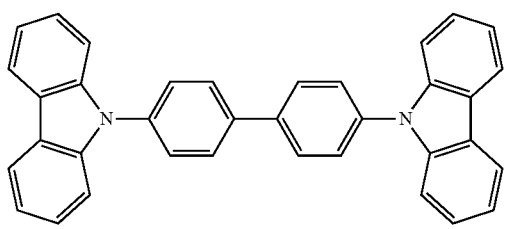
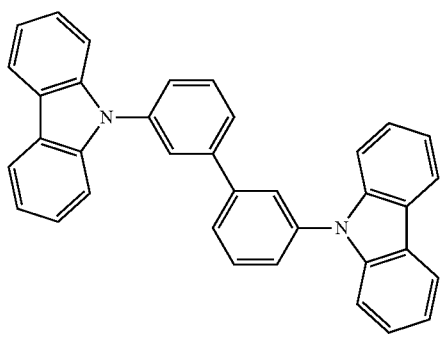
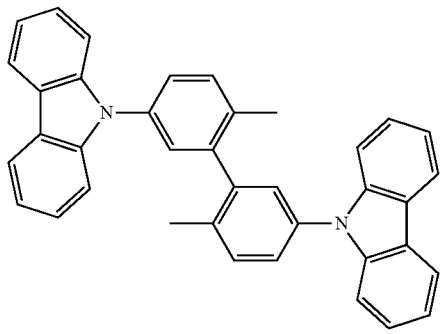
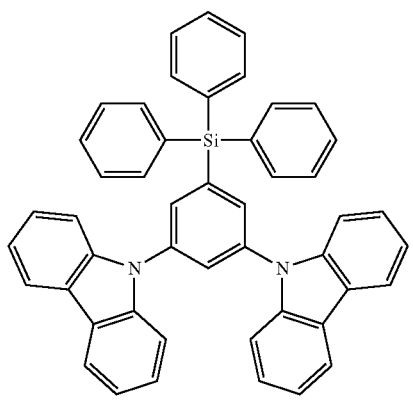
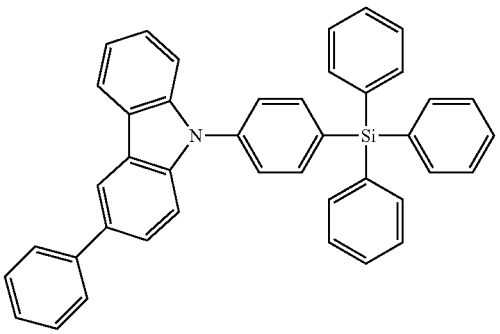
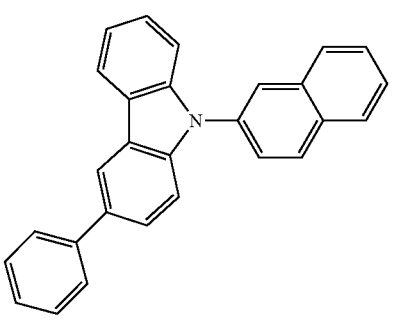
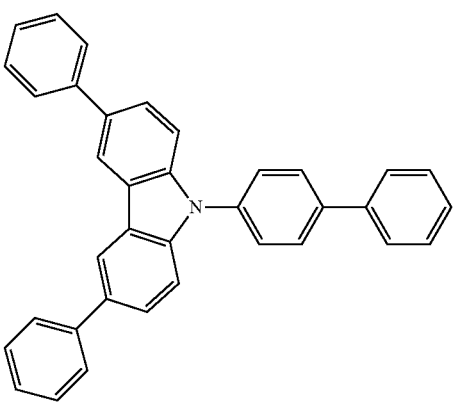
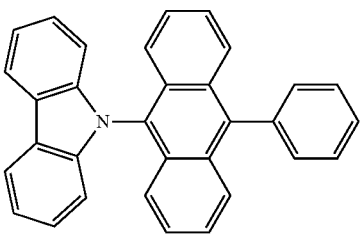
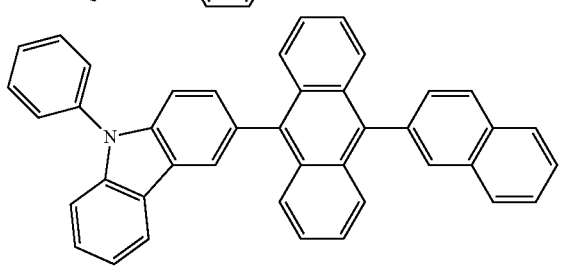

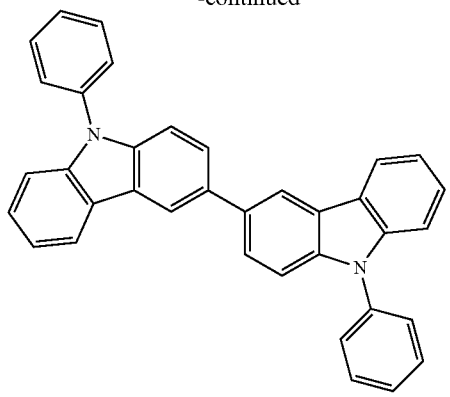
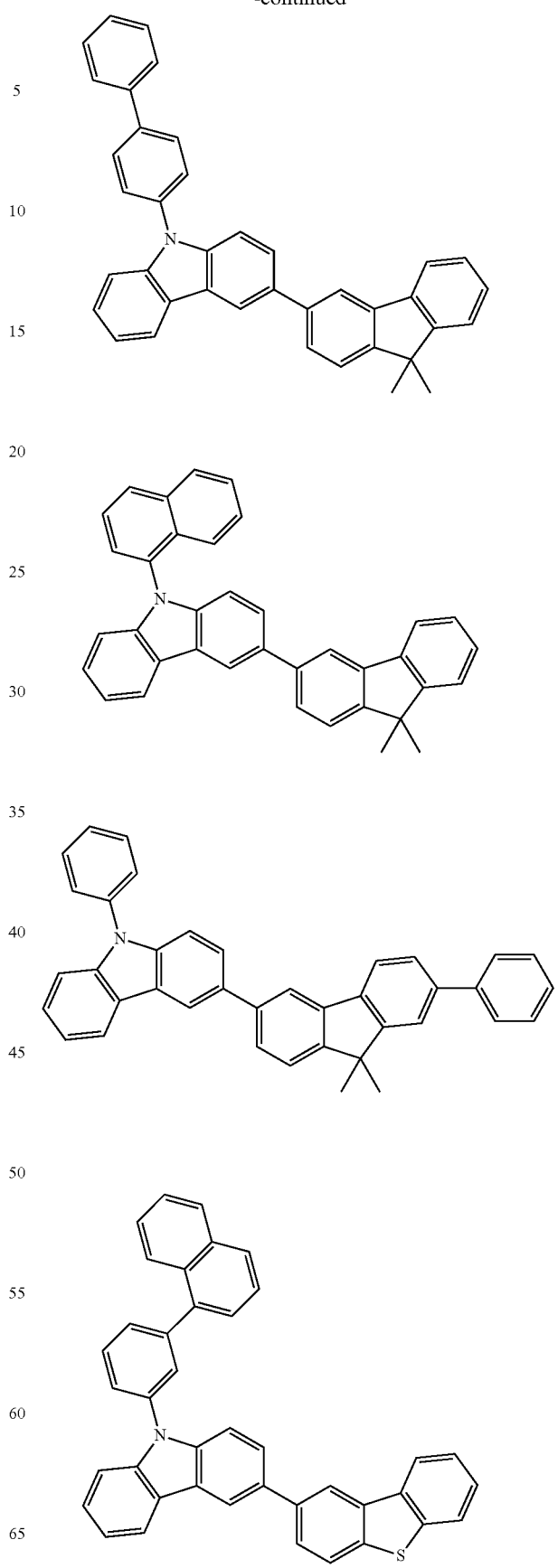

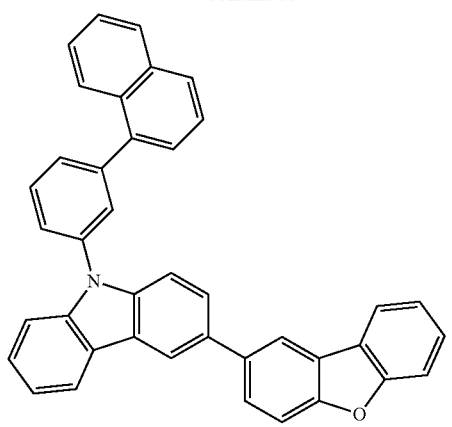
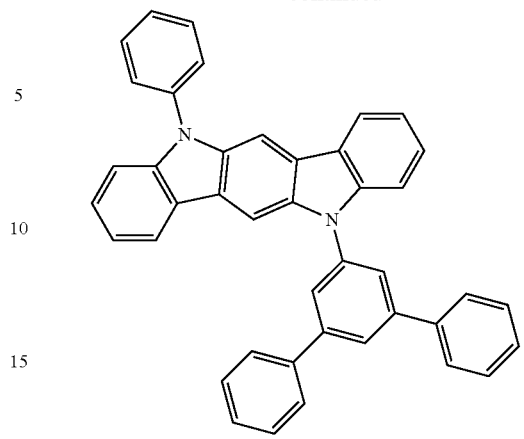
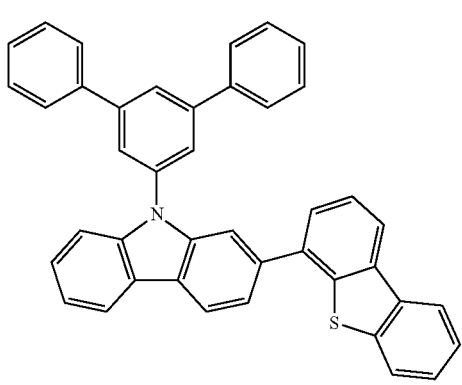
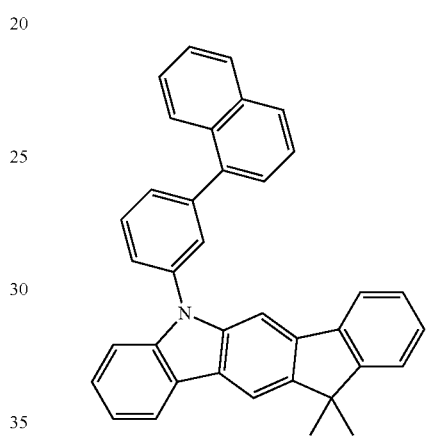
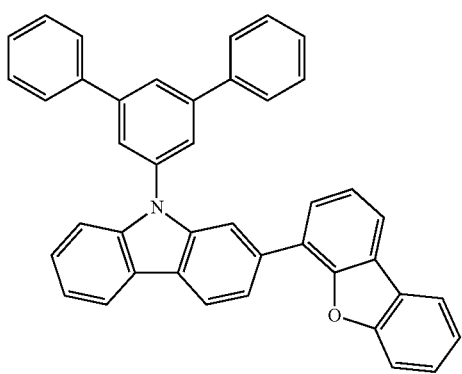
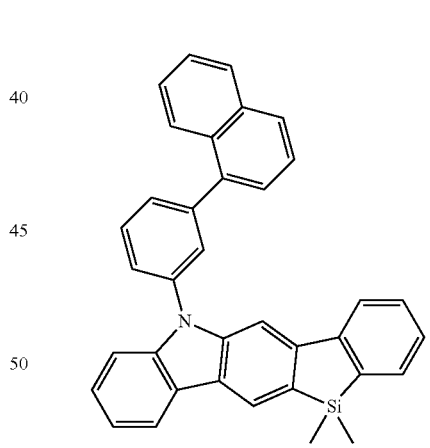
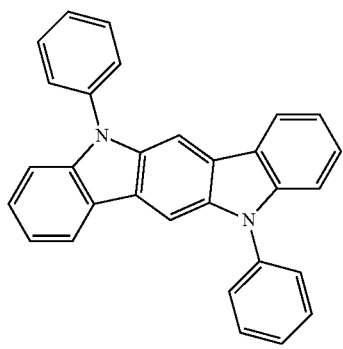
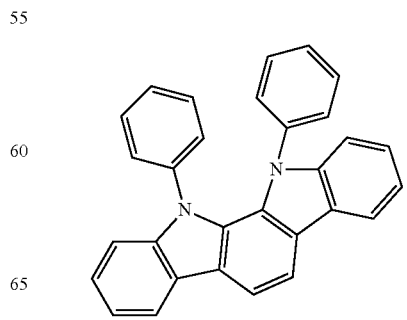

41
-continued
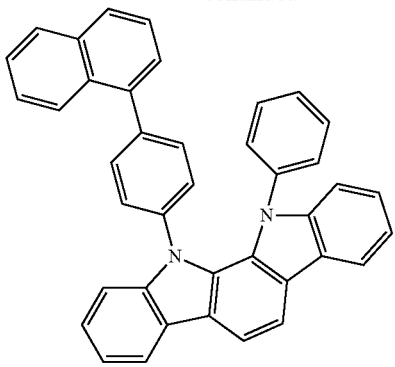
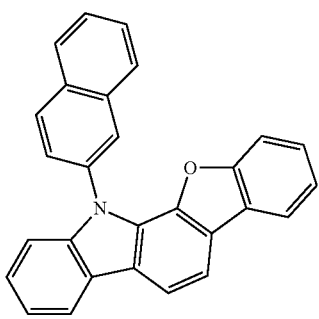
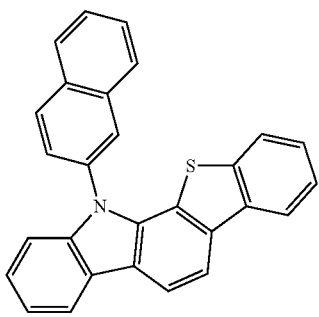
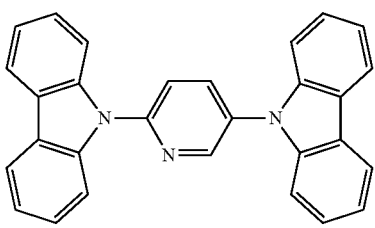
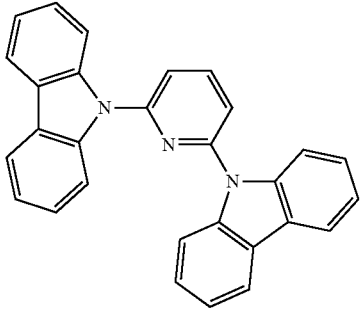
42
-continued
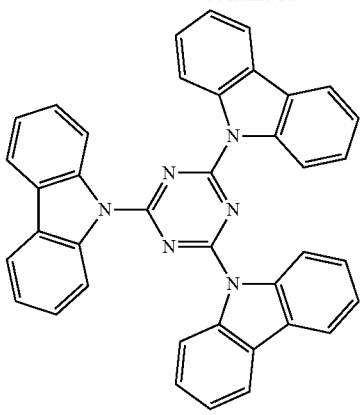
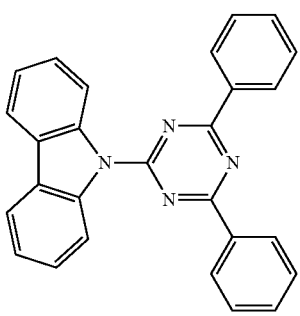
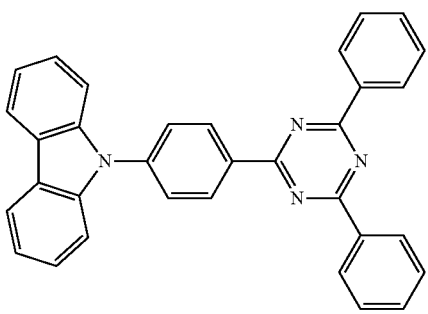
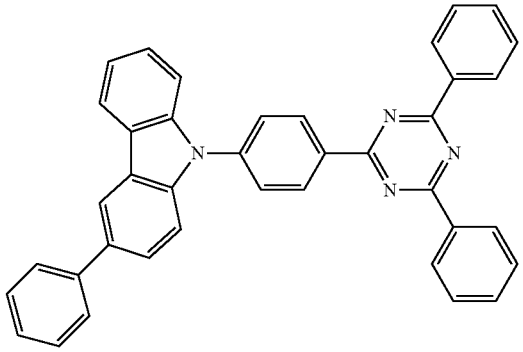
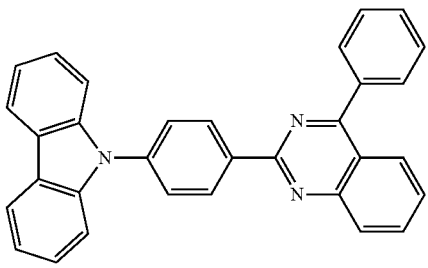

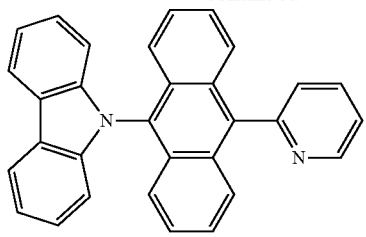
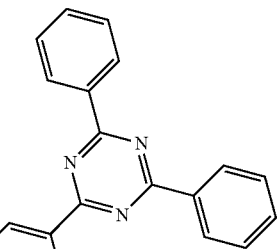
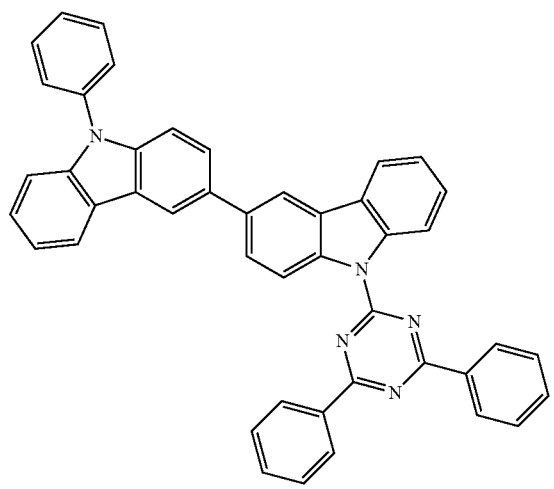
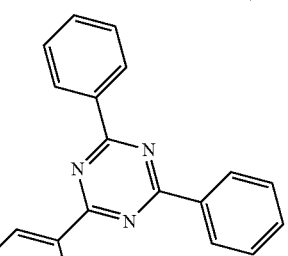
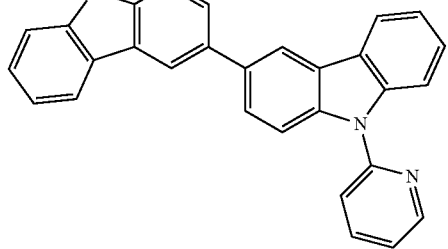
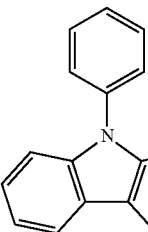
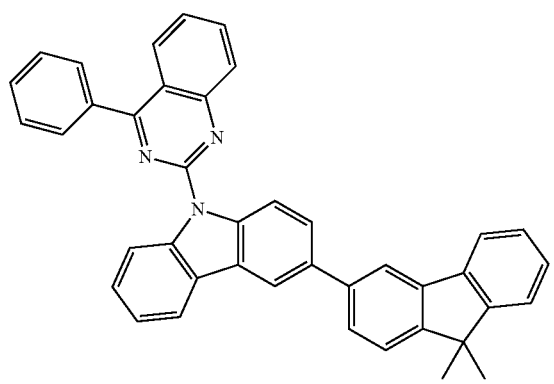

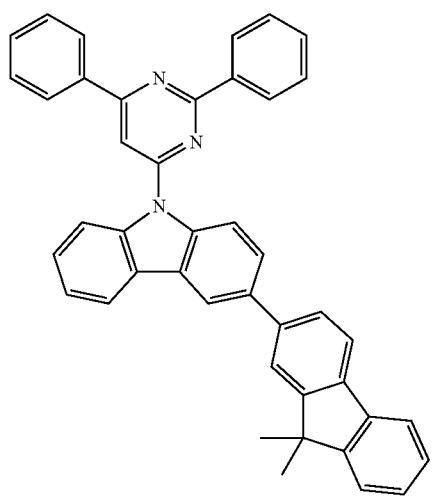
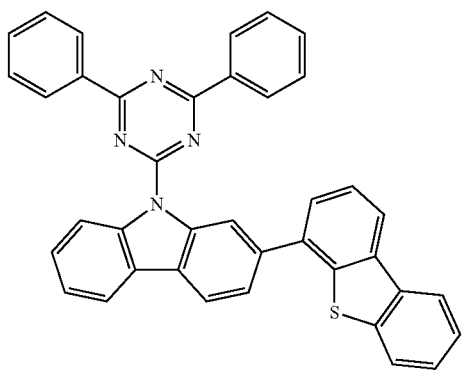
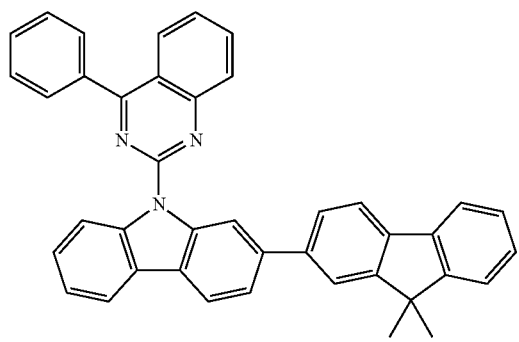
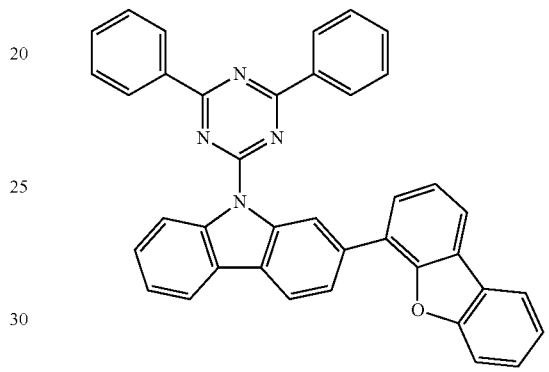
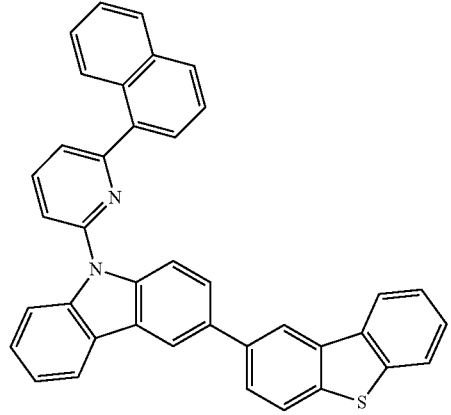
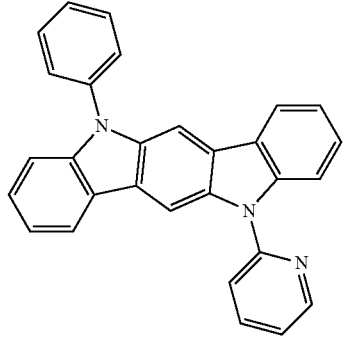
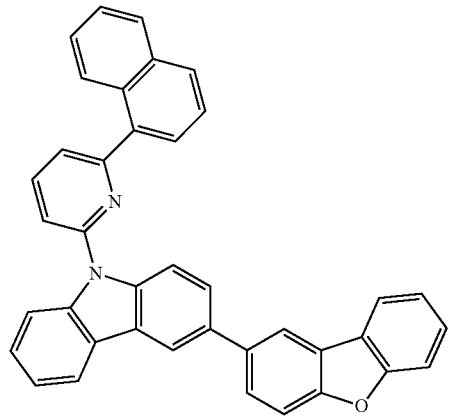
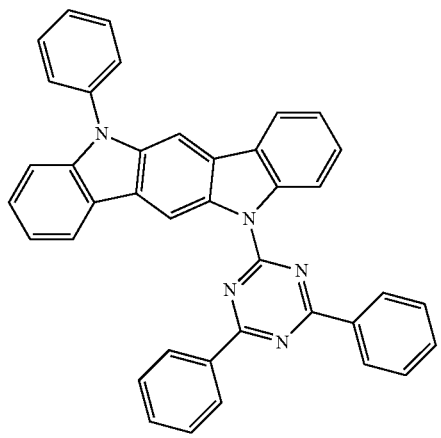

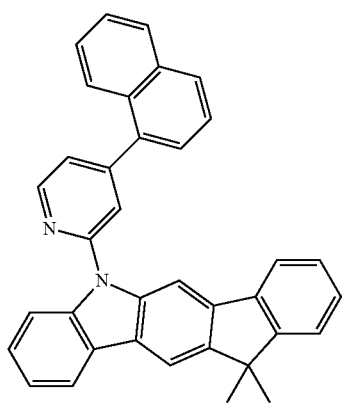
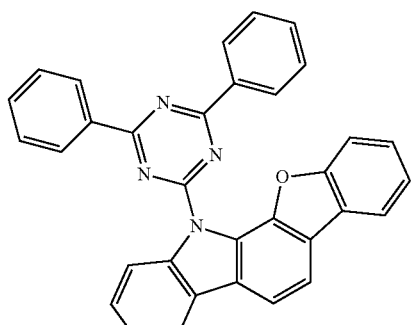
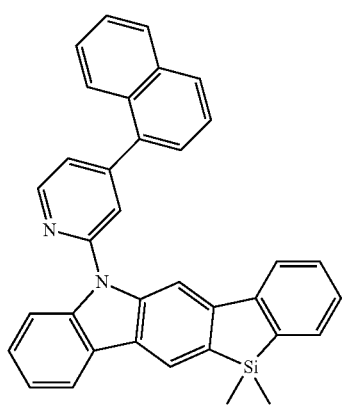
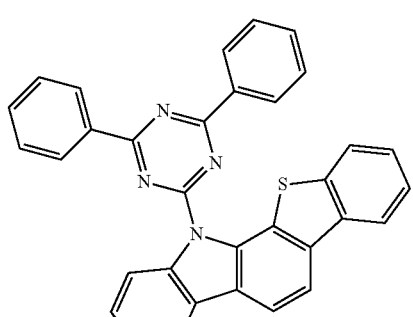
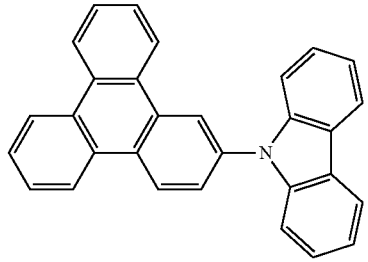
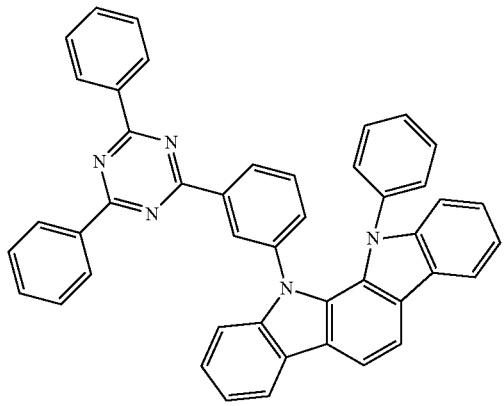
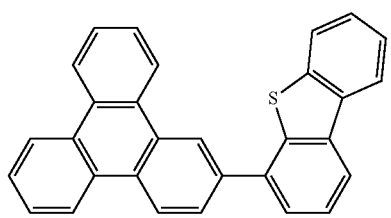
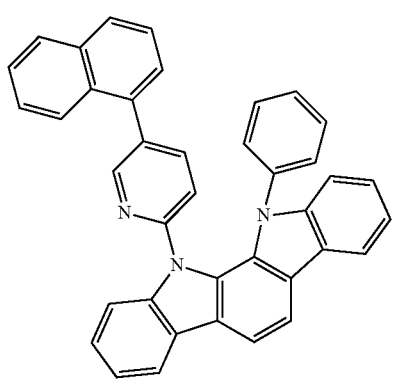
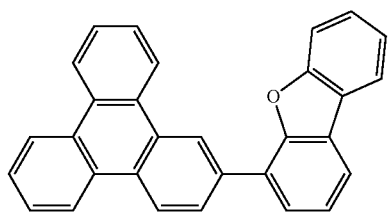
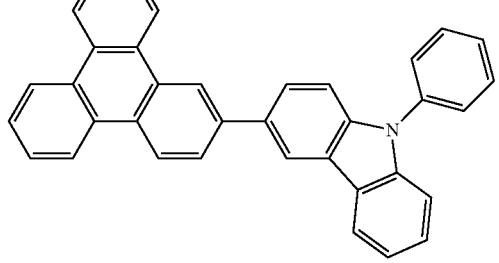

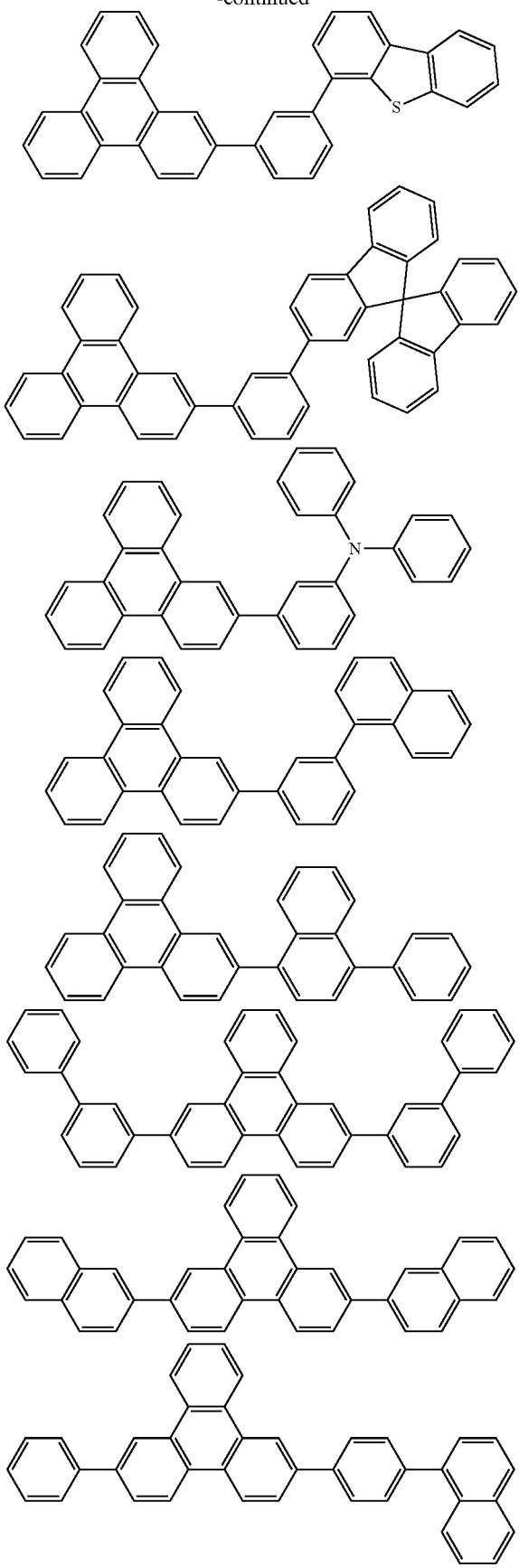
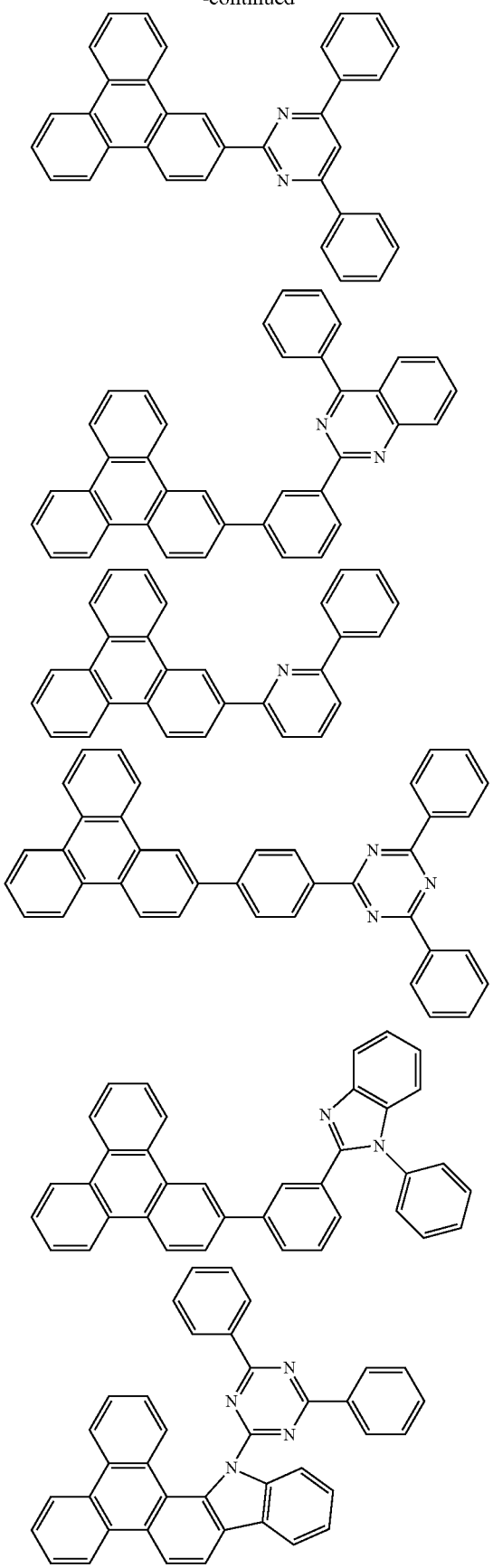

-continued

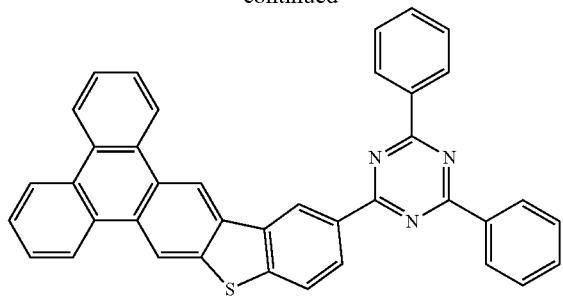

A weight ratio between the two different hosts is not limited, and, e.g., may be in a range of about 10:90 to about 90:10.

The phosphorescent dopant may include an organic metal complex represented by Formula 401 below.

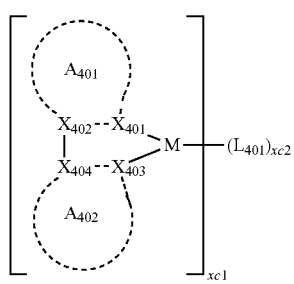

<Formula 401>

In Formula 401,

M may be selected from iridium (Ir), platinum (Pt), osmium (Os), rhodium (Rh), copper (Cu), ruthenium (Ru), titanium (Ti), zirconium (Zr), hafnium (Hf), europium (Eu), terbium (Tb), and thulium (Tm);

$X_{401}$ to $X_{404}$ may be each independently a nitrogen atom or a carbon atom;

rings $A_{401}$ and $A_{402}$ may be each independently selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isooxazole, a substituted or unsubstituted pyridines a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzooxazole, a substituted or unsubstituted isobenzooxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene;

at least one substituent of the substituted benzene, substituted naphthalene, substituted fluorene, substituted spiro-fluorene, substituted indene, substituted pyrrole, substituted thiophene, substituted furan, substituted imidazole, substituted pyrazole, substituted thiazole, substituted isothiazole, substituted oxazole, substituted isooxazole, substituted pyridine, substituted pyrazine, substituted pyrimidine, substituted pyridazine, substituted quinoline, substituted isoquinoline, substituted benzoquinoline, substituted quinoxaline, substituted quinazoline, substituted carbazole, substituted benzoimidazole, substituted benzofuran, substituted benzothiophene, substituted isobenzothiophene, substituted benzooxazole, substituted isobenzooxazole, substituted triazole, substituted oxadiazole, substituted triazine, substituted dibenzofuran, and substituted dibenzothiophene is selected from, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic hetero-condensed polycyclic group, —N($Q_{401}$)($Q_{402}$), —Si($Q_{403}$)($Q_{404}$)($Q_{405}$), and —B($Q_{406}$)($Q_{407}$);

A $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and a non-aromatic condensed polycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic hetero-condensed polycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic hetero-condensed polycyclic group, —N($Q_{411}$)($Q_{412}$), —Si($Q_{413}$)($Q_{414}$)($Q_{415}$), and —B($Q_{416}$)($Q_{417}$); and —N($Q_{421}$)($Q_{422}$), —Si($Q_{423}$)($Q_{424}$)($Q_{425}$), and —B($Q_{426}$)($Q_{427}$);

$L_{401}$ may be an organic ligand;

xc1 may be an integer selected from 1, 2, and 3; and xc2 may be an integer selected from 0, 1, 2, and 3.

$L_{401}$ may be a monovalent, divalent, or trivalent organic ligand. For example, $L_{401}$ may be selected from a halogen ligand (e.g., Cl or F), a diketone ligand (e.g., acetylacetonate, 1,3-diphenyl-1,3-propanedionate, 2,2,6,6-tetramethyl-3,5-heptanedionate, or hexafluoroacetonate), a carboxylic acid ligand (e.g., picolinate, dimethyl-3-pyrazolecarboxylate, or benzoate), a carbon monoxide ligand, an isonitrile ligand, a cyano ligand, and a phosphorus ligand (e.g., phosphine or phosphite), but is not limited thereto.

In Formula 401, when $A_{402}$ has two or more substituents, the substituents of $A_{402}$ may link to each other and form a saturated ring or an unsaturated ring.

In Formula 401, when xc1 is 2 or greater, a plurality of ligands,

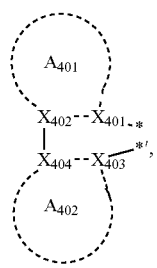

may be identical to or different from each other. In Formula 401, when xc1 is 2 or greater, $A_{401}$ and $A_{402}$ may be linked to each other by directly linking to another neighboring ligand of $A_{401}$ and $A_{402}$ or with a connection group (e.g., a $C_1$-$C_5$ alkylene group, —N(R')— (here, R' is $C_1$-$C_{10}$ alkyl group or a $C_6$-$C_{20}$ aryl group), or —C(=O)—) therebetween.

In an exemplary embodiment, the phosphorescent dopant may be selected from Compounds PD1 to PD74 below, but is not limited thereto.

PD1

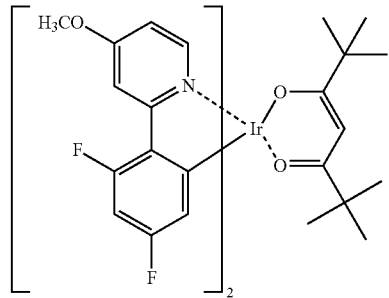

PD2

PD3

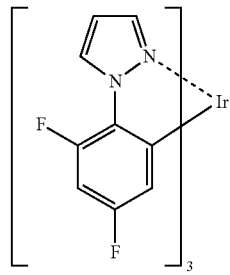

PD4

PD5

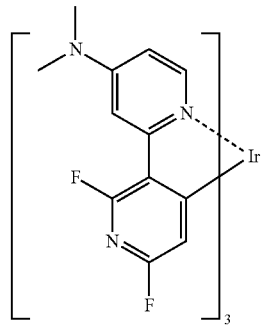

PD6

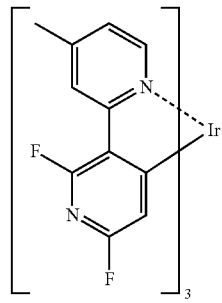

PD7

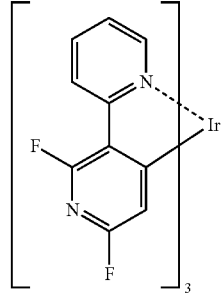

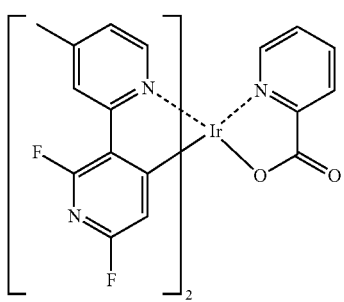 PD8
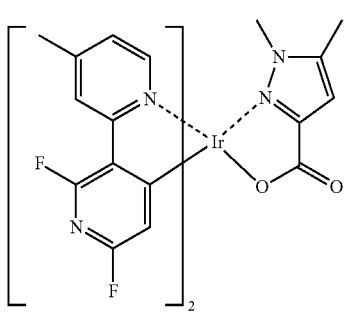 PD9
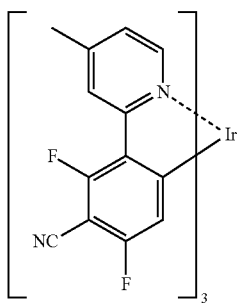 PD10
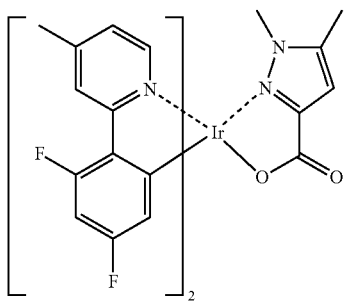 PD11
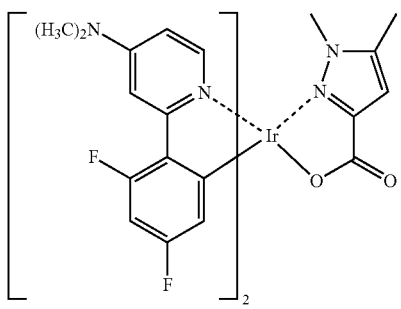 PD12
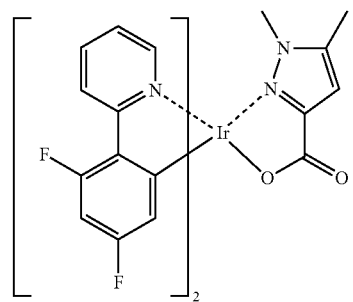 PD13
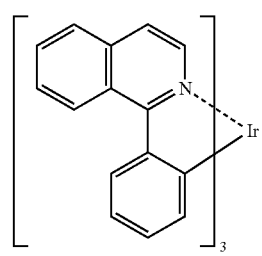 PD14
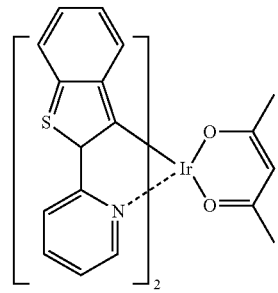 PD15
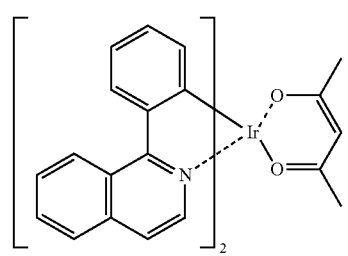 PD16
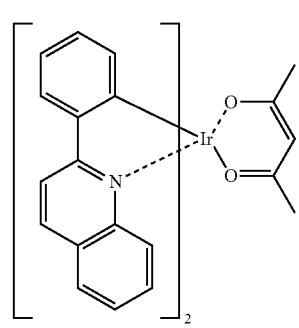 PD17

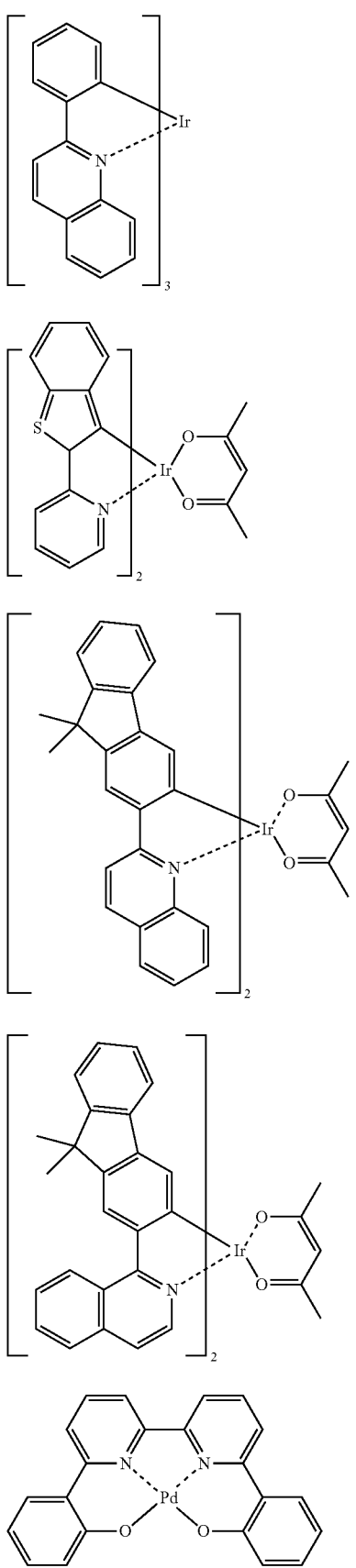
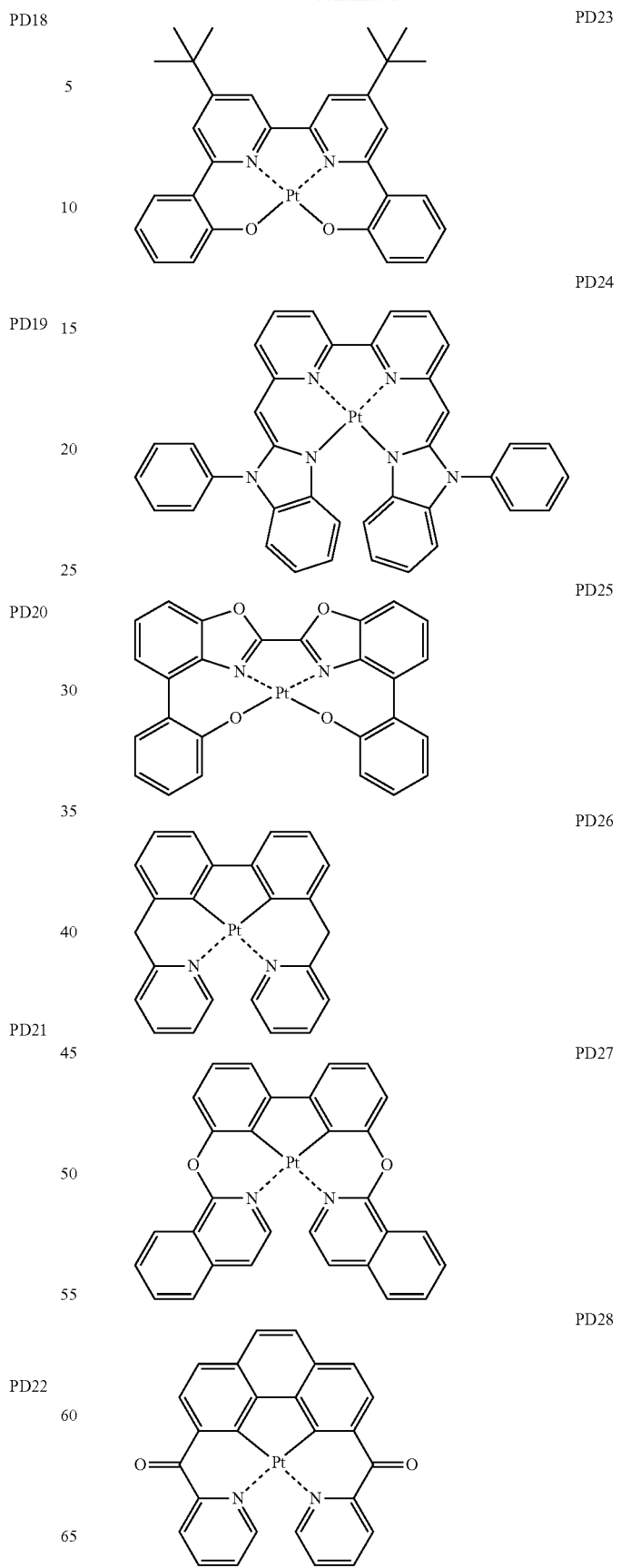

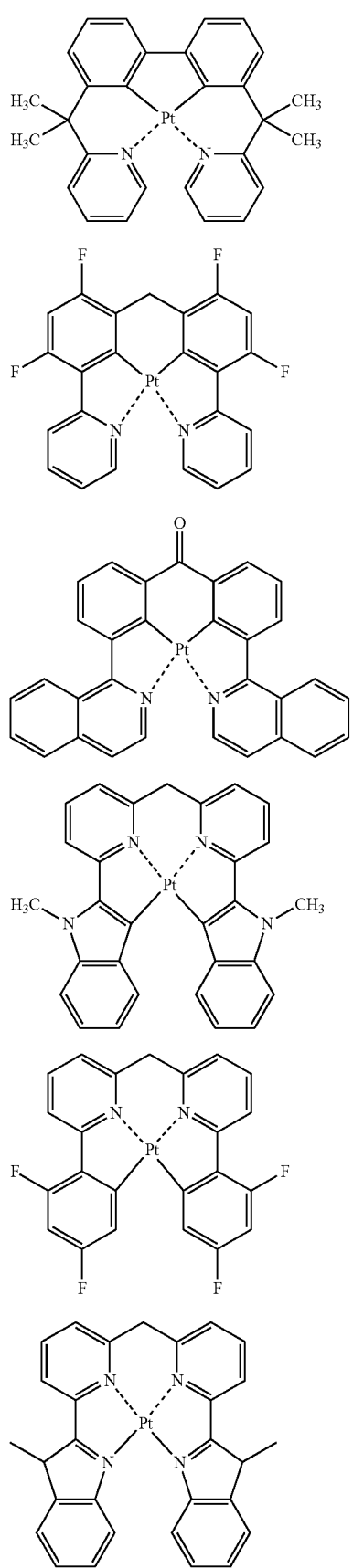
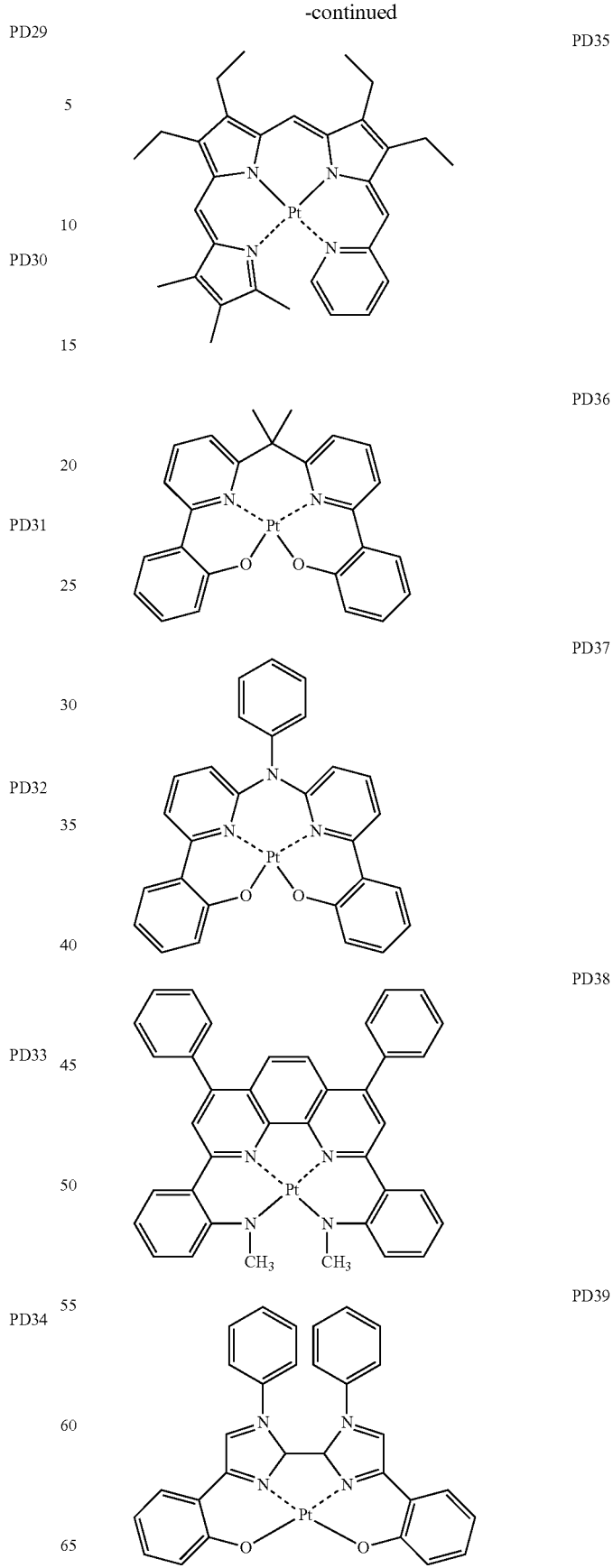

PD40 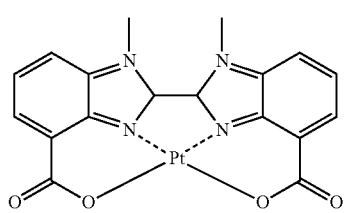
PD41 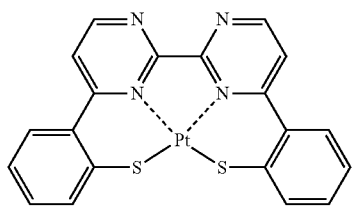
PD42 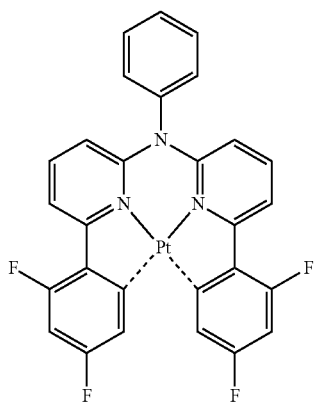
PD43 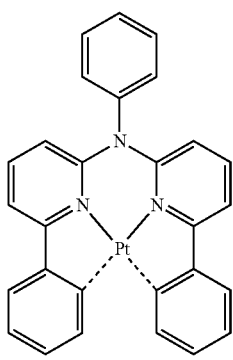
PD44 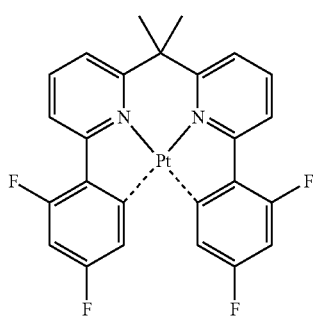
PD45 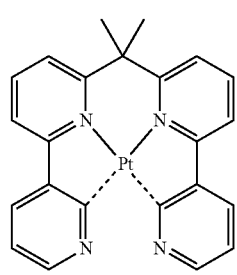
PD46 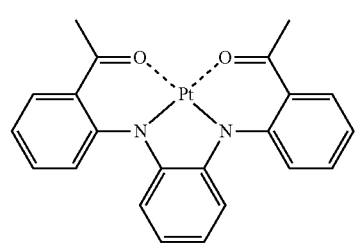
PD47 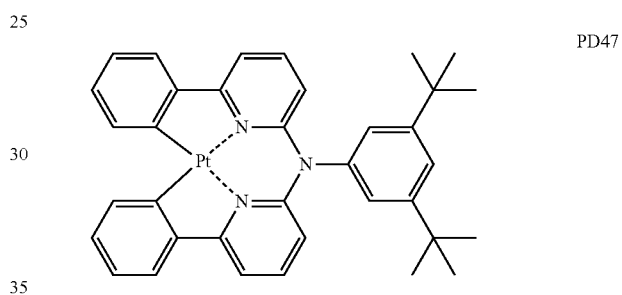
PD48
PD49
PD50

PD51 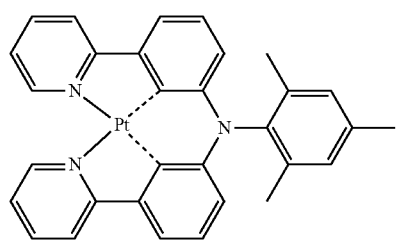
PD57 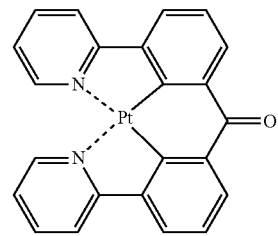
PD52 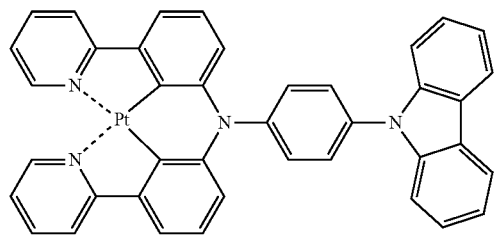
PD58 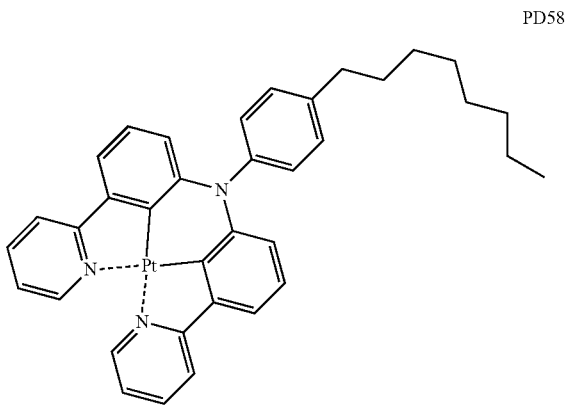
PD53 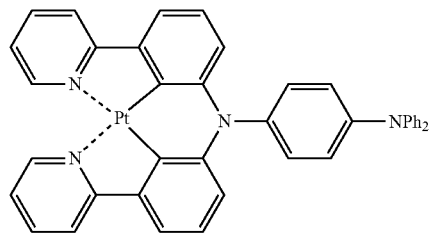
PD54 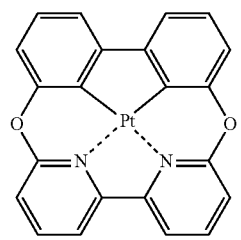
PD59 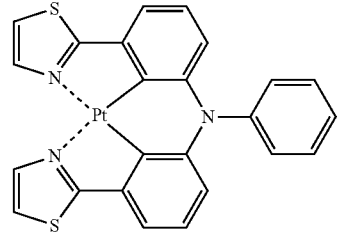
PD55 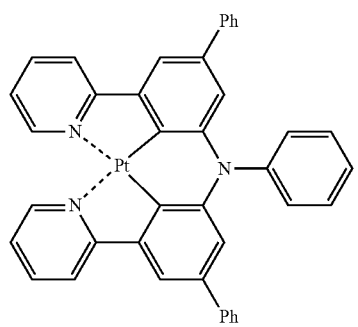
PD60 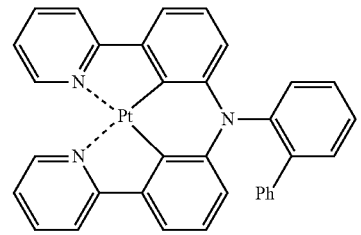
PD56 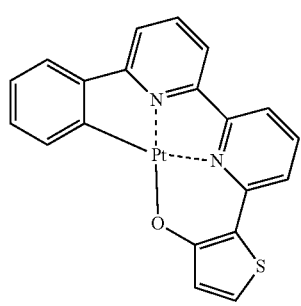
PD61 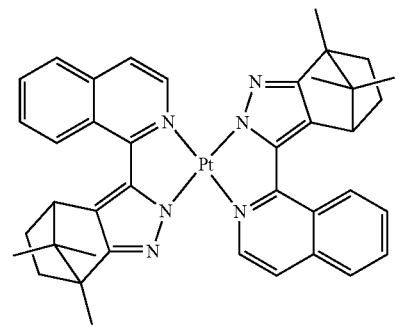

-continued
PD62
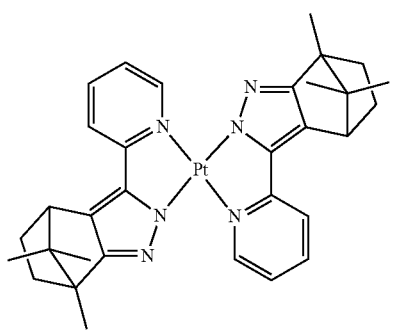
PD63
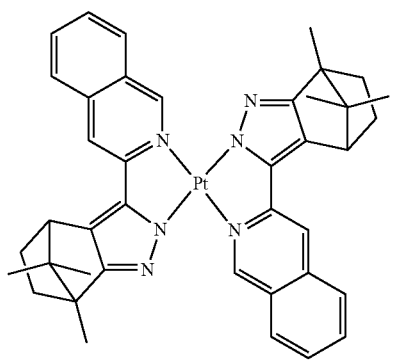
PD64
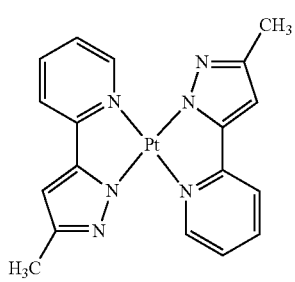
PD65
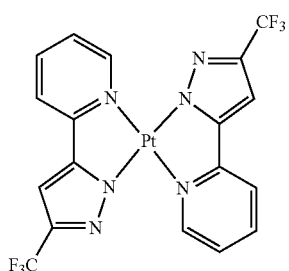
PD66
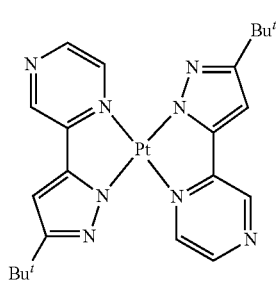
-continued
PD67
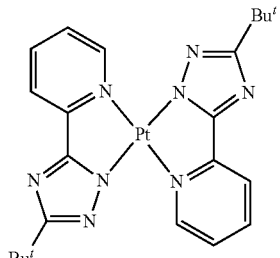
PD68
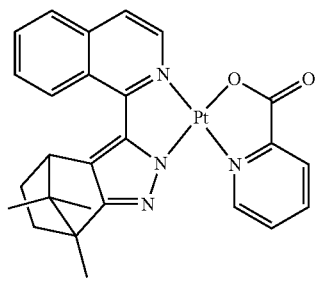
PD69
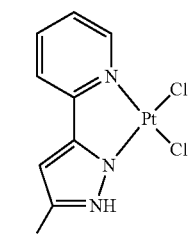
PD70
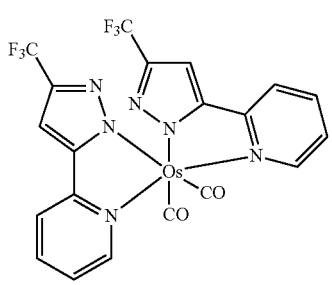
PD71
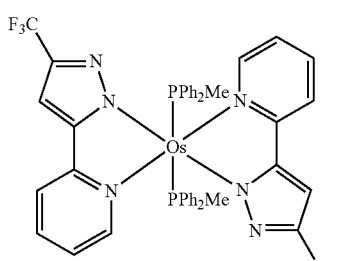
PD72

PD73

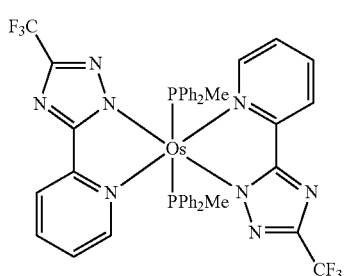

PD74

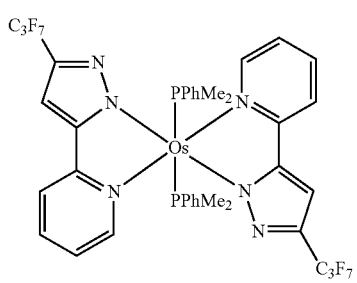

In an implementation, the phosphorescent dopant may include PtOEP below:

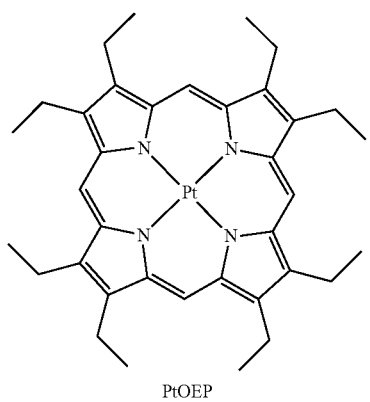

PtOEP

An amount of the dopant in the EML may be about 0.01 to about 15 parts by weight, based on 100 parts by weight of a host, but the amount is not limited thereto.

A thickness of the EML may be in a range of about 100 Å to about 1,000 Å, e.g., about 200 Å to about 600 Å. When a thickness of the EML is within this range, light-emitting properties of the organic light-emitting device may be excellent, without a substantial increase in driving voltage.

The intermediate layer may be disposed on the EML.

The intermediate layer may be formed on the EML by using various methods such as vacuum deposition, spin coating, casting, LB deposition, inkjet printing, laser printing, or LITI. When the intermediate layer is formed by vacuum deposition and spin coating, the deposition conditions and the coating conditions of the intermediate layer may be referred to the deposition conditions and the coating conditions of the HIL.

The intermediate layer may be formed of or may include a compound represented by Formula 1. In an implementation, the compound may be, e.g., any one of compounds below.

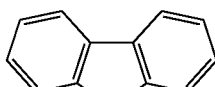

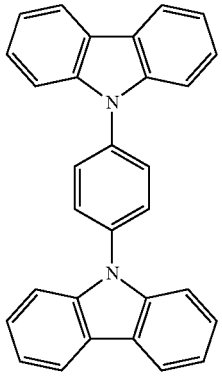

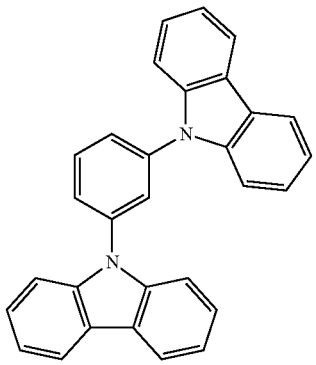

69
-continued
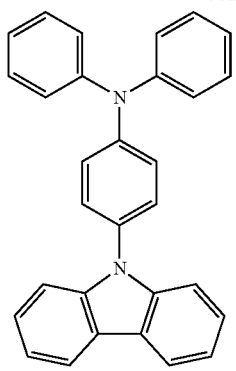
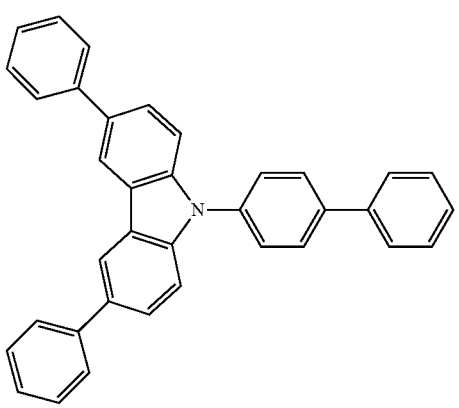
70
-continued
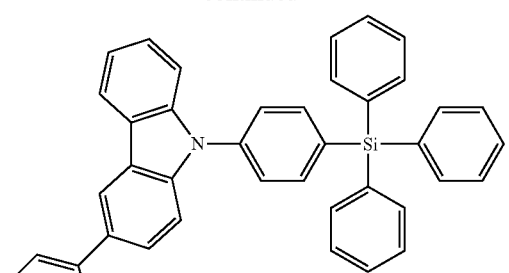
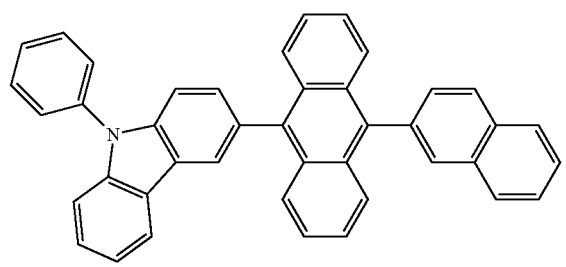
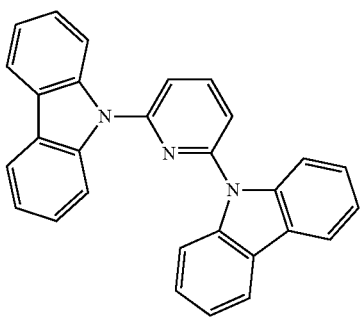
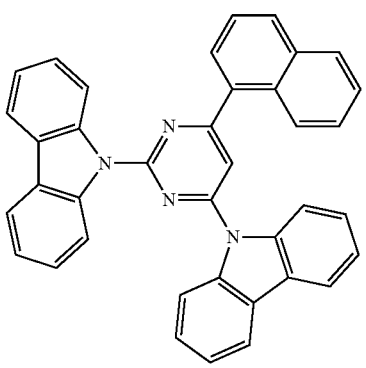

-continued
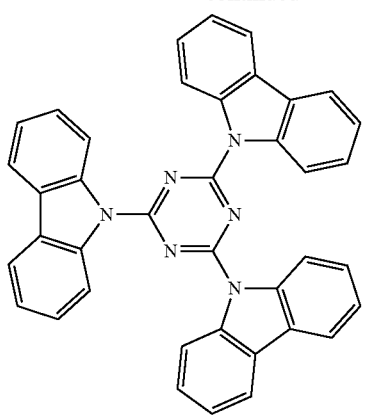
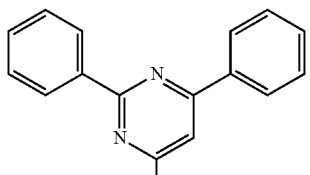
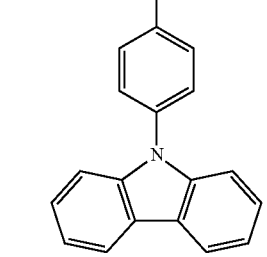
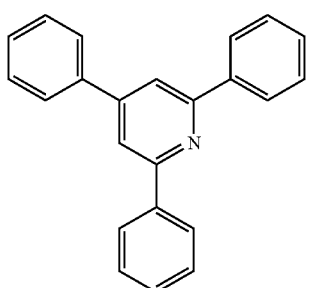
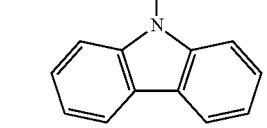
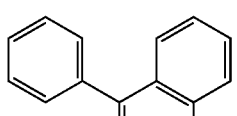
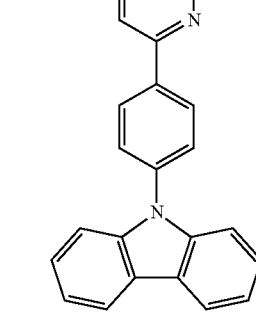
-continued
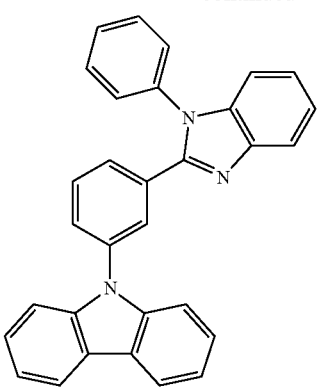
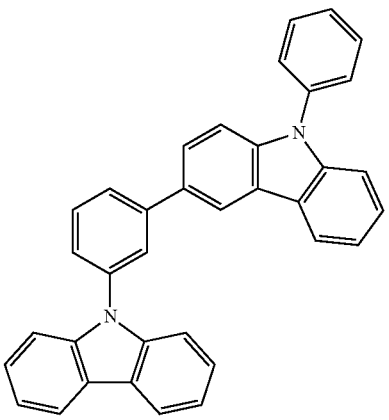
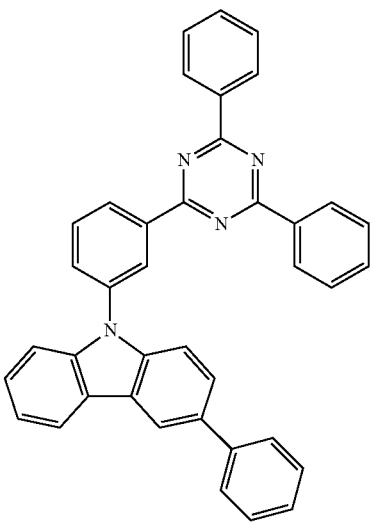

73
-continued
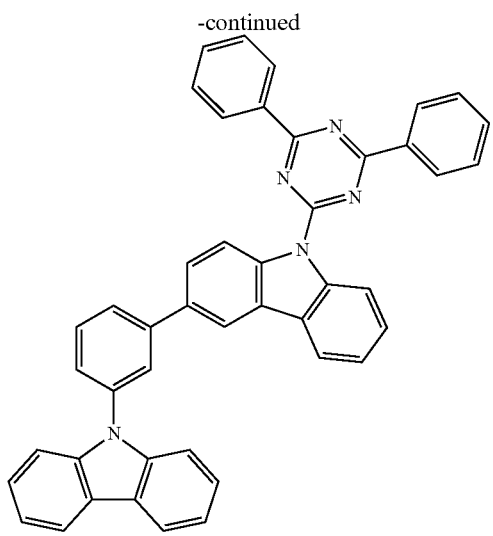
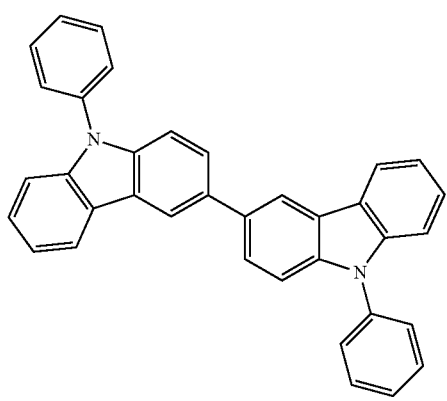
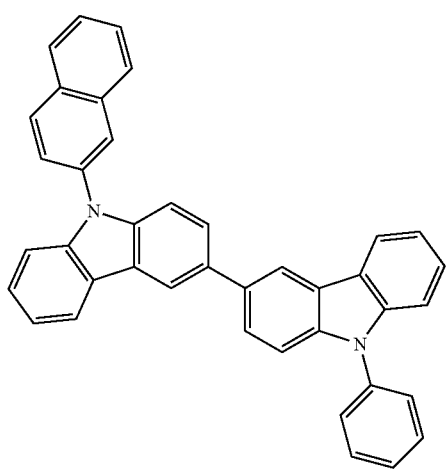
74
-continued
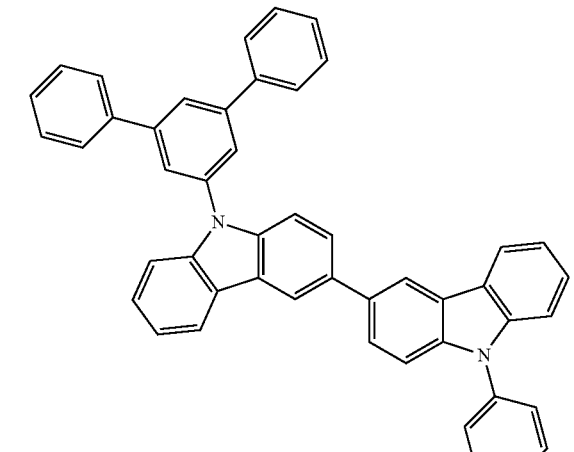
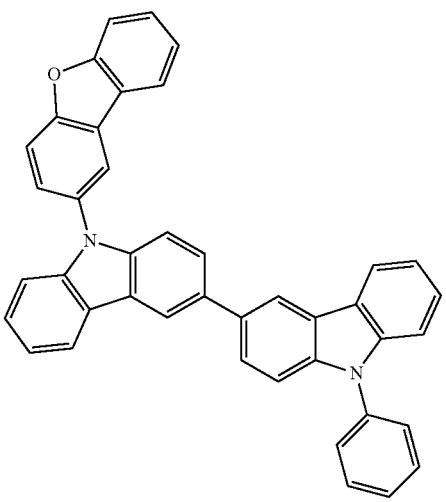
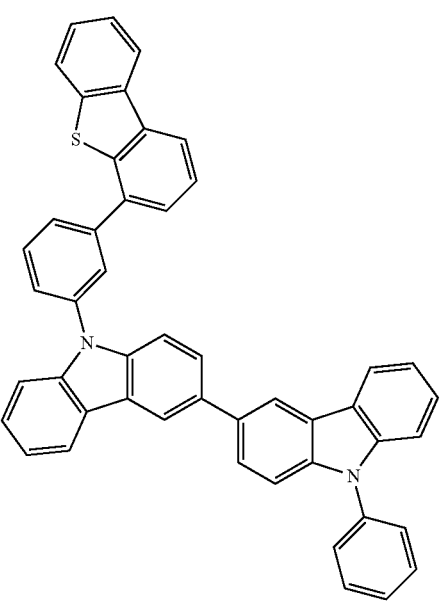

75
-continued
76
-continued
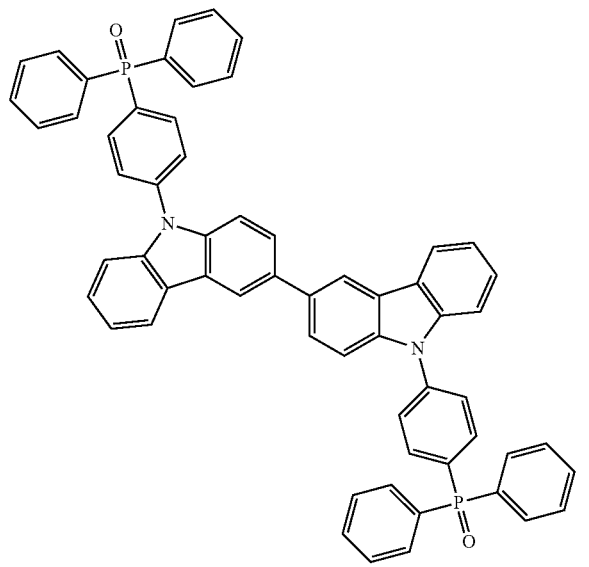
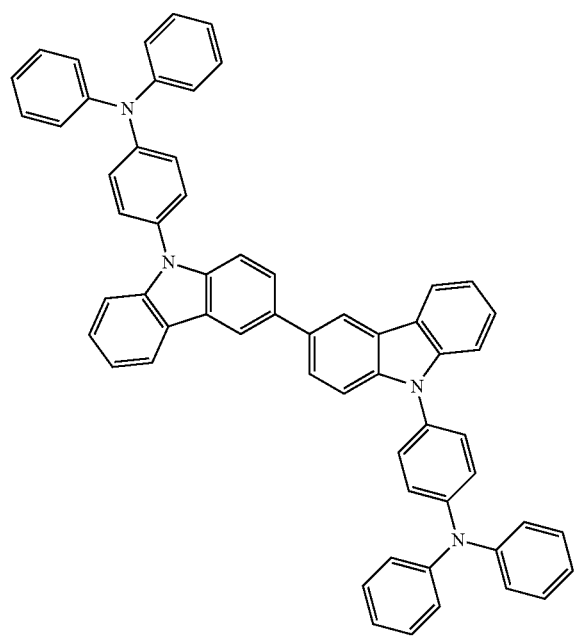
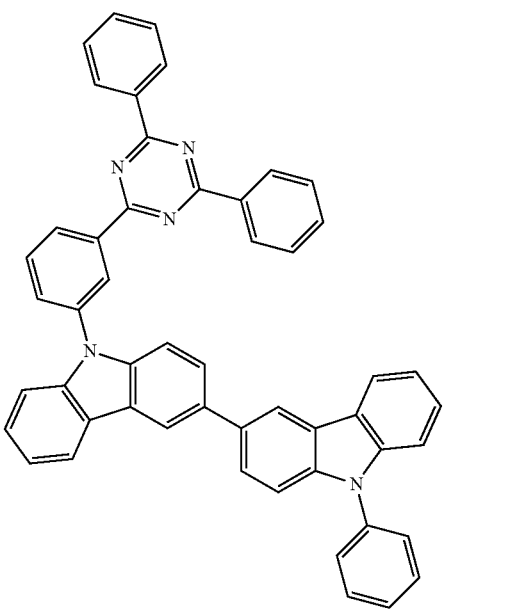
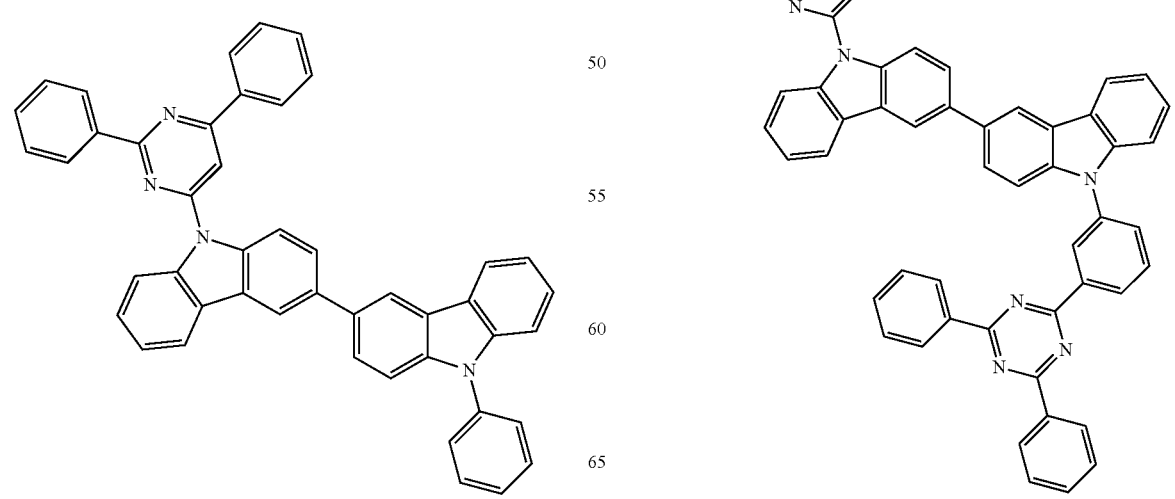

77
-continued
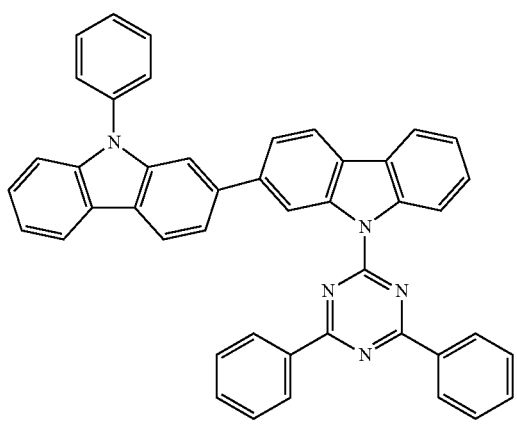
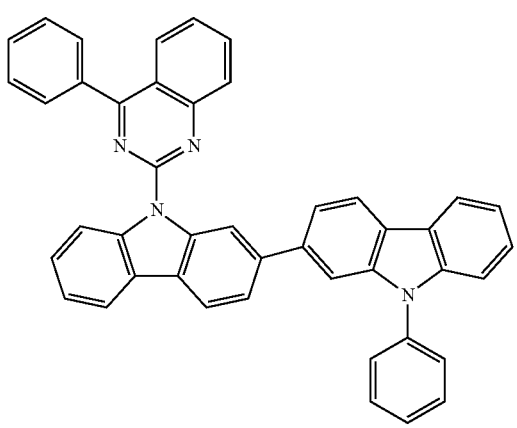
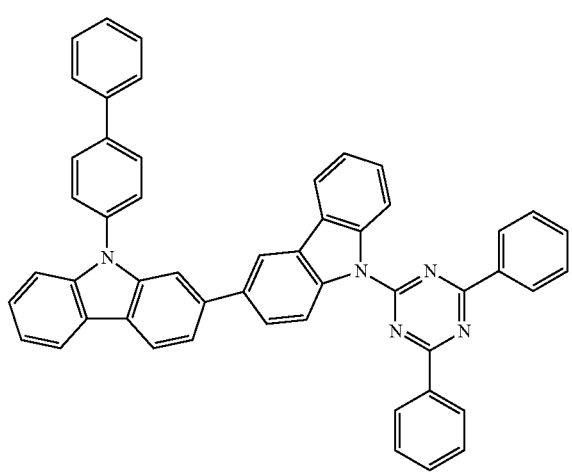
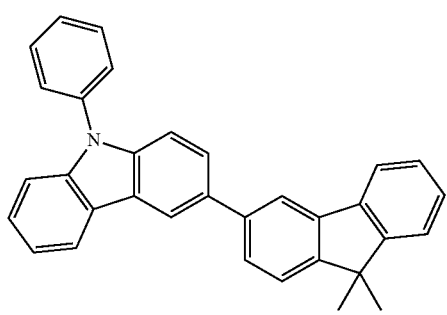
78
-continued
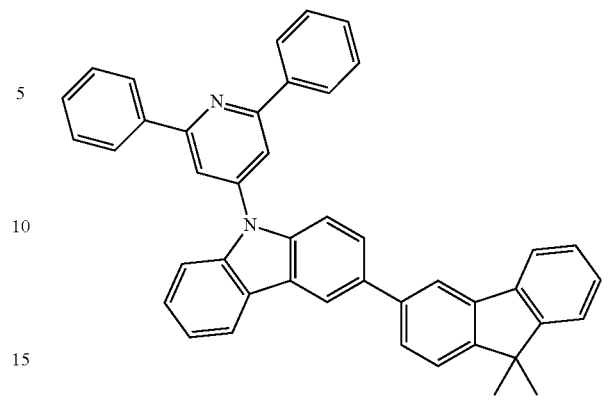
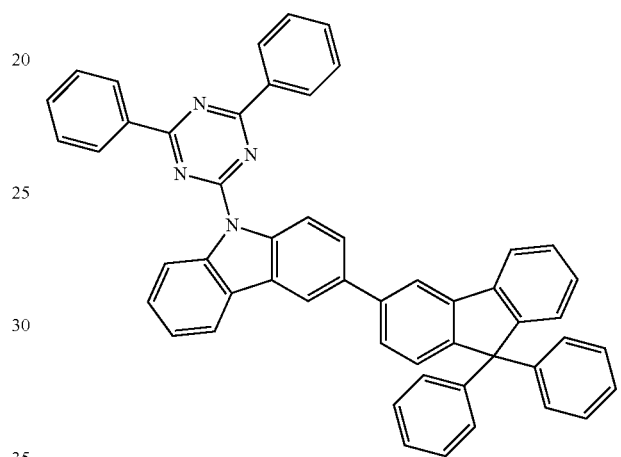
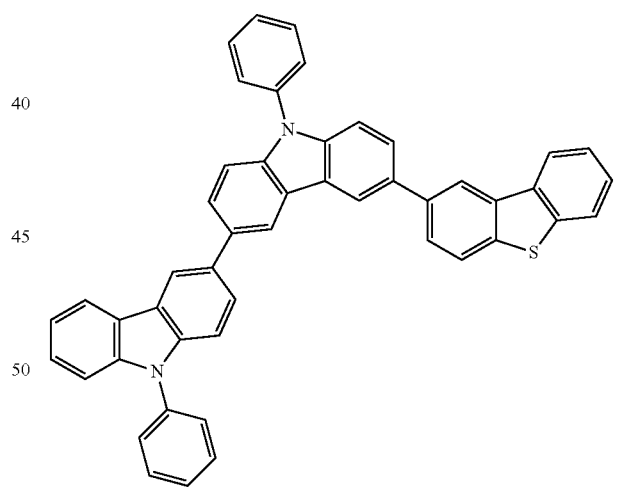
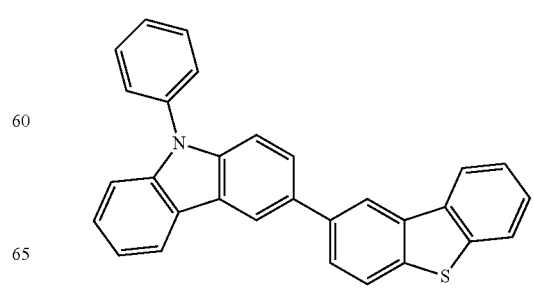

-continued
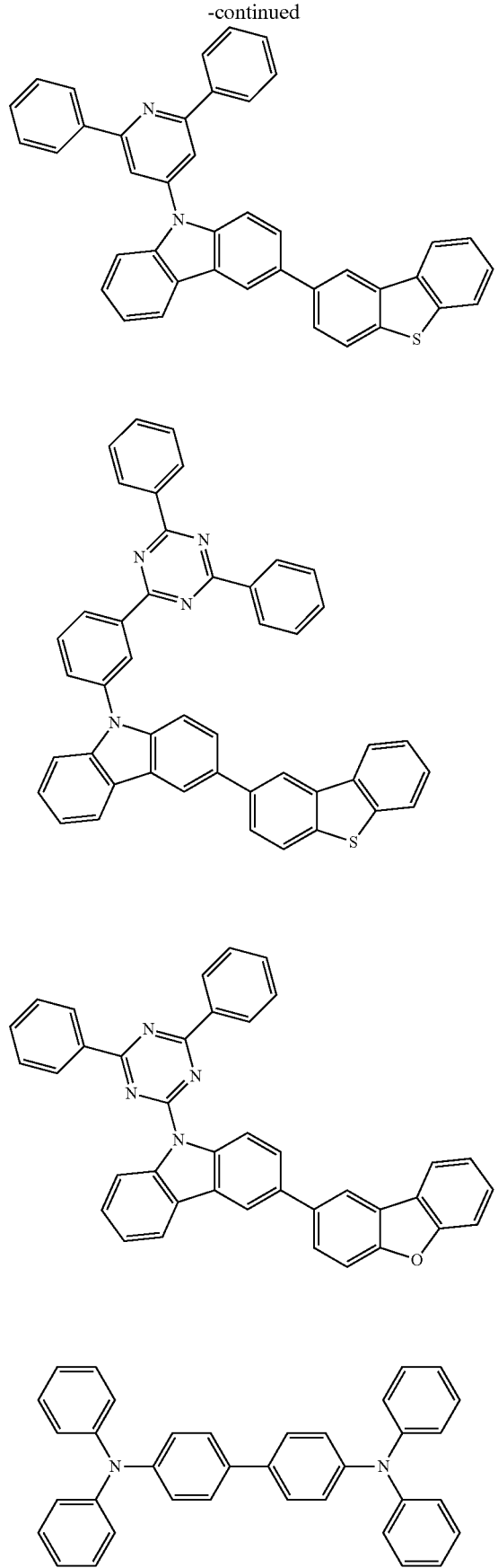
-continued
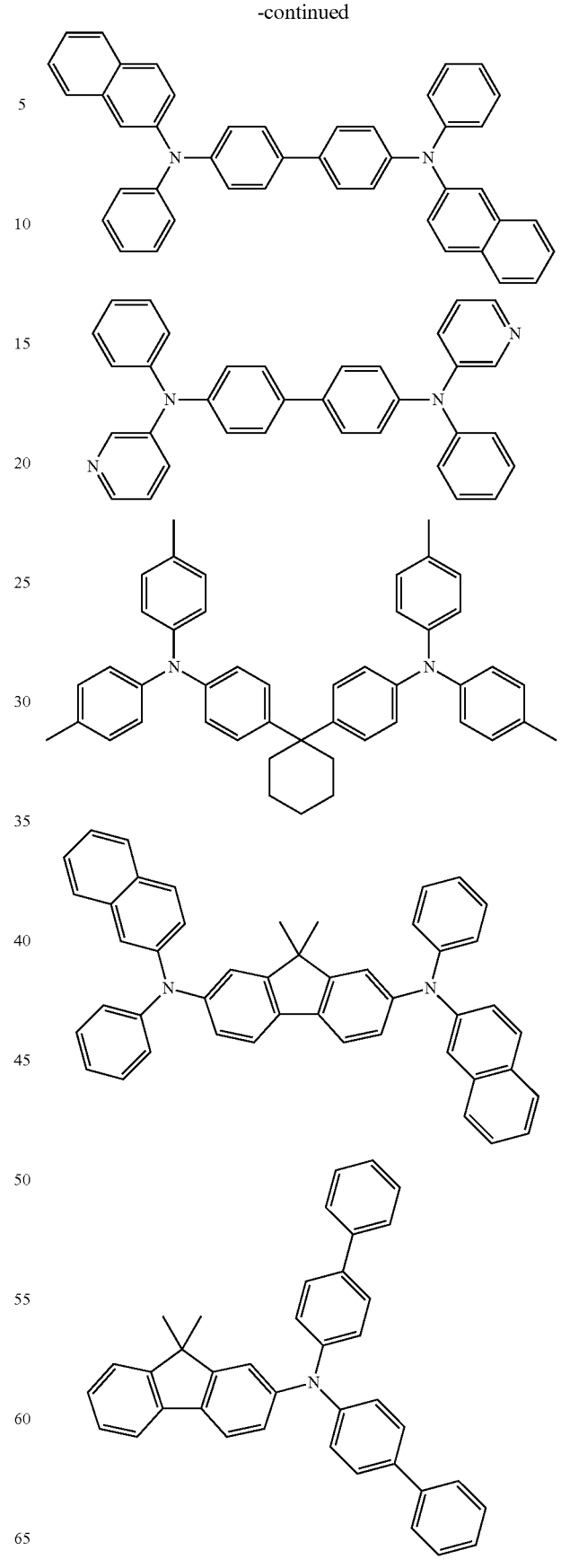

-continued

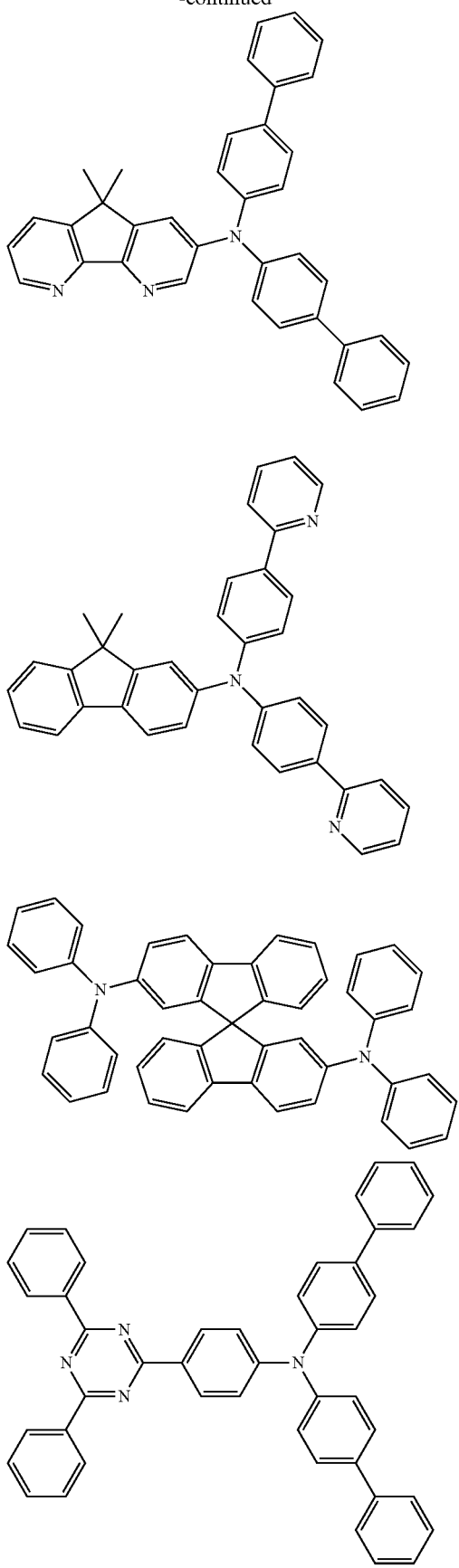

-continued

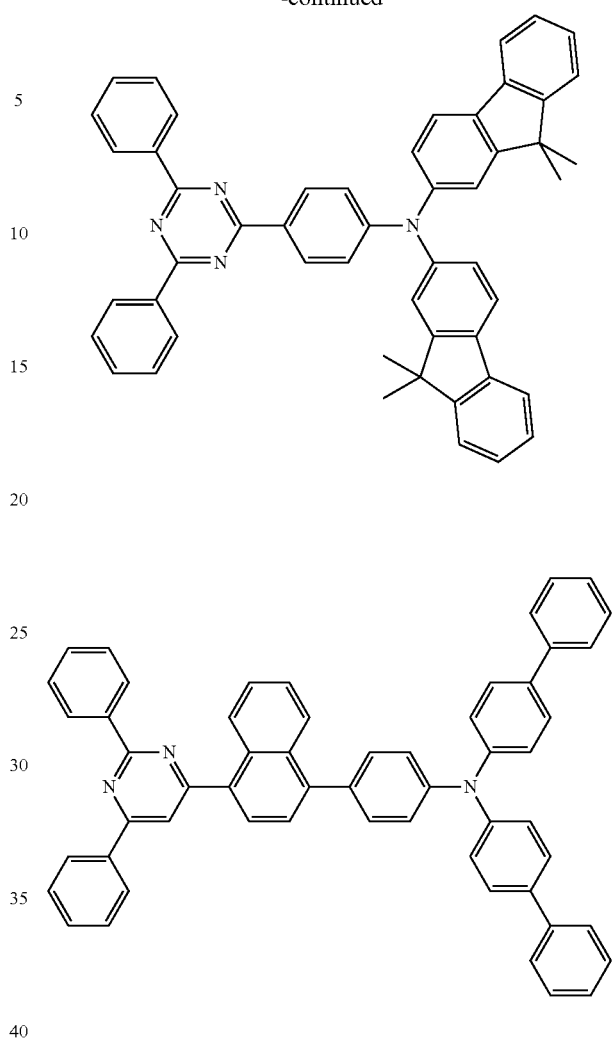

A thickness of the intermediate layer may be in a range of about 5 Å to about 400 Å or about 50 Å to about 300 Å. When a thickness of the intermediate layer is within the range, satisfactory properties of the organic light-emitting device may be obtained without substantial increase in driving voltage.

Next, an electron transport region may be disposed on the intermediate layer.

The electron transport region may include at least one selected from an HBL, an ETL, and EIL, but is not limited thereto.

For example, the electron transport region may have a structure of ETL/EIL, or a structure of HBL/ETL/EIL, wherein layers of each structure are sequentially stacked on the EML in the stated order, but the structure is not limited thereto.

In an exemplary embodiment, the organic layer 150 of the organic light-emitting device 10 may include an electron transport region between the EML and the second electrode 190. The electron transport region may include at least one of an ETL and an EIL.

The ETL may include at least one selected from BCP and Bphen, above, and Alq, Balq, TAZ, and NTAZ, below.

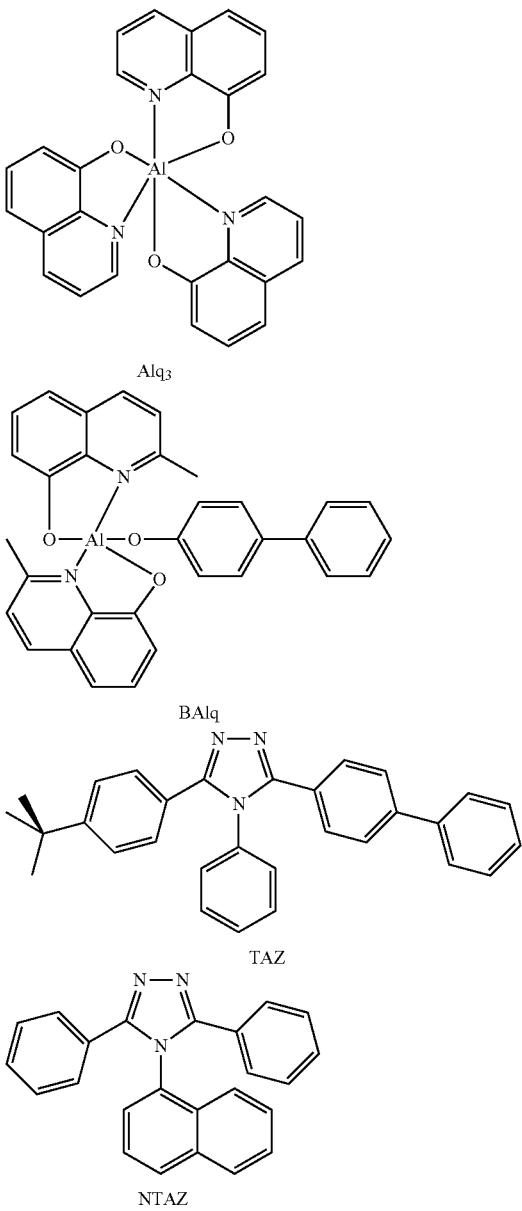

Alq3

BAlq

TAZ

NTAZ

In an implementation, the ETL may include at least one compound selected from a compound represented by Formula 601, below, and a compound represented by Formula 602 below.

Ar$_{601}$-[(L$_{601}$)$_{xe1}$-E$_{601}$]$_{xe2}$  <Formula 601>

In Formula 601,

Ar$_{601}$ may be selected from, a naphthalene, a heptalene, a fluorene, a spiro-fluorene, a benzofluorene, a dibenzofluorence, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic hetero-condensed polycyclic group, and —Si(Q$_{301}$)(Q$_{302}$)(Q$_{303}$) (here, Q$_{301}$ to Q$_{303}$ are each independently selected from a hydrogen, a $C_1$-$C_{60}$ alkyl group, a $C_2$-$C_{60}$ alkenyl group, a $C_6$-$C_{60}$ aryl group, and a $C_2$-$C_{60}$ heteroaryl group).

L$_{601}$ may be defined the same as L$_{201}$.

E$_{601}$ may be selected from, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, and a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or in salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coroneryl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group;

xe1 may be an integer selected from 0, 1, 2, and 3; and
xe2 may be an integer selected from 1, 2, 3, and 4.

<Formula 602>

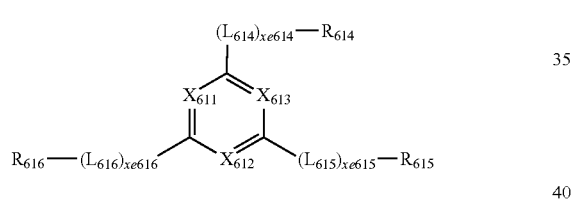

In Formula 602, $X_{611}$ may be N or C-$(L_{611})_{xe611}$-$R_{611}$, $X_{612}$ may be N or C-$(L_{612})_{xe612}$-$R_{612}$, $X_{613}$ may be N or C-$(L_{613})_{xe613}$-$R_{613}$, and at least one of $X_{611}$ to $X_{613}$ may be N.

$L_{611}$ to $L_{616}$ may be defined in the same manner as $L_{201}$ above.

$R_{611}$ to $R_{616}$ may be each independently selected from, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xe611 to xe616 may be each independently an integer selected from 0, 1, 2, and 3.

The compound represented by Formula 601 and the compound represented by Formula 602 may be each independently selected from one of compounds ET1 to ET15 below.

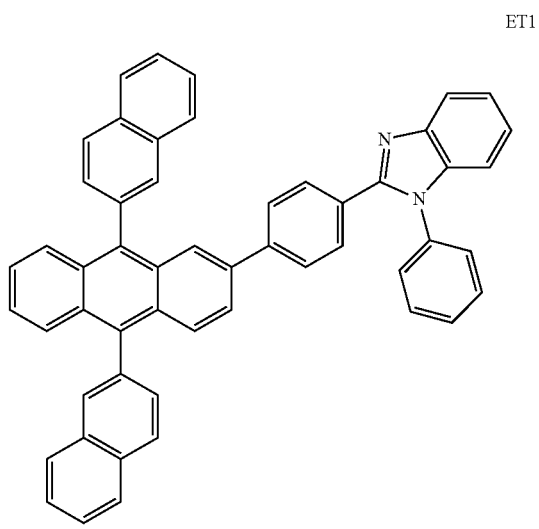

ET1

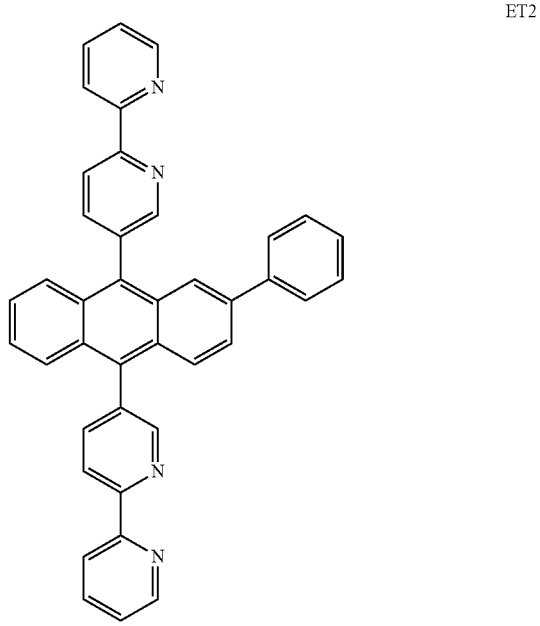

ET2

ET3
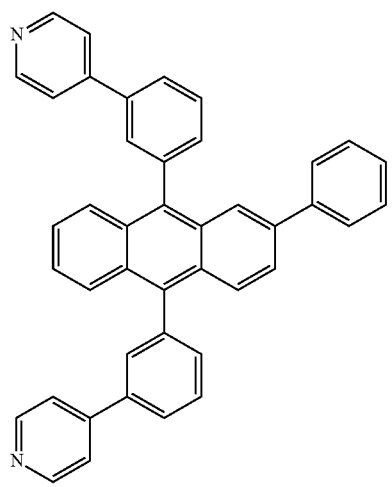
ET4
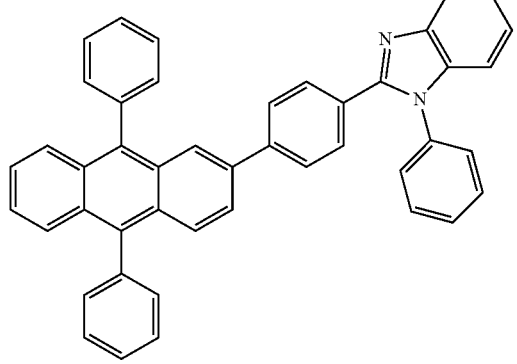
ET5
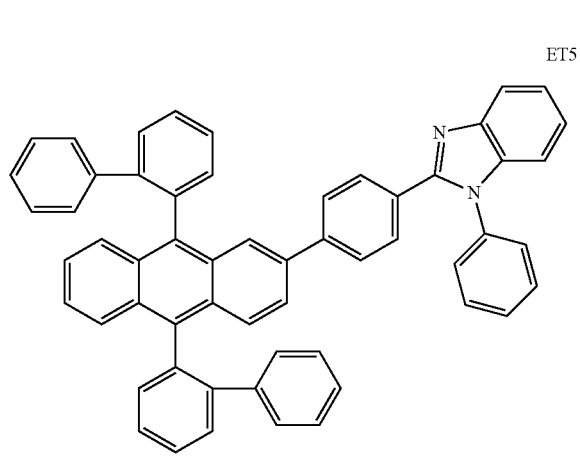
ET6
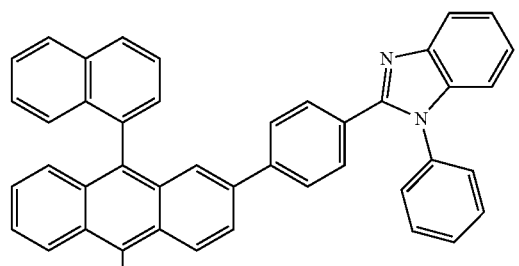
ET7
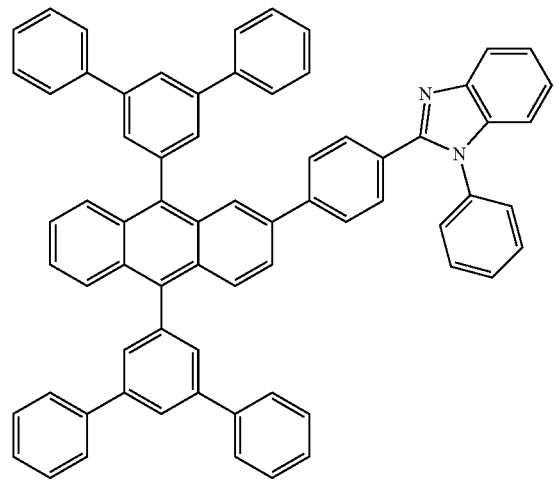
ET8
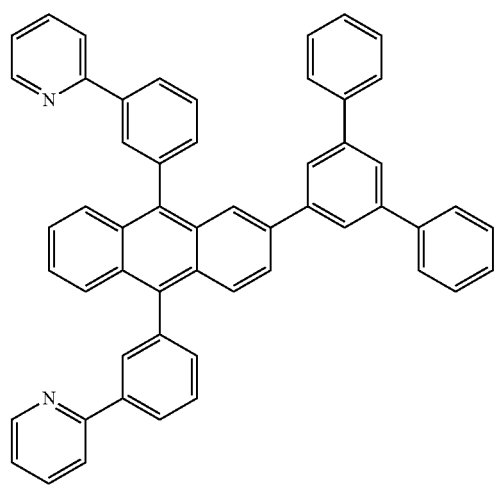

ET9
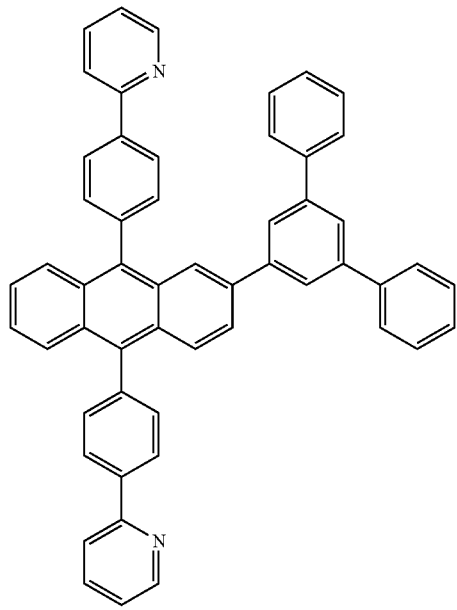
ET10
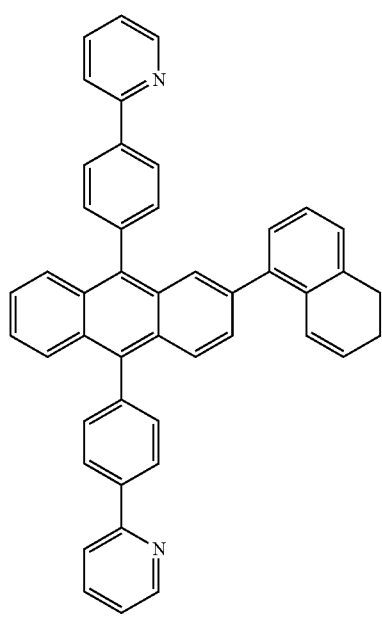
ET11
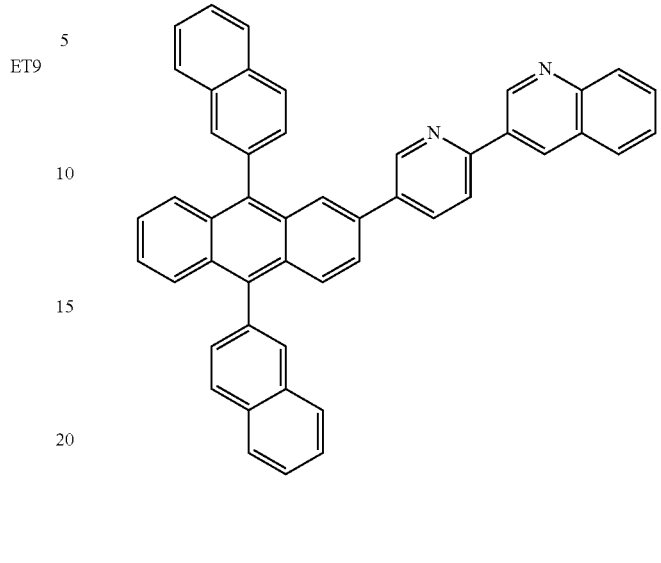
ET12
ET13
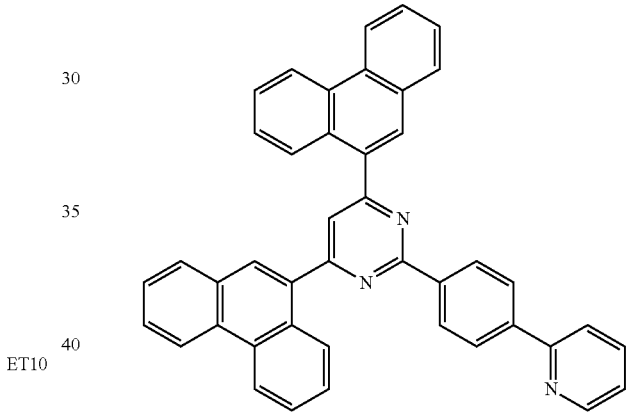

ET14

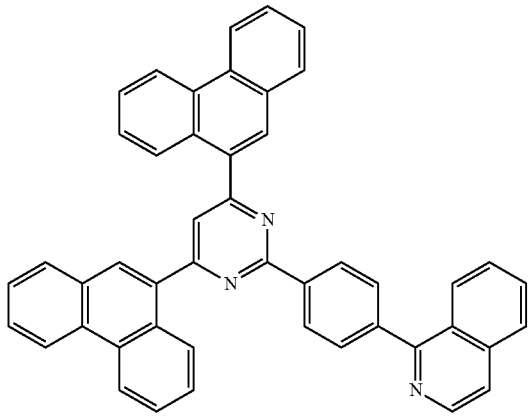

ET15

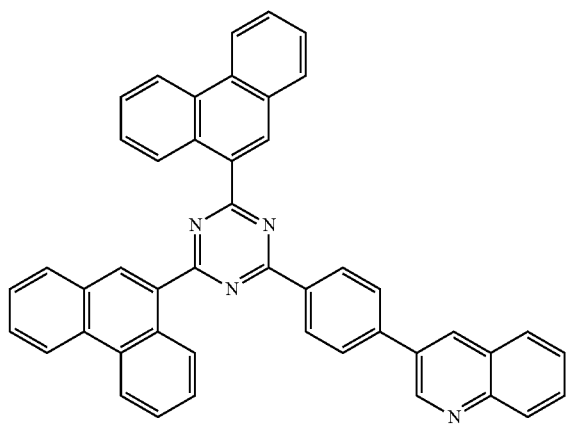

A thickness of the ETL may be in a range of about 100 Å to about 1,000 Å, e.g., about 150 Å to about 500 Å. When a thickness of the ETL is within this range, satisfactory electron transporting properties of the organic light-emitting device may be obtained without a substantial increase in driving voltage.

In an implementation, the ETL may further include a metal-containing material, in addition to the materials above.

The metal-containing material may include a Li-complex. The Li-complex may include, e.g., compound ET-D1 (lithium quinolate (LiQ)) or ET-D2.

ET-D1

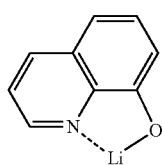

ET-D2

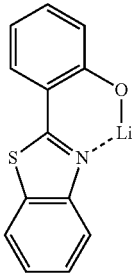

The electron transport region may include the HBL. When the EML uses a phosphorescent dopant, the HBL may help reduce and/or prevent triplet excitons or holes from being diffused to the ETL.

When the electron transport region includes the HBL, the HBL may be formed on the EML by using various methods such as vacuum deposition, spin coating, casting, LB deposition, inkjet printing, laser printing, or LITI. When the HBL is formed by methods such as vacuum deposition and spin coating, the deposition conditions and the coating conditions of the HBL may be referred to the de deposition conditions and the coating conditions of the HIL.

The HBL may include, e.g., at least one of BCP and Bphen below, but is not limited thereto:

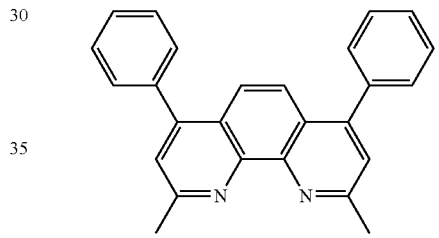

BCP

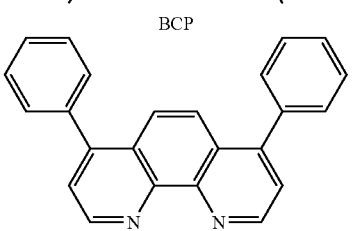

Bphen

A thickness of the HBL may be in a range of about 20 Å to about 1,000 Å, e.g., about 30 Å to about 300 Å. When a thickness of the HBL is within this range, excellent hole blocking properties of the organic light-emitting device may be obtained without a substantial increase in driving voltage.

The electron transport region may include the ETL. The ETL may be formed on the EML or the HBL by using various methods such as vacuum deposition, spin coating, casting, LB deposition, inkjet printing, laser printing, or LITI. When the ETL is formed by methods such as vacuum deposition and spin coating, the deposition conditions and the coating conditions of the ETL may be referred to the de deposition conditions and the coating conditions of the HIL.

The electron transport region may include the EIL that facilitates injection of electrons from the second electrode 190.

The EIL may be formed on the ETL by using various methods such as vacuum deposition, spin coating, casting, LB deposition, inkjet printing, laser printing, or LITI. When the EIL is formed by vacuum deposition and spin coating, the deposition conditions and the coating conditions of the EIL may be referred to the de deposition conditions and the coating conditions of the HIL.

The EIL may include at least one selected from LiF, NaCl, CsF, $Li_2O$, BaO, and LiQ.

A thickness of the EIL may be in a range of about 1 Å to about 100 Å, e.g., about 3 Å to about 90 Å. When a thickness of the EIL is within this range, satisfactory electron injecting properties of the organic light-emitting device may be obtained without a substantial increase in driving voltage.

The second electrode 190 may be disposed on the organic layer 150. The second electrode 190 may be a cathode, which is an electron injection electrode. In this regard, a material for forming the second electrode 190 may include a metal, an alloy, an electric conducting compound, and a mixture thereof having a low work function. For example, the second electrode 190 may be a thin film formed of lithium (Li), magnesium (Mg), aluminum (Al), aluminum-lithium (Al—Li), calcium (Ca), magnesium-indium (Mg—In), or magnesium-silver (Mg—Ag). In an implementation, ITO or IZO may be used as a material for forming the second electrode 190. The second electrode 190 may be a reflective electrode, a semitransparent electrode, or a transparent electrode.

In an implementation, an organic layer of an organic light-emitting device according to an embodiment may be formed by using a deposition method using a compound according to an embodiment or by using a wet method, in which the organic light-emitting device is coated with the compound that is prepared as a solution.

An organic light-emitting device according to an embodiment may be included in various types of flat panel displays, e.g., a passive matrix organic light-emitting display apparatus and an active matrix organic light-emitting display apparatus. For example, when the organic light-emitting device is included in an active matrix organic light-emitting display apparatus, a first electrode located on a side of a substrate may be a pixel electrode which may be electrically connected to a source electrode or a drain electrode of a thin film transistor. In an implementation, the organic light-emitting device may be included in a flat panel display that may display images on both surfaces.

The organic light-emitting device has been described with reference to FIG. 1, but an organic light-emitting device is not limited thereto.

Hereinafter, the OLED according to one or more embodiments will now be described in great detail with reference to the following examples. The compounds used in the following examples are all commonly known compounds which are easily purchased by one skilled in the art.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

An ITO glass substrate was cut to a size of 50 mm×50 mm×0.5 mm, sonicated by using isopropyl alcohol and pure water each for 15 minutes, and cleaned by the exposure to ultraviolet rays for 30 minutes, and then to ozone. Then, HT1 was vacuum deposited on the substrate to form an HTL having a thickness of 1,200 Å. Then, hosts including CBP and PH1 at a weight ratio of 1:1 and a dopant including 10 wt % $Ir(ppy)_3$ were vacuum deposited on the HTL to form an EML having a thickness of 300 Å. Then, IL1 was vacuum deposited close to the EML to form an intermediate layer having a thickness of 200 Å. Then, $Alq_3$ was vacuum deposited on the intermediate layer to form an ETL having a thickness of 200 Å. LiF and Al were subsequently formed on the ETL to form an EIL having a thickness of 10 Å and a cathode having a thickness of 2,000 Å, respectively, thereby manufacturing an organic light-emitting device.

Example 2

An organic light-emitting device having a structure of ITO/HT1 (1,200 Å)/CBP+PH1+10% $Ir(ppy)_3$ (300 Å)/IL2 (200 Å)/$Alq_3$ (200 Å)/LiF (10 Å)/Al (2,000 Å) was manufactured in the same manner as in Example 1, except that IL2 was used instead of IL1 as a material for an intermediate layer.

Example 3

An organic light-emitting device having a structure of ITO/HT1 (1,200 Å)/CBP+PH1+10% $Ir(ppy)_3$ (300 Å)/IL3 (200 Å)/$Alq_3$ (200 Å)/LiF (10 Å)/Al (2,000 Å) was manufactured in the same manner as in Example 1, except that IL3 was used instead of IL1 as a material for an intermediate layer.

Example 4

An organic light-emitting device having a structure of ITO/HT1 (1200 Å)/CBP+PH2+10% Ir(ppy), (300 Å)/IL1 (200 Å)/$Alq_3$ (200 Å)/LiF (10 Å)/Al (2000 Å) was manufactured in the same manner as in Example 1, except that PH2 was used instead of PH1 as a host in the EML.

Example 5

An organic light-emitting device having a structure of ITO/HT1 (1200 Å)/CBP+SPPO+10% $Ir(ppy)_3$ (300 Å)/IL1 (200 Å)/$Alq_3$ (200 Å)/LiF (10 Å)/Al (2000 Å) was manufactured in the same manner as in Example 1, except that SPPO was used instead of PH1 as a host in the EML.

Example 6

An organic light-emitting device having a structure of ITO/HT1 (1,200 Å)/BSB+PH1+10% $Ir(ppy)_3$ (300 Å)/IL1 (200 Å)/$Alq_3$ (200 Å)/LiF (10 Å)/Al (2,000 Å) was manufactured in the same manner as in Example 1, except that BSB was used instead of CBP as a host in the EML.

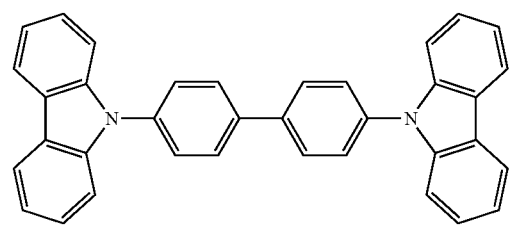

CBP

-continued
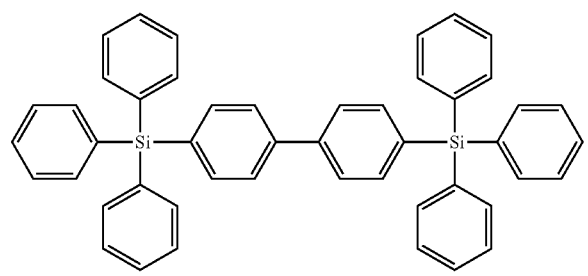
BSB
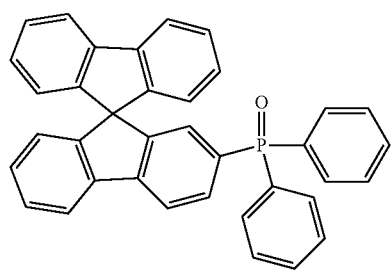
SPPO
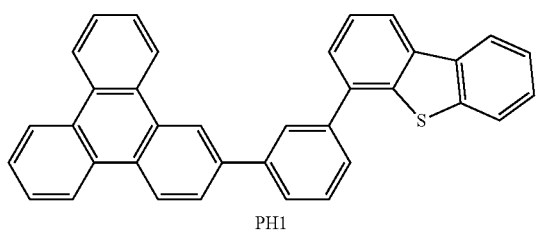
PH1
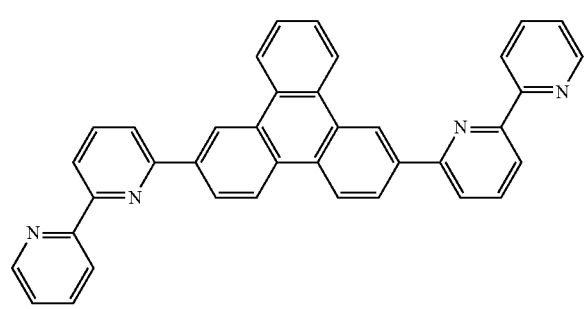
PH2
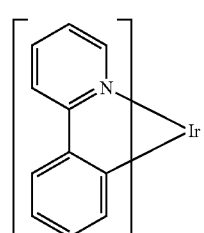
Ir(ppy)3
-continued
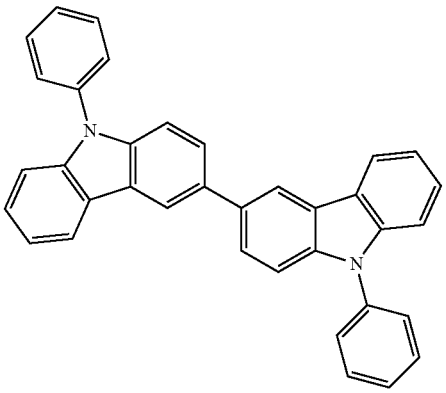
IL1
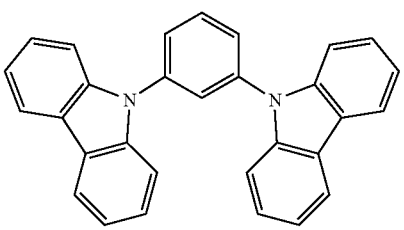
IL2
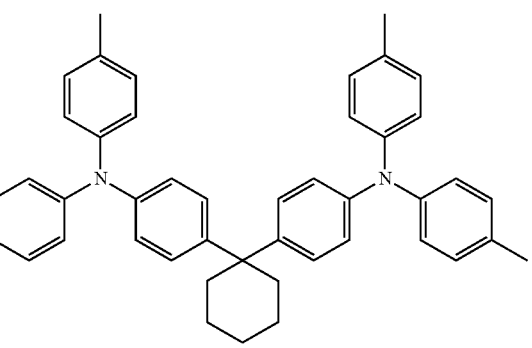
IL3
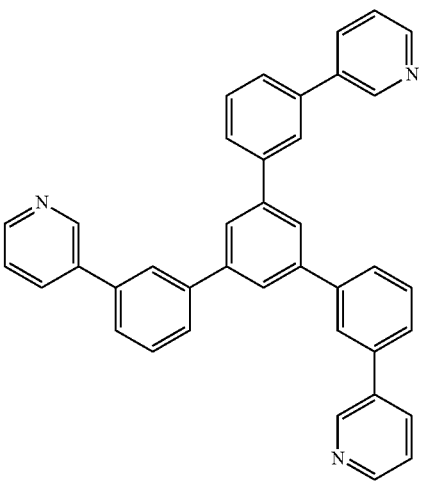
IL4

-continued

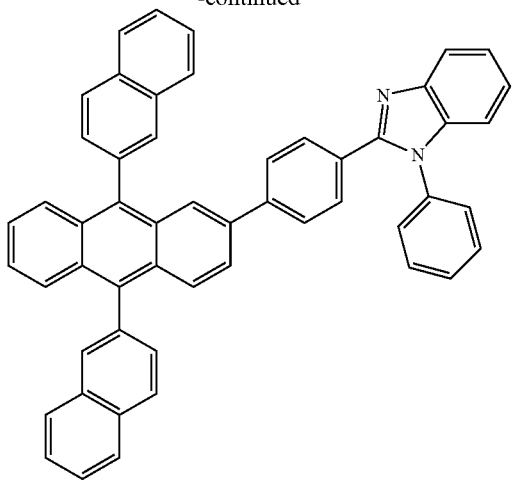

IL5

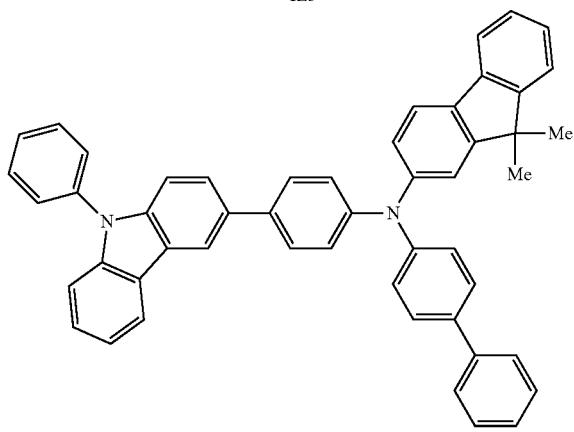

HT1

Comparative Example 1: An Organic Light-Emitting Layer Having a Single Host and a Single ETL without an Intermediate Layer An organic light-emitting device having a structure of ITO/HT1 (1,200 Å)/CBP+10% Ir(ppy)$_3$ (300 Å)/Alq$_3$ (400 Å)/LiF (10 Å)/Al (2,000 Å) was manufactured in the same manner as in Example 1, except for the different materials in the structure above.

Comparative Example 2: An Organic Light-Emitting Layer Having CBP as a Single Phosphorescent Host (A Case not Applying Two Different Hosts)

An organic light-emitting device having a structure of ITO/HT1 (1,200 Å)/CBP+10% Ir(ppy)$_3$ (300 Å)/IL1 (200 Å)/Alq$_3$ (200 Å)/LiF (10 Å)/Al (2,000 Å) was manufactured in the same manner as in Example 1, except for the different materials in the structure above.

Comparative Example 3: An Organic Light-Emitting Device Having PH1 as a Triphenylene-Based Single Host (A Case Not Applying Two Different Hosts)

An organic light-emitting device having a structure of ITO/HT1 (1,200 Å)/PH1+10% Ir(ppy)$_3$ (300 Å)/IL1 (200 Å)/Alq$_3$ (200 Å)/LiF (10 Å)/Al (2,000 Å) was manufactured in the same manner as in Example 1, except for the different materials in the structure above.

Comparative Example 4: An Organic Light-Emitting Device Having Satisfactory Hosts but not Including a Compound of Formula 1 for an Intermediate Layer An organic light-emitting device having a structure of ITO/HT1 (1,200 Å)/CBP+PH1 10% Ir(ppy)$_3$ (300 Å)/IL4 (200 Å)/Alq$_3$ (200 Å)/LiF (10 Å)/Al (2,000 Å) was manufactured in the same manner as in Example 1, except for the different materials in the structure above.

Comparative Example 5: An Organic Light-Emitting Device Having Satisfactory Hosts but not Including a Compound of Formula 1 for an Intermediate Layer An organic light-emitting device having a structure of ITO/HT1 (1,200 Å)/CBP+PH1+10% Ir(ppy)$_3$ (300 Å)/IL5 (200 Å)/Alq$_3$ (200 Å)/LiF (10 Å)/Al (2,000 Å) was manufactured in the same manner as in Example 1, except for the different materials in the structure above.

Electron affinities and triplet energies of the phosphorescent hosts and the materials for the intermediate layer were measured, and comparative results thereof are shown in Table 1, below.

TABLE 1

|  | T1 (triplet energy) | EA (electron affinity) |
|---|---|---|
| Ir(ppy)$_3$ | 2.4 |  |
| Alq3 | 2.0 | 3.0 |
| IL1 | 2.9 | 2.3 |
| IL2 | 2.9 | 2.4 |
| IL3 | 2.9 | 2.0 |
| IL4 | — | 2.8 |
| IL5 | 1.7 | 2.9 |

It may be seen that the organic light-emitting devices of Example 1 to 6 has excellent properties, compared to those of Comparative Examples 1 to 5, and the results thereof are shown in Table 2, below.

TABLE 2

|  | Host in a phosphorescent EML [Dopant Ir(ppy)$^3$] | Intermediate layer | Efficiency (cd/A) | T90 (hr) |
|---|---|---|---|---|
| Example 1 | CBP:PH1 | IL1 | 63 cd/A | 232 hr |
| Example 2 | CBP:PH1 | IL2 | 66 cd/A | 184 hr |
| Example 3 | CBP:PH1 | IL3 | 62 cd/A | 173 hr |
| Example 4 | CBP:PH2 | IL1 | 68 cd/A | 205 hr |
| Example 5 | CBP:SPPO | IL1 | 62 cd/A | 167 hr |
| Example 6 | BSB:PH1 | IL1 | 64 cd/A | 155 hr |
| Comparative Example 1 | Single host CBP | None | 44 cd/A | 49 hr |
| Comparative Example 2 | Single host CBP | IL1 | 52 cd/A | 87 hr |
| Comparative Example 3 | Single host PH1 | IL1 | 49 cd/A | 103 hr |
| Comparative Example 4 | CBP:PH1 | IL4 | 55 cd/A | 68 hr |
| Comparative Example 5 | CBP:PH1 | IL5 | 57 cd/A | 118 hr |

By way of summation and review, when a phosphorescent material is introduced to an organic light-emitting device, the organic light-emitting device may be manufactured as a device having a significantly high efficiency, compared to a device using a fluorescent material. Such a phosphorescent material may have good emission properties, and in order to ideally achieve a high efficiency in the organic light-emitting device, energy generated in the EML may be confined within the EML. In regard to a phosphorescent organic light-emitting device, in an effort to help reduce and/or prevent diffusion of triplet excitons to the outside of the EML, wherein the triplet excitons have a longer lifespan than single excitons, a material having a high triplet energy may be used for a layer adjacent to the EML, thereby manufacturing the organic light-emitting device having a high efficiency. In order to have triplet excitons that efficiently emit from a dopant, a phosphorescent host may be set to have a triplet energy higher than that of a dopant. In this regard, a host molecule may have a wide energy gap and a low electron affinity. Then, there may be hindrance to electron injection to a host, an increase in a driving voltage of the organic light-emitting device, and degradation of an emission efficiency of the organic light-emitting device. In addition, recombination of the holes and electrons may occur intensely on a side of the cathode from the EML where the electron carriers are accumulated, and thus, a light-emitting lifespan of the organic light-emitting device may be degraded.

According to an embodiment, an intermediate layer that blocks the electron transport may be introduced between the EML and the ETL of the organic light-emitting device. A material for the intermediate layer may have a higher triplet energy (T1) than that of a phosphorescent dopant. For example, excitons formed in the EML may be prevented from diffusing to adjacent layers of the EML. Accordingly, degradation of efficiency of the organic light-emitting device may be reduced and/or prevented. In the implementation, the intermediate layer may have a function regarding a charge balance of the entire organic light-emitting device by forming an EA barrier with the ETL to help deter rapid injection of electrons.

In this regard, electrons quickly transported from the cathode and holes transported from the anode may be efficiently recombined in the EML to form excitons, and leakage current caused by the holes or electrons leaking to adjacent layers may be reduced and/or prevented. Accordingly, deterioration of emission efficiency and emission lifespan of the organic light-emitting device may be also prevented.

As described above, according to the one or more of the above embodiments, an organic light-emitting device may have a low driving voltage, a high efficiency, and a long lifespan.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device, comprising:
an anode;
a cathode; and
an organic layer between the anode and the cathode, the organic layer including:
an emission layer (EML), the EML including a first host and a second host that are different from one another,
a hole transport region between the anode and the EML, the hole transport region including at least one of a hole injection layer (HIL), a hole transport layer (HTL), a buffer layer, or an electron blocking layer (EBL),
an electron transport region between the EML and the cathode, the electron transport region including at least one of a hole blocking layer (HBL), an electron transport layer (ETL), or an electron injection layer (EIL), and
an intermediate layer between the EML and the electron transport region;
wherein the intermediate layer includes a compound having an electron affinity of more than 0 eV and less than 2.5 eV, and
wherein an electron affinity of the intermediate layer compound [$EA_{intermediate\ layer}$] and an electron affinity of a compound of the ETL [$EA_{ETL}$] satisfy a relationship represented by the following expression:

$EA_{ETL} \geq EA_{intermediate\ layer} + 0.3$ eV.

2. The organic light-emitting device as claimed in claim 1, wherein the EML is a phosphorescent EML.

3. The organic light-emitting device as claimed in claim 1, wherein a relationship of electron affinities ($EA_{host1}$) and ($EA_{host2}$) and ionization potentials ($IP_{host1}$) and ($IP_{host2}$) of the first host and the second host satisfy at least one of the following expressions:

$EA_{host1} \geq EA_{host2} + 0.3$ eV  (1)

$IP_{host2} \geq IP_{host1} + 0.3$ eV  (2).

4. The organic light-emitting device as claimed in claim 1, wherein the EML is a phosphorescent EML, the EML including a dopant that emits phosphorescence having a main peak of at least 450 nm.

5. The organic light-emitting device as claimed in claim 1, wherein:
the EML is a phosphorescent EML, the EML including a dopant that emits phosphorescence having a main peak of at least 450 nm, and
at least one of the first host or the second host is a compound that includes a tryphenylene moiety or a carbazole moiety.

6. The organic light-emitting device as claimed in claim 1, wherein:
the intermediate layer contacts the EML, and
the compound having an electron affinity of more than 0 eV and less than 2.5 eV includes a tryphenylene moiety or a carbazole moiety.

7. The organic light-emitting device as claimed in claim 4, wherein a triplet energy of the intermediate layer compound [$E^T_{IL}(eV)$] is greater than that of the dopant that emits phosphorescence [$E^T_d(eV)$].

8. The organic light-emitting device as claimed in claim 1, wherein:
the intermediate layer compound has a triplet energy of at least 2.2 eV when the EML emits red phosphorescence, the intermediate layer compound has a triplet energy of at least 2.4 eV when the EML emits green phosphorescence, and the intermediate layer compound has a triplet energy of at least at least 2.6 eV when the EML emits blue phosphorescence.

9. The organic light-emitting device as claimed in claim 1, wherein the hole transport region includes a p-dopant.

10. The organic light-emitting device as claimed in claim 1, wherein the hole transport region includes a p-dopant, the p-dopant including a quinone derivative, a metal oxide, or a cyano group-containing compound.

11. The organic light-emitting device as claimed in claim 1, wherein the EML is a phosphorescent EML and the EML includes a dopant, the dopant including an Ir-complex, a Pt-complex, an Os-complex, or a Cu-complex.

12. The organic light-emitting device as claimed in claim 1, wherein the intermediate layer compound is represented by Formula 1 below:

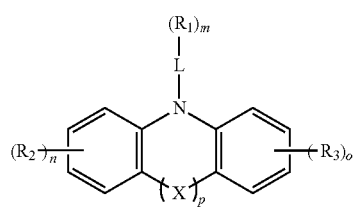

<Formula 1> wherein, in Formula 1,

X is a single bond or $NR_4$;

$R_1$ to $R_4$ are each independently a hydrogen, a deuterium, $-P(=O)R_{51}R_{52}$, a substituted or unsubstituted $C_1$-$C_{60}$ alkyl group, a substituted or unsubstituted $C_1$-$C_{60}$ heteroalkyl group, a substituted or unsubstituted $C_6$-$C_{60}$ aryl group, a substituted or unsubstituted $C_2$-$C_{60}$ heteroaryl group, a substituted or unsubstituted $C_6$-$C_{60}$ condensed polycyclic group, or a $C_6$-$C_{30}$ arylamine group; and/or adjacent substituents of $R_2$ and $R_3$ link together to form a ring;

L is a single bond, a substituted or unsubstituted $C_6$-$C_{60}$ arylene group, a substituted or unsubstituted $C_1$-$C_{60}$ heteroarylene group, or a linkage connecting 2 to 5 of the arylene groups or the heteroarylene groups;

$R_{51}$ and $R_{52}$ are each independently a substituted or unsubstituted $C_1$-$C_{60}$ alkyl group, a substituted or unsubstituted $C_1$-$C_{60}$ heteroalkyl group, a substituted or unsubstituted $C_6$-$C_{60}$ aryl group, a substituted or unsubstituted $C_2$-$C_{60}$ heteroaryl group, a substituted or unsubstituted $C_6$-$C_{60}$ condensed polycyclic group, or a $C_6$-$C_{30}$ arylamine group;

m, n, and o are each independently an integer selected from 1 to 4, and when any of m, n, and o is 2 or greater, $R_1$ to $R_3$ are the same or different from each other; and p is an integer selected from 0 and 1, and when p is 0, a benzene moiety substituted with $R_2$ and a benzene moiety substituted with $R_3$ are not connected in an X-shape.

13. The organic light-emitting device as claimed in claim 12, wherein $R_1$ to $R_4$ are each independently a hydrogen, a deuterium, a substituted or unsubstituted $C_1$-$C_{30}$ alkyl group, a substituted or unsubstituted $C_1$-$C_{30}$ heteroalkyl group, a substituted or unsubstituted $C_6$-$C_{30}$ arylamine group, or a group represented by one of Formulae 2a to 2x below:

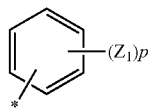

2a

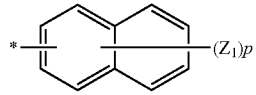

2b

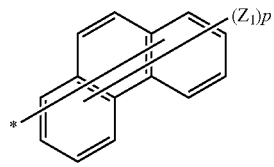

2c

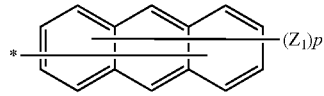

2d

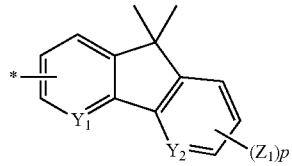

2e

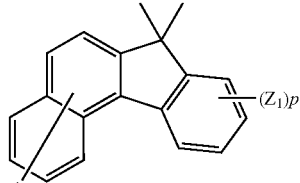

2f

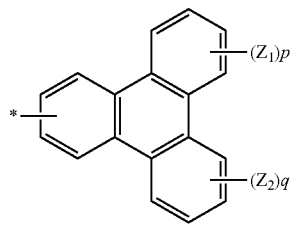

2g

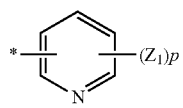

2h

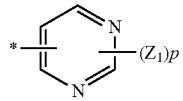

2i

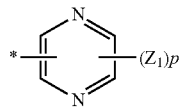

2j

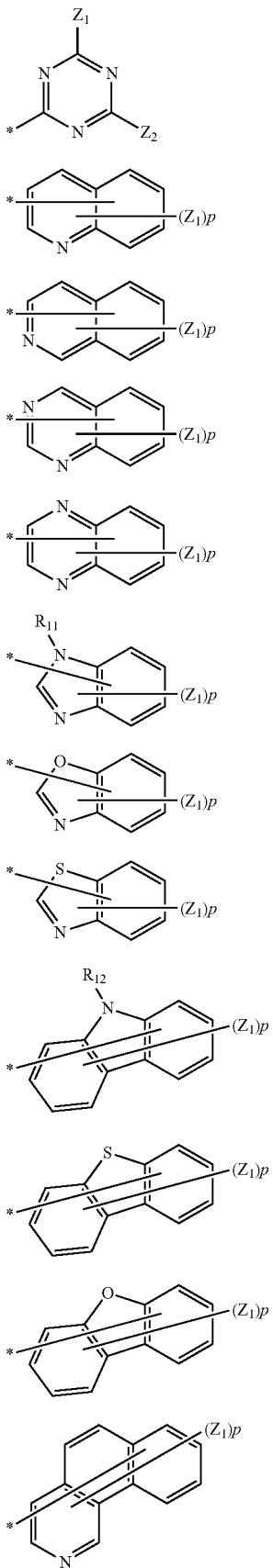
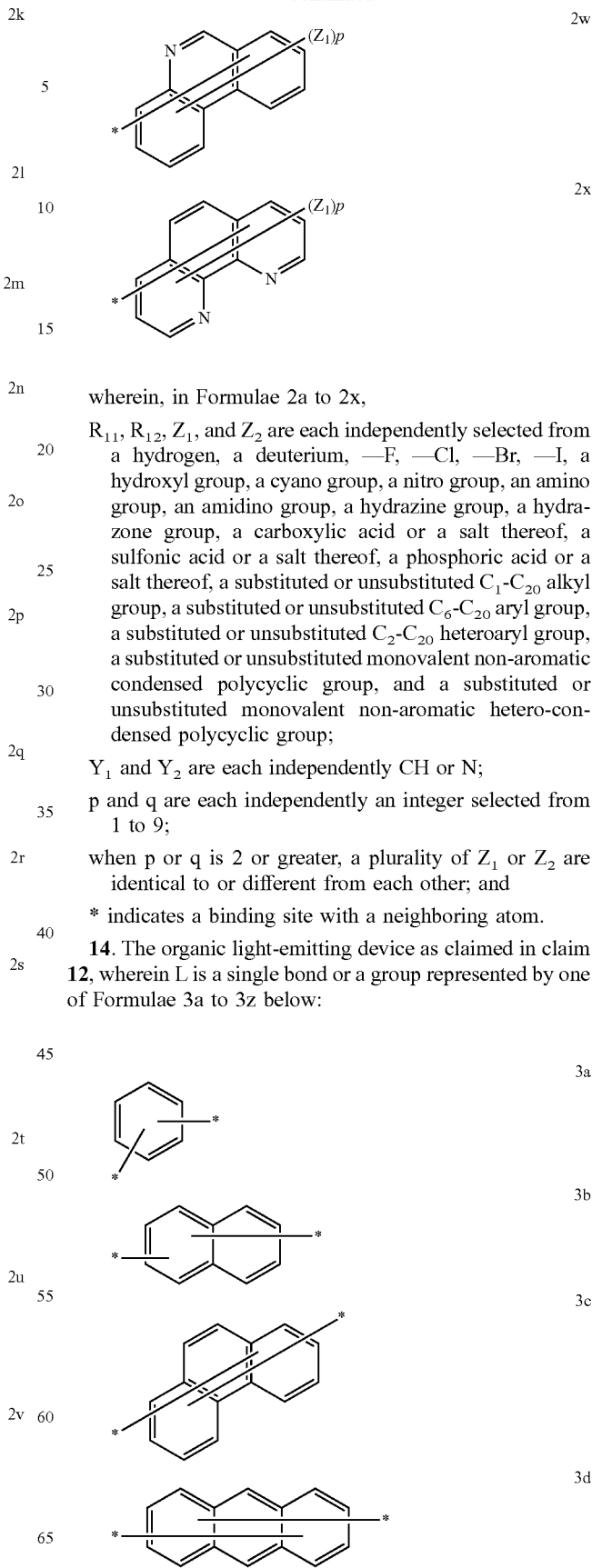

wherein, in Formulae 2a to 2x,

R$_{11}$, R$_{12}$, Z$_1$, and Z$_2$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted C$_1$-C$_{20}$ alkyl group, a substituted or unsubstituted C$_6$-C$_{20}$ aryl group, a substituted or unsubstituted C$_2$-C$_{20}$ heteroaryl group, a substituted or unsubstituted monovalent non-aromatic condensed polycyclic group, and a substituted or unsubstituted monovalent non-aromatic hetero-condensed polycyclic group;

Y$_1$ and Y$_2$ are each independently CH or N;

p and q are each independently an integer selected from 1 to 9;

when p or q is 2 or greater, a plurality of Z$_1$ or Z$_2$ are identical to or different from each other; and

* indicates a binding site with a neighboring atom.

14. The organic light-emitting device as claimed in claim 12, wherein L is a single bond or a group represented by one of Formulae 3a to 3z below:

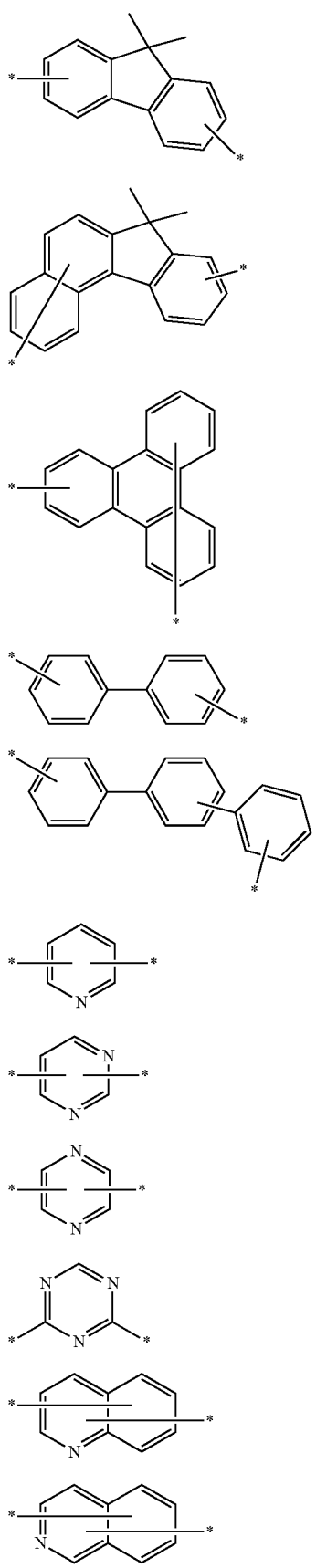
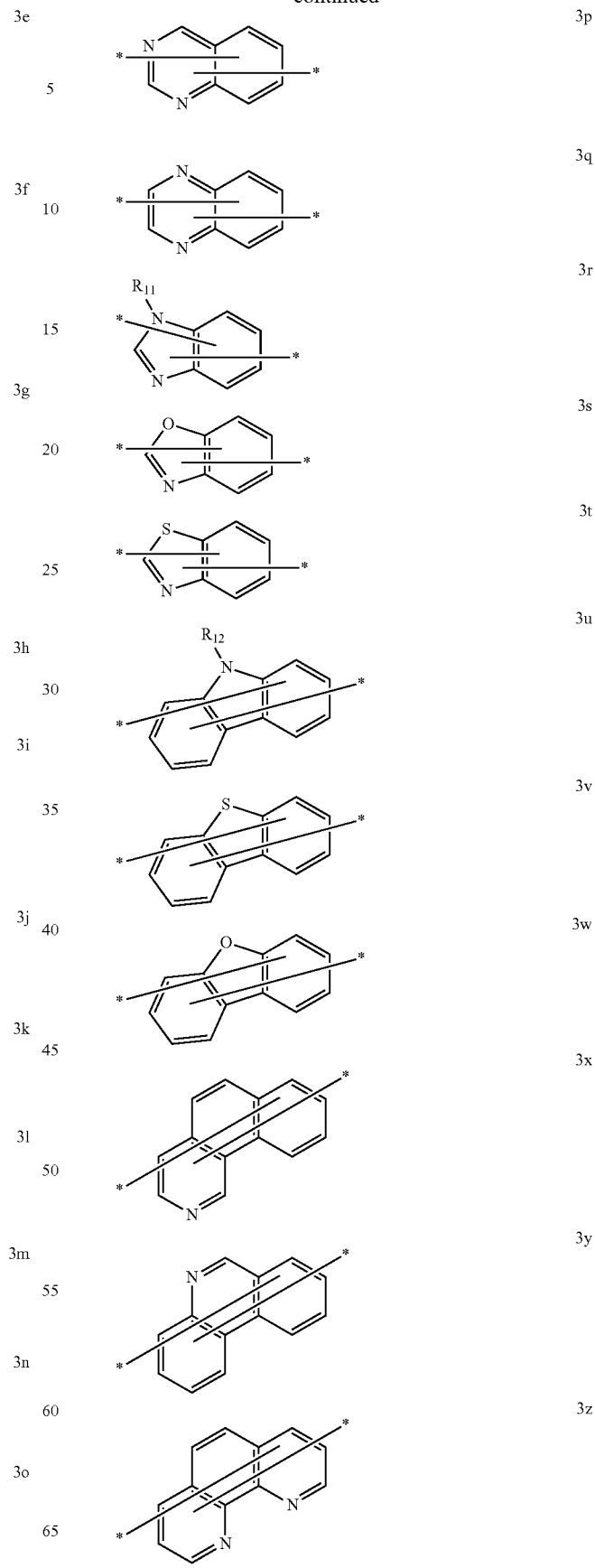

wherein, in Formulae 3a to 3z, $R_{11}$ and $R_{12}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted monovalent non-aromatic condensed polycyclic group, and a substituted or unsubstituted monovalent non-aromatic hetero-condensed polycyclic group; and

* indicates a binding site with a neighboring atom.

15. The organic light-emitting device as claimed in claim 10, wherein at least one of the first host or the second host is one of the following compounds:

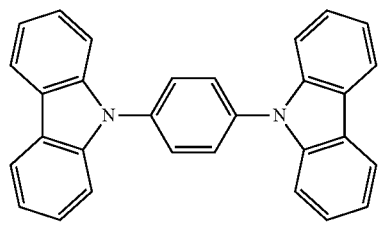

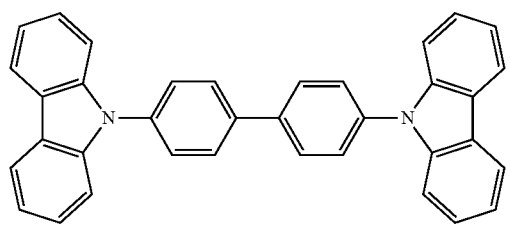

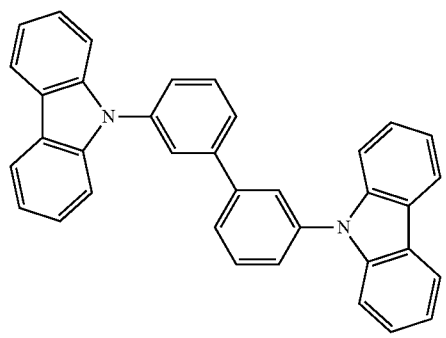

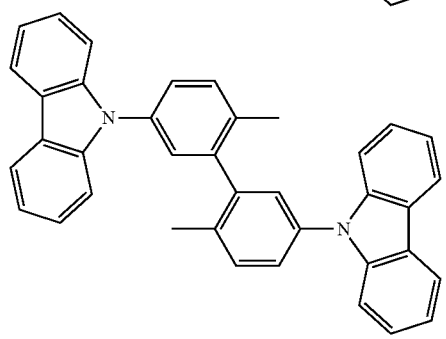

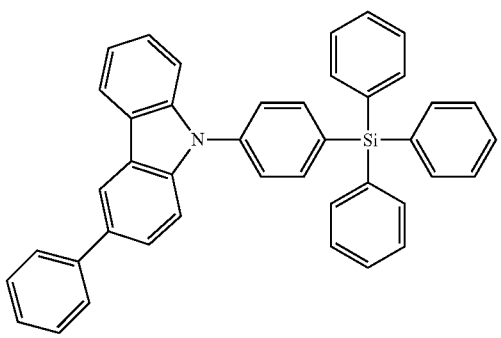

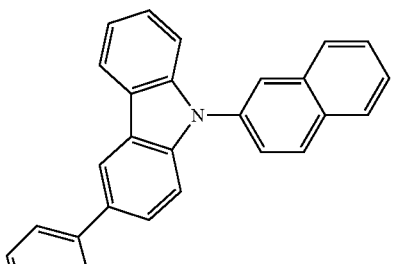

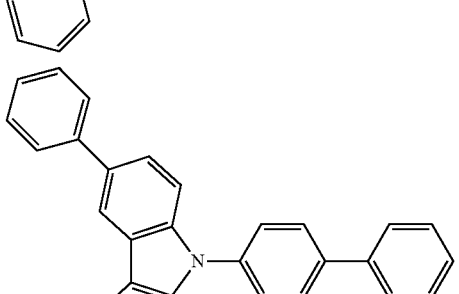

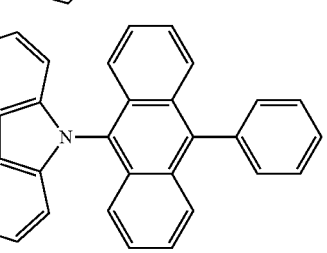

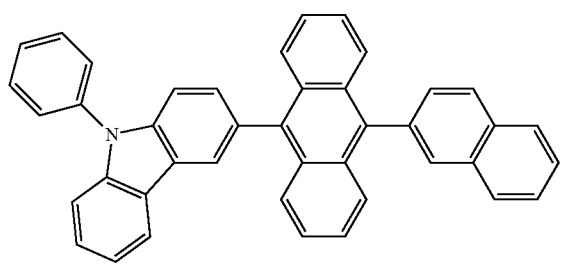
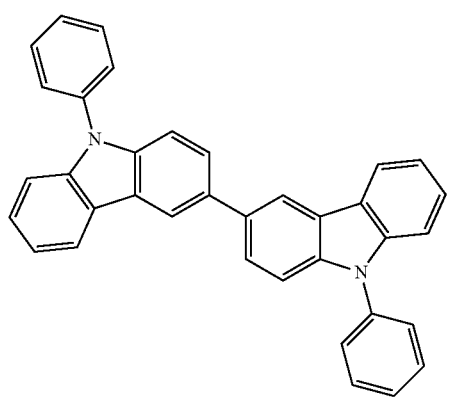
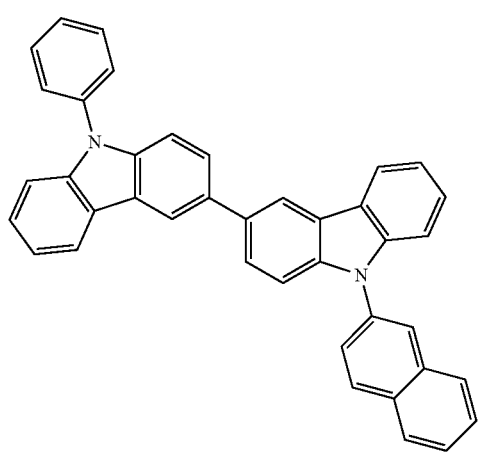
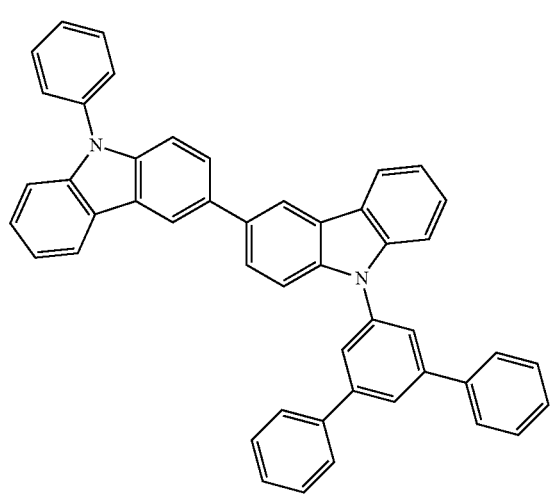
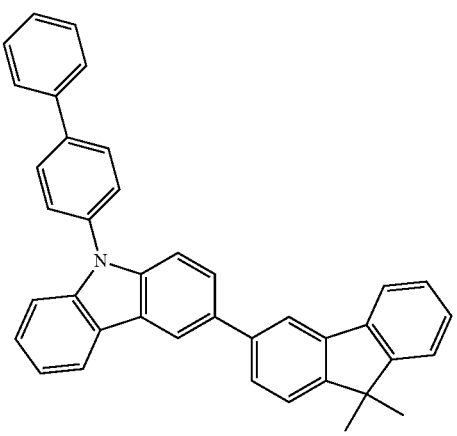
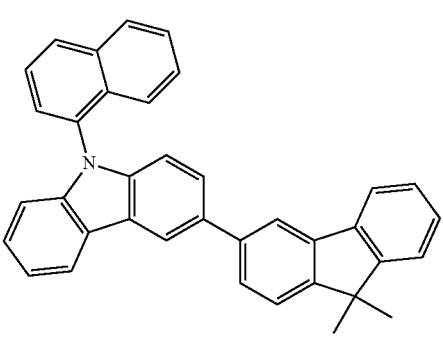
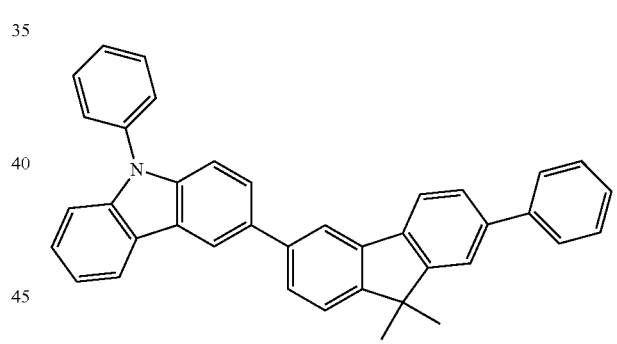
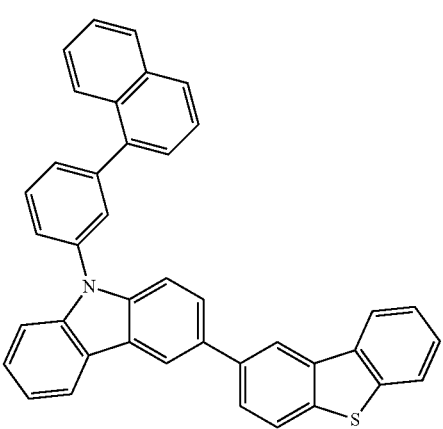

111
-continued
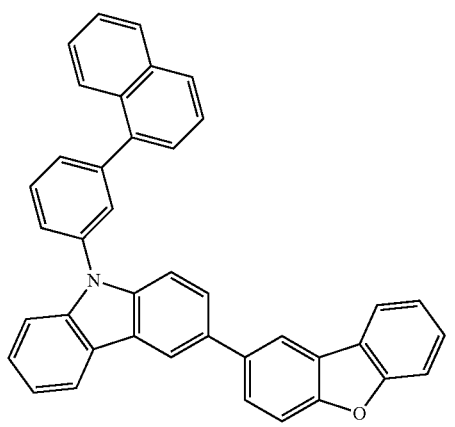
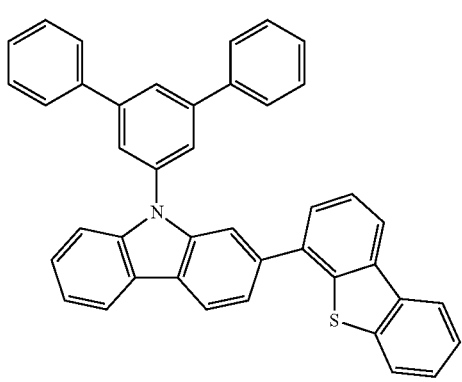
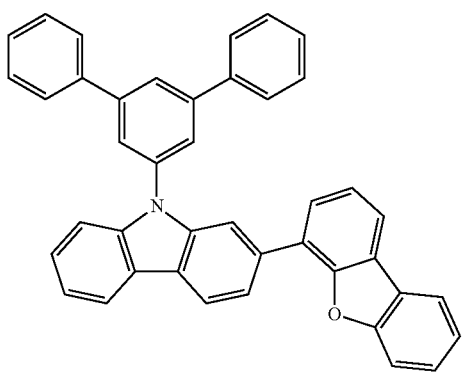
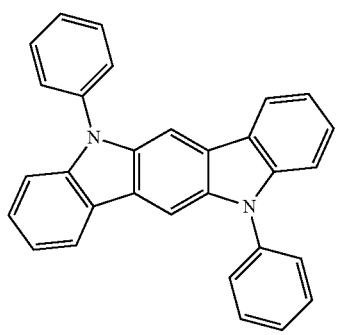
112
-continued
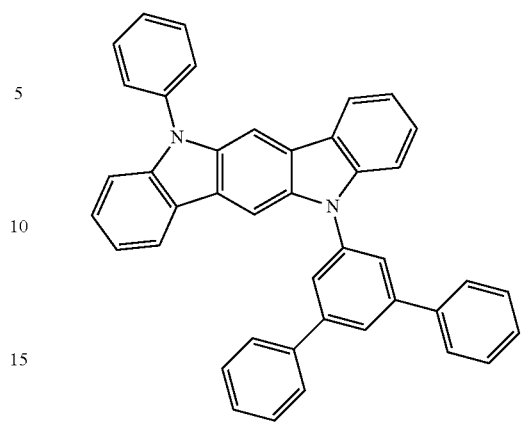
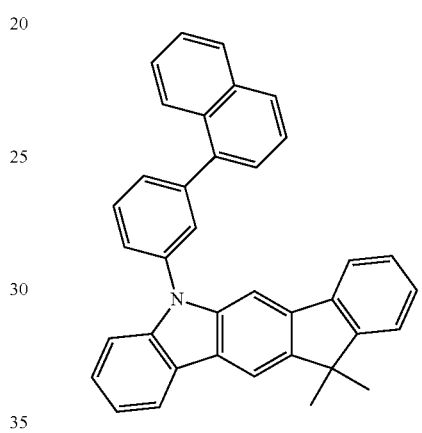
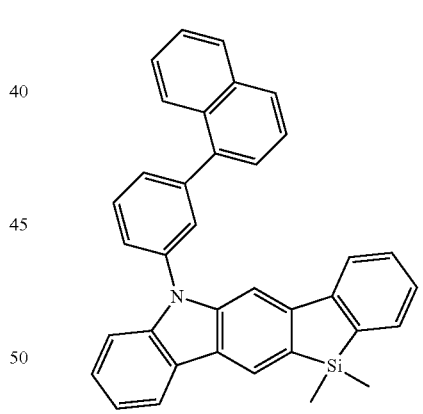
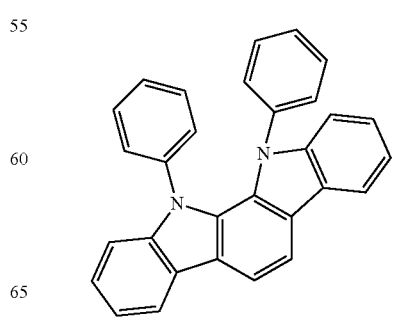

113
-continued
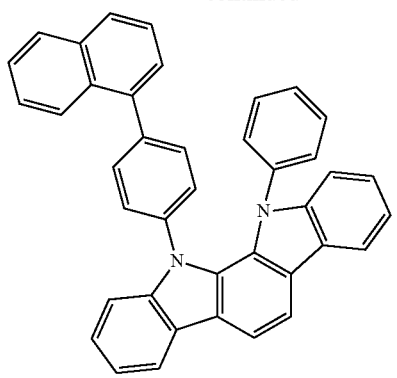
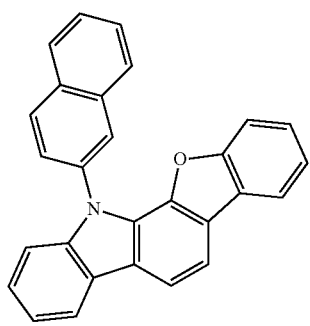
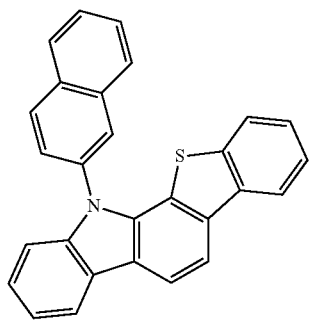
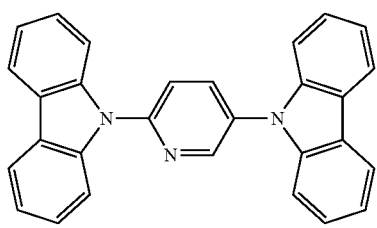
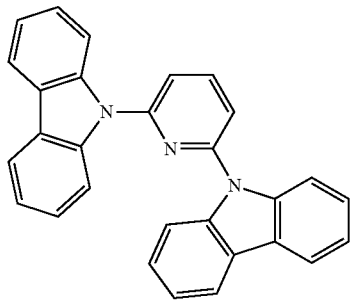
114
-continued
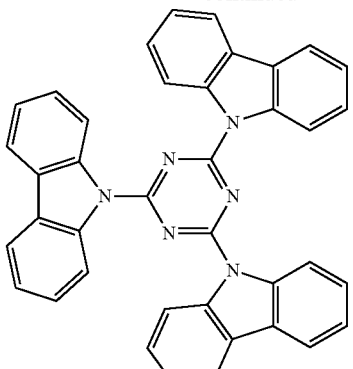
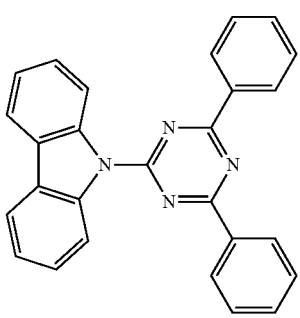
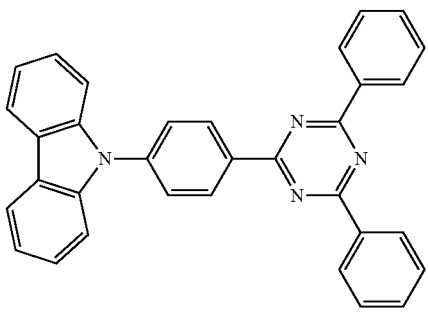
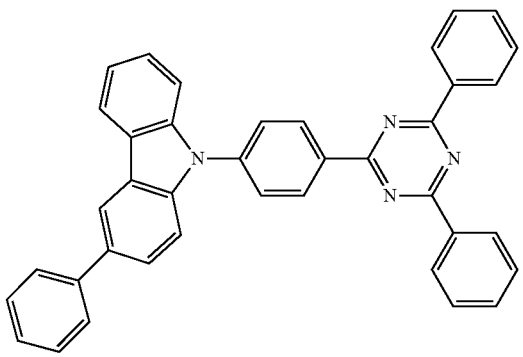
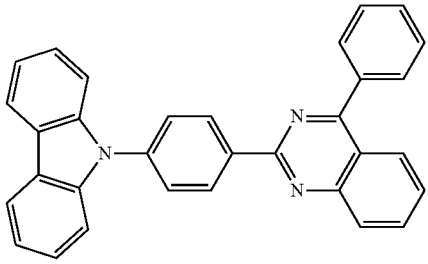

115
-continued
116
-continued
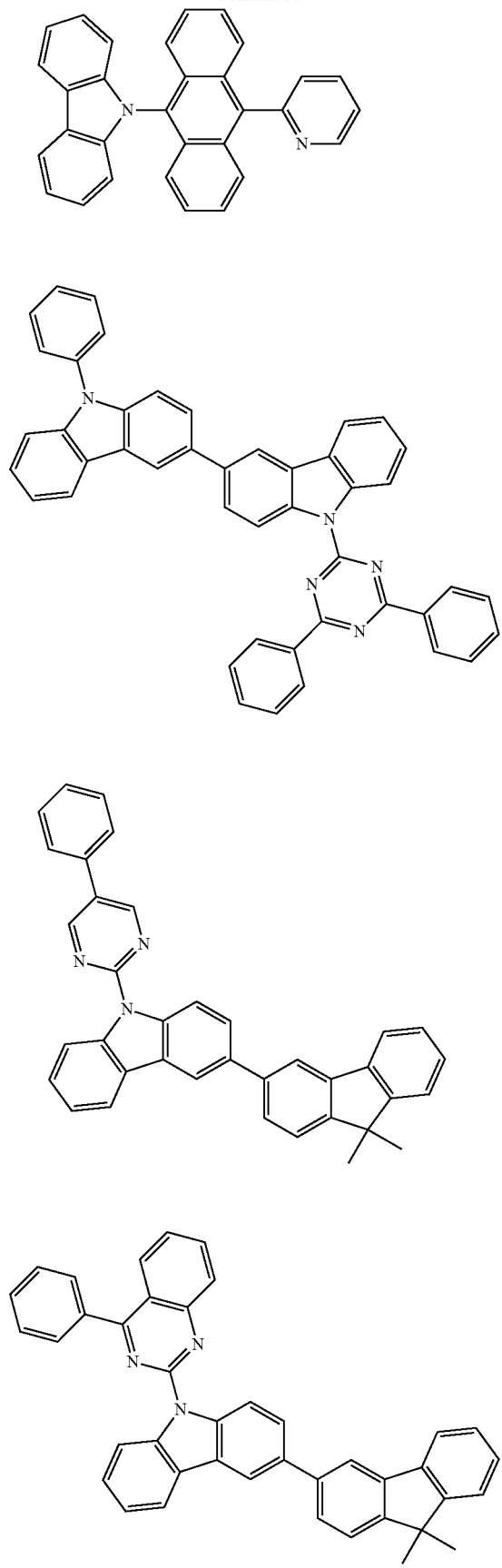
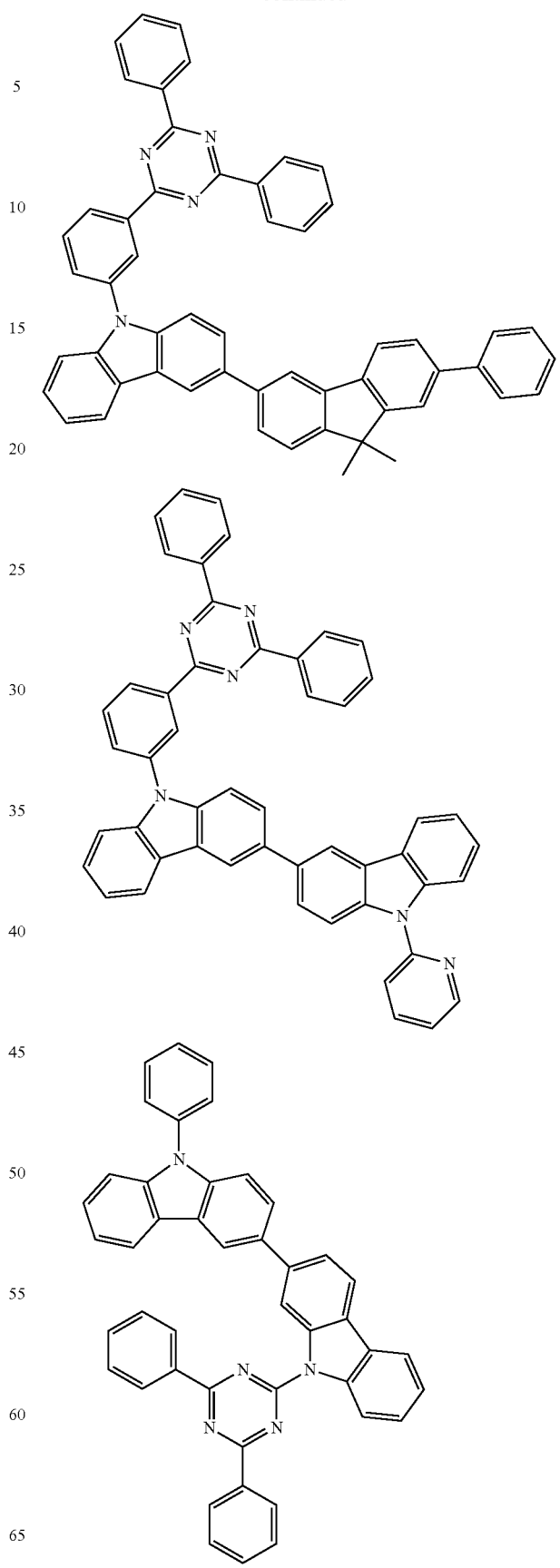

117
-continued
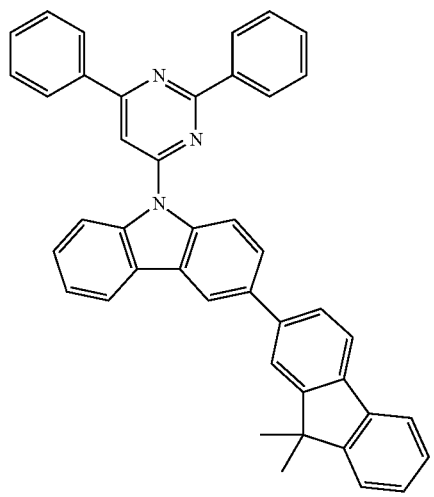
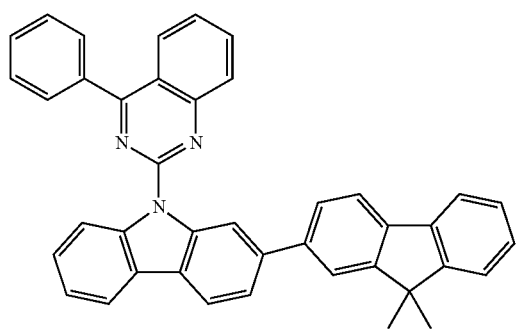
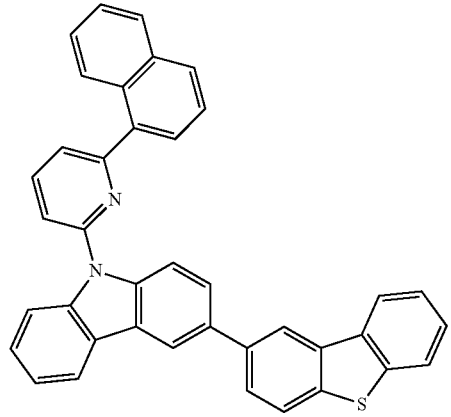
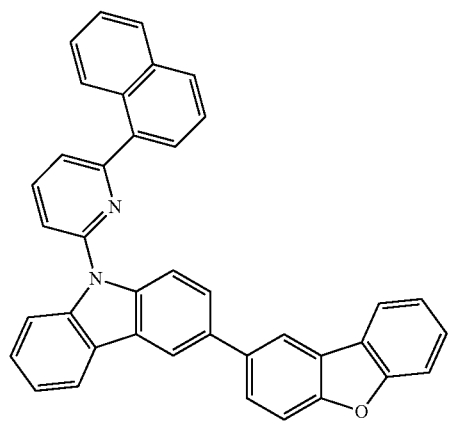
118
-continued
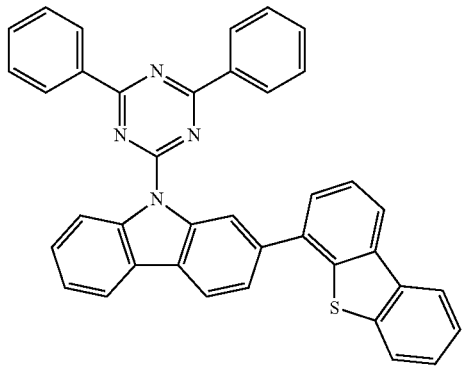
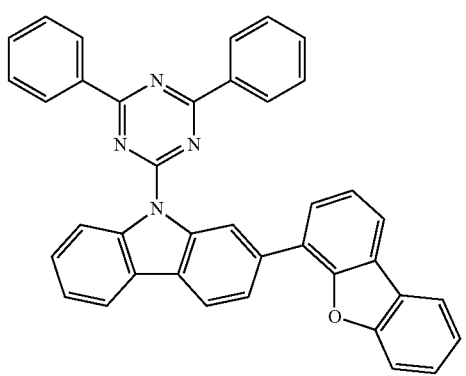
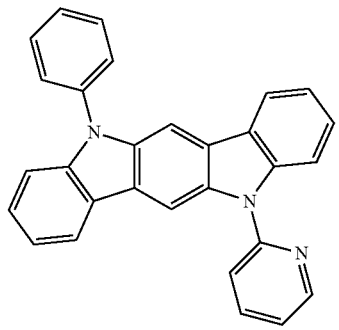
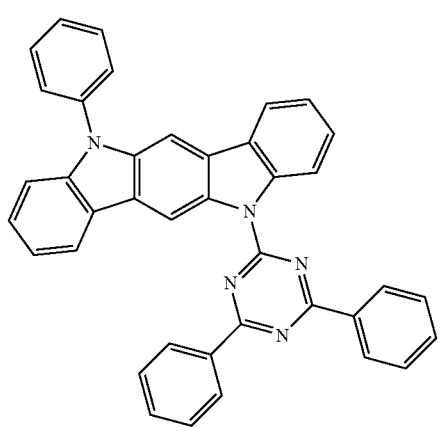

119
-continued
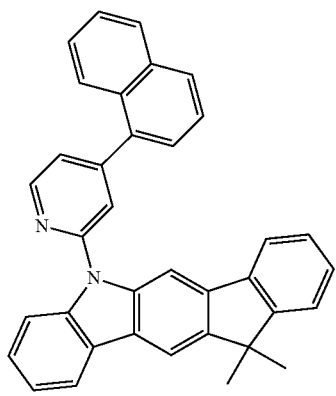
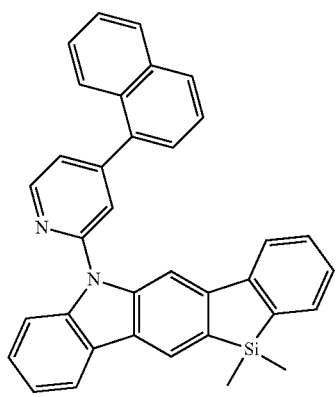
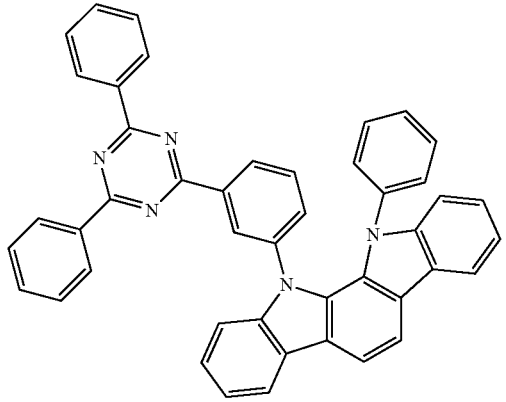
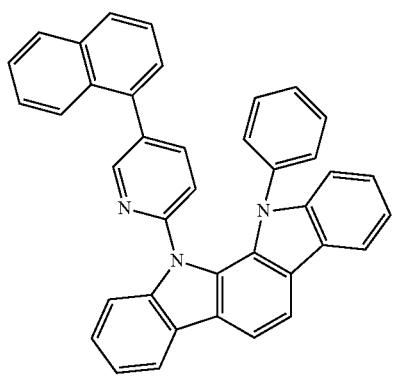
120
-continued
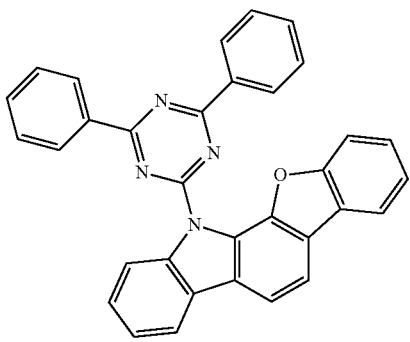
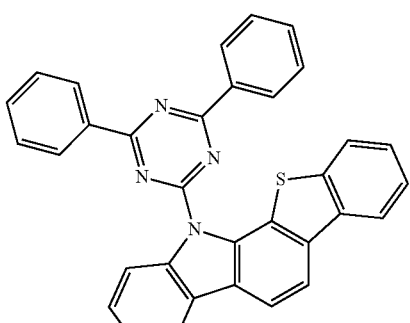
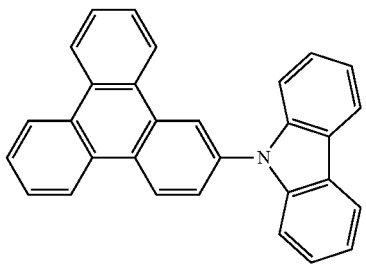
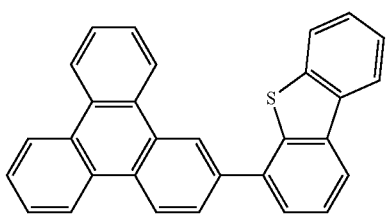
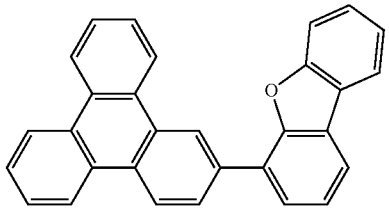
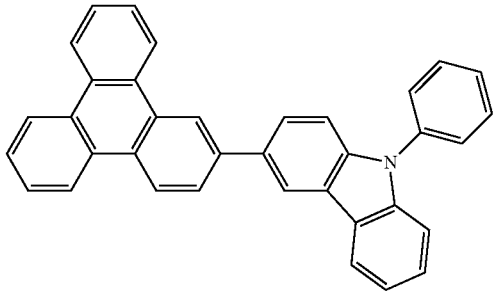

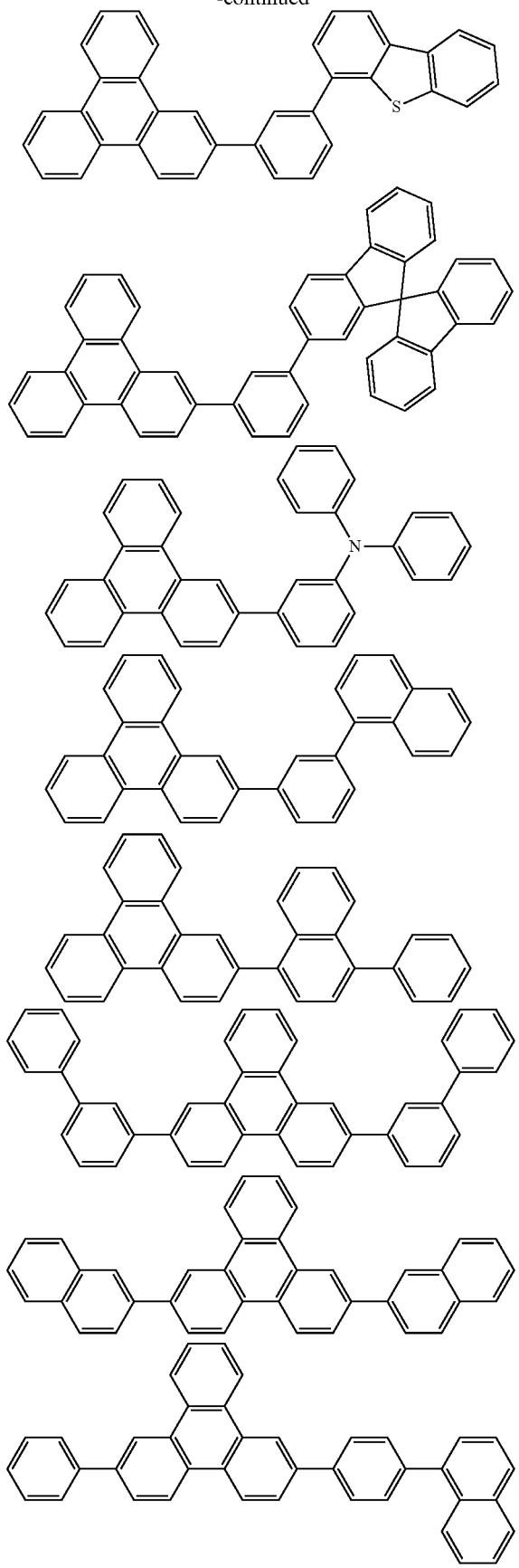
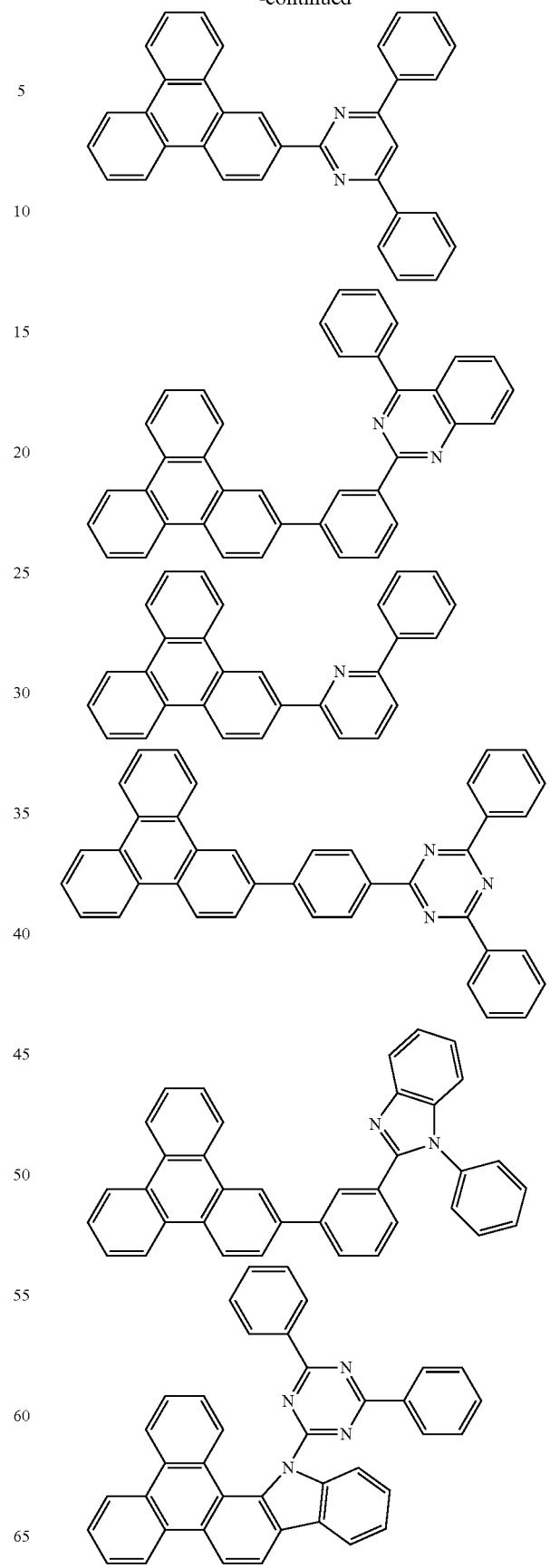

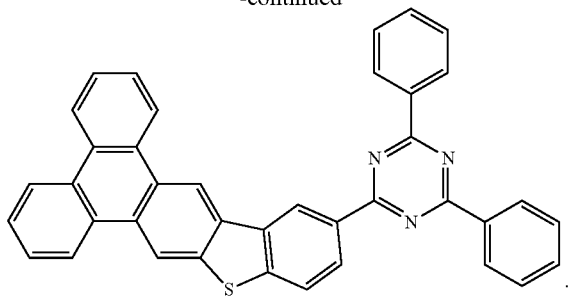
16. The organic light-emitting device as claimed in claim 4, wherein the EML is a phosphorescent EML, the phosphorescent EML including an Ir-complex as a dopant.
17. The organic light-emitting device as claimed in claim 1, wherein the intermediate layer compound is one of the following compounds:
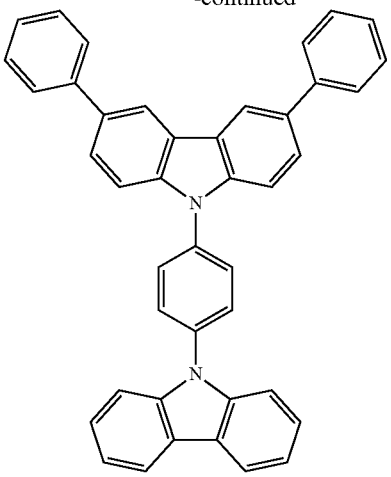
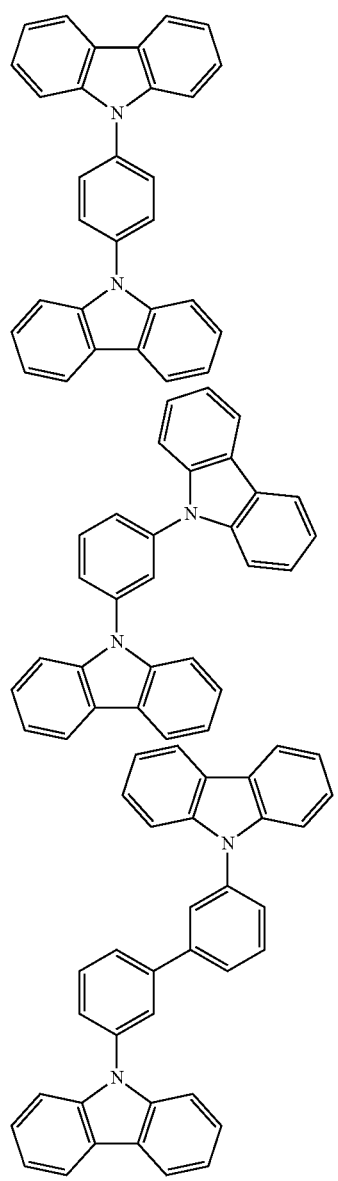
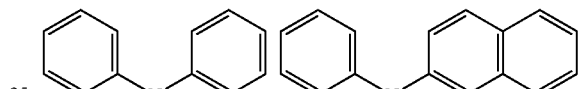
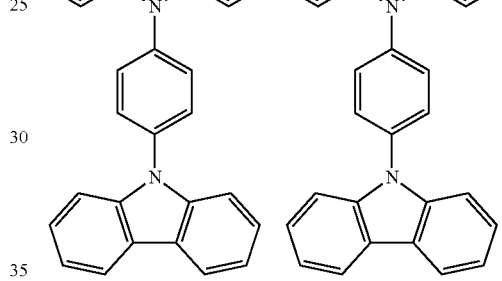
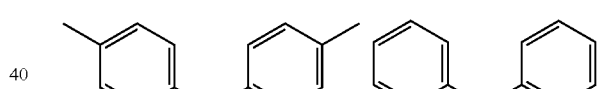
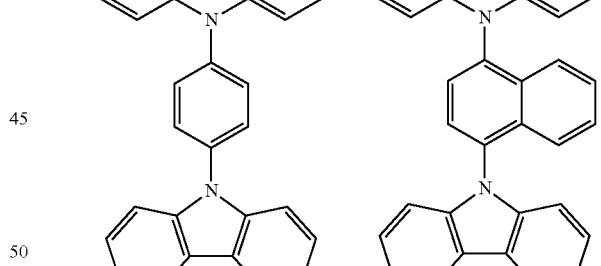
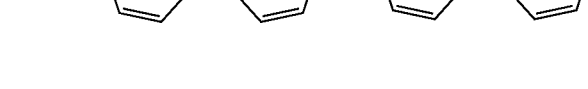
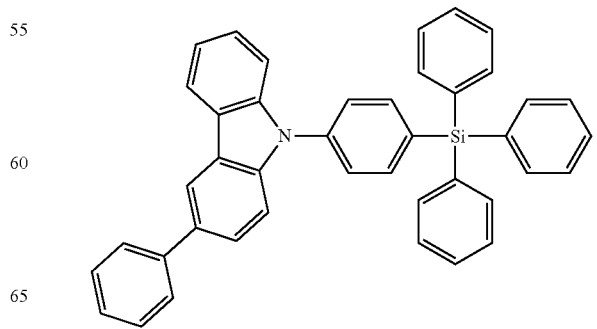

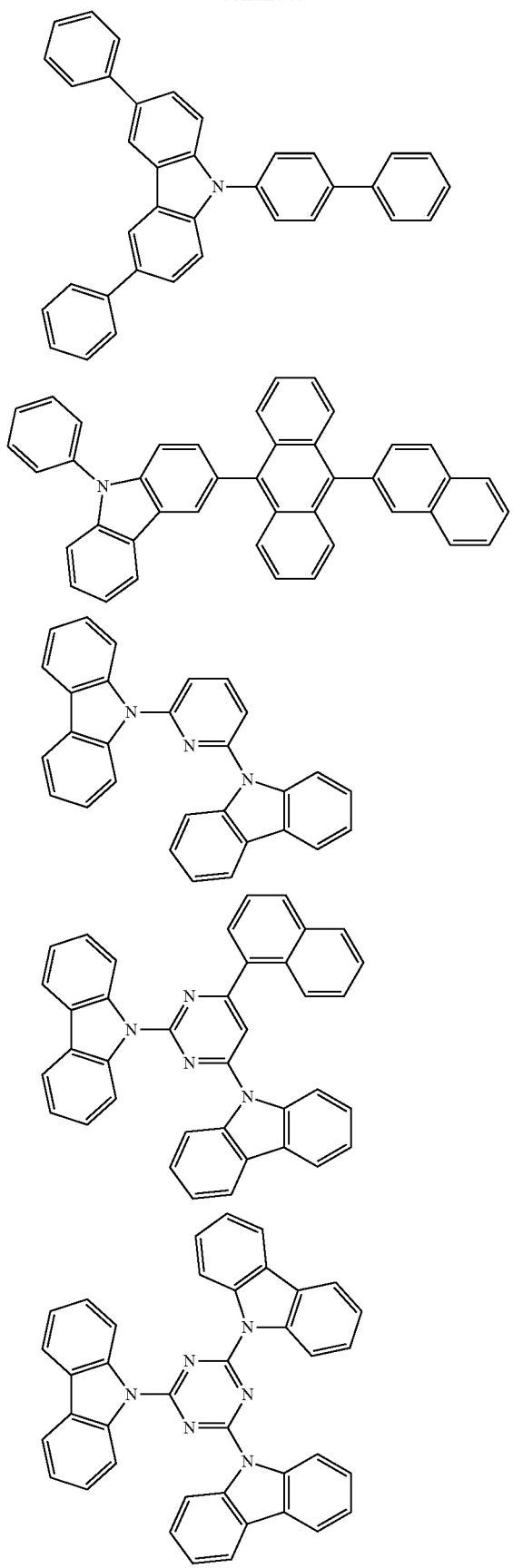
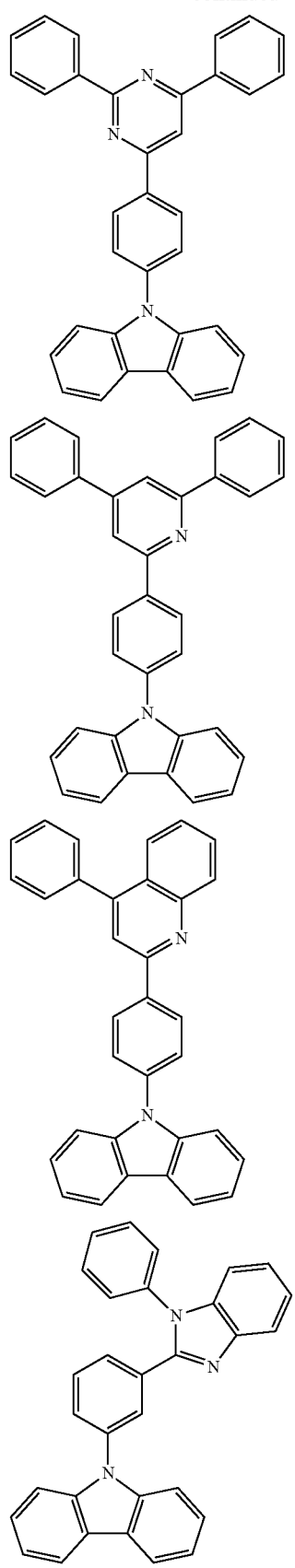

127
-continued
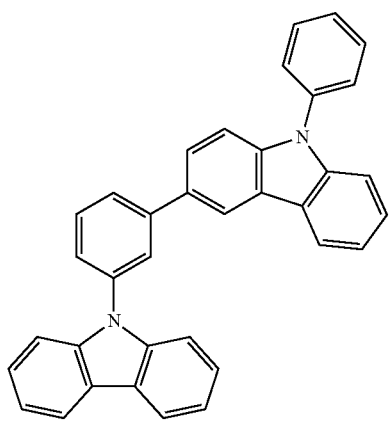
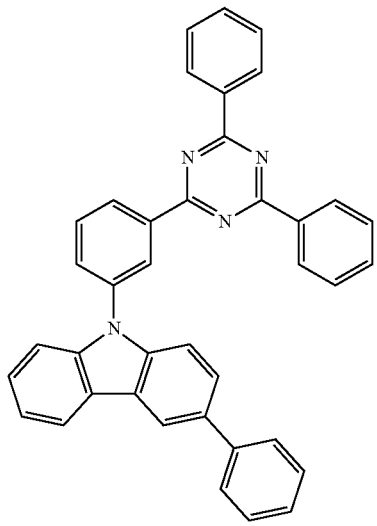
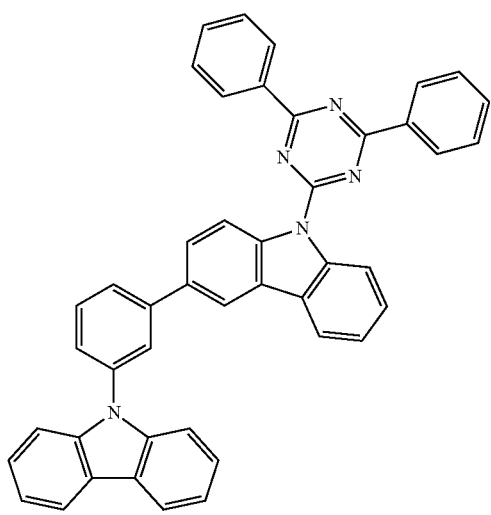
128
-continued
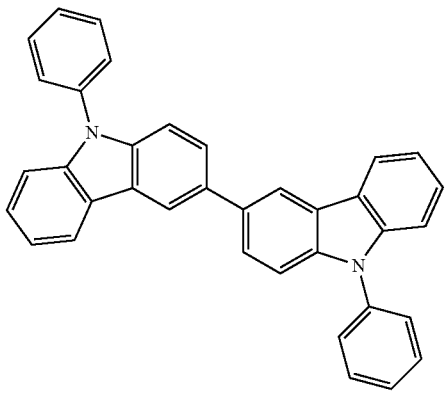
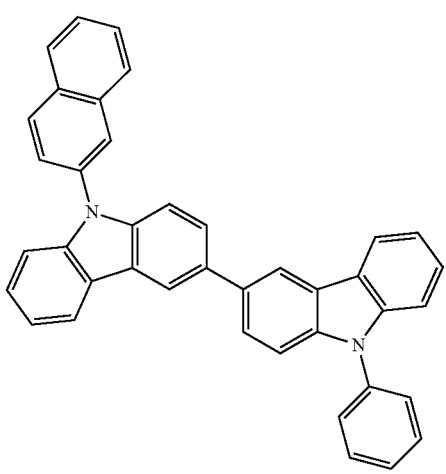
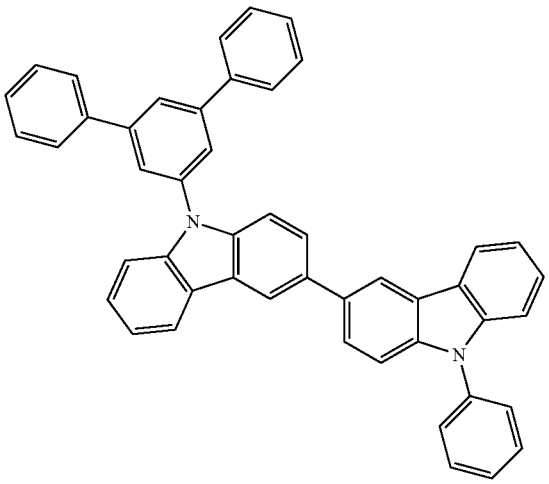

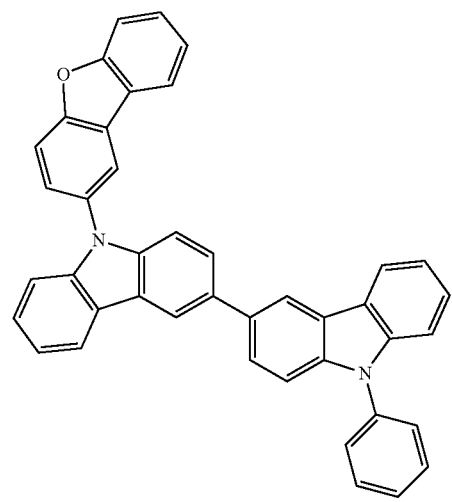
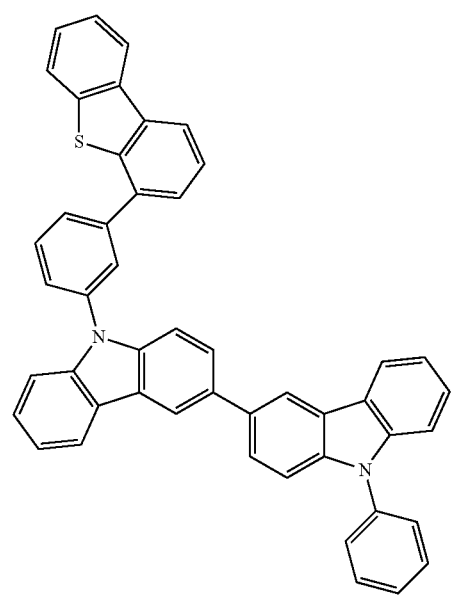
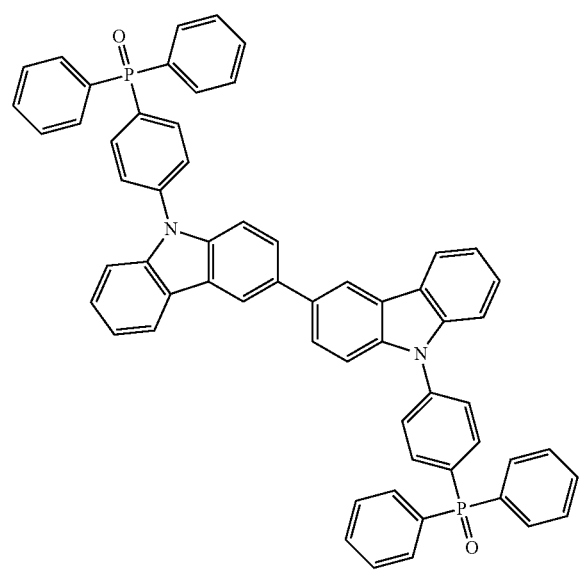
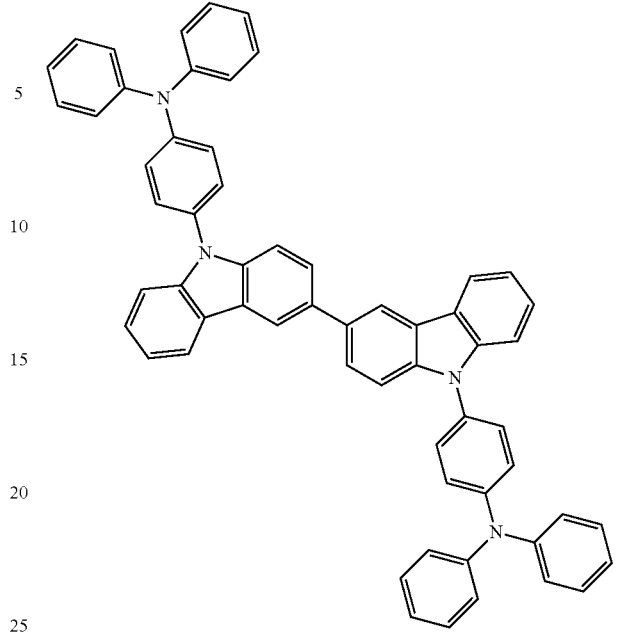
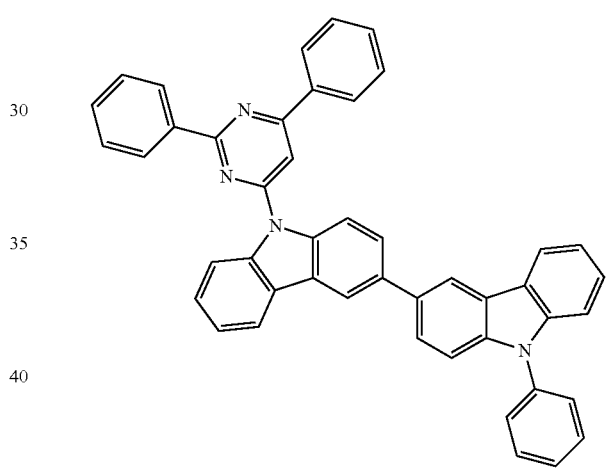
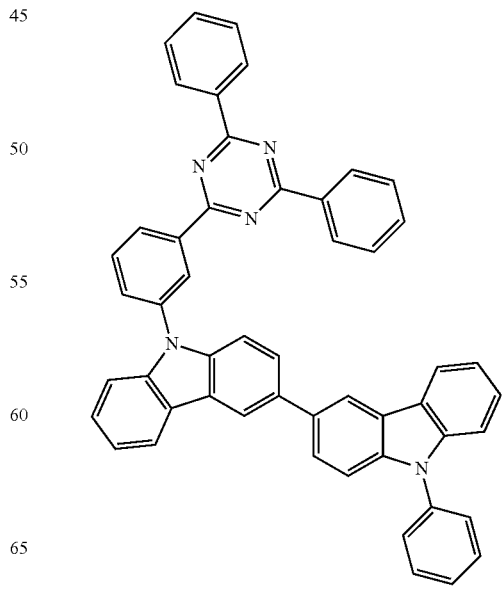

131
-continued
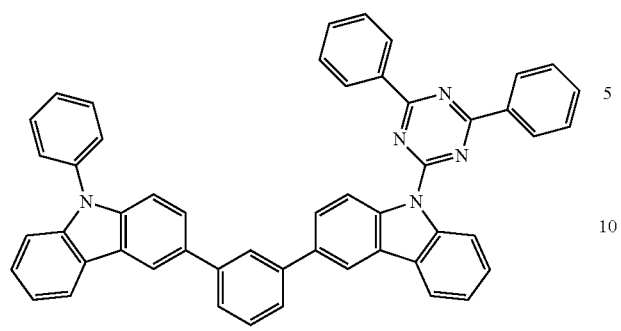
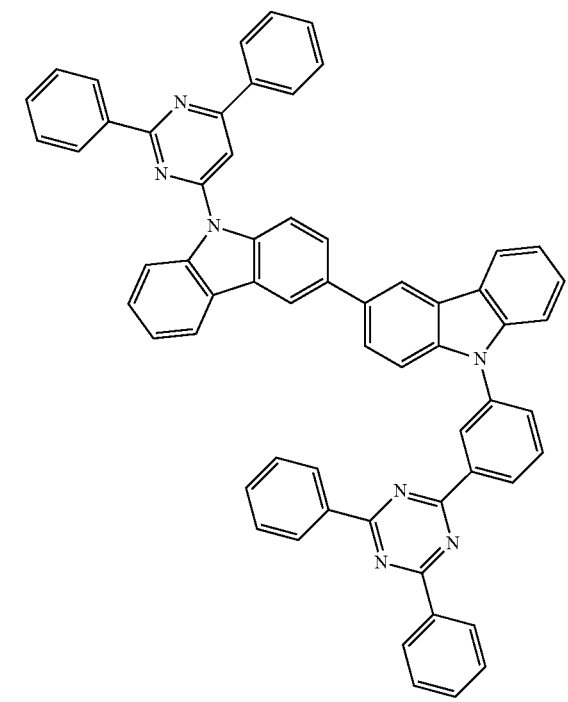
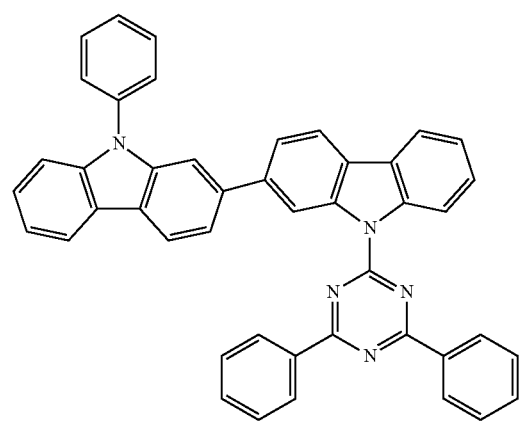
132
-continued
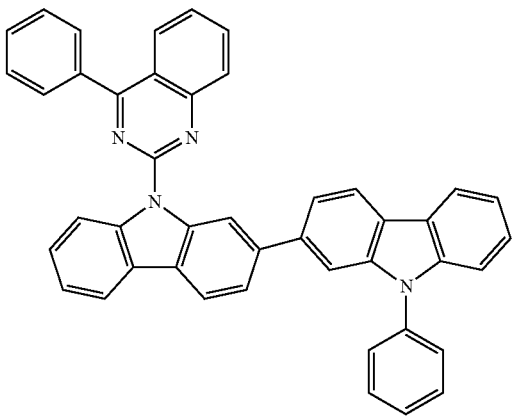
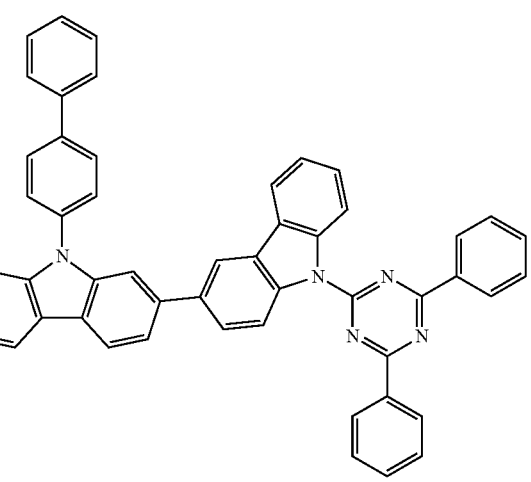
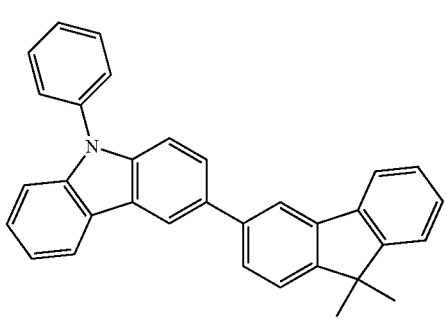
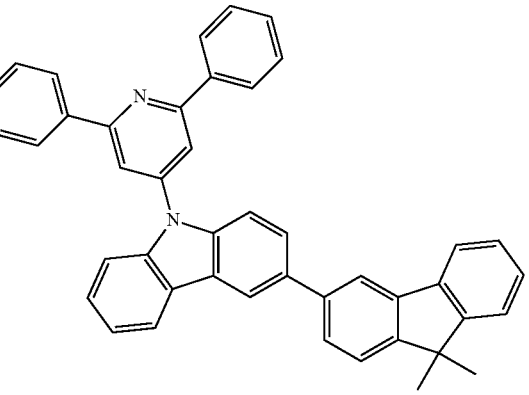

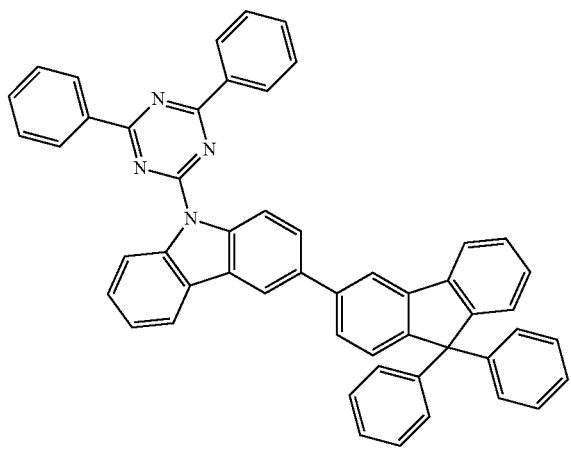
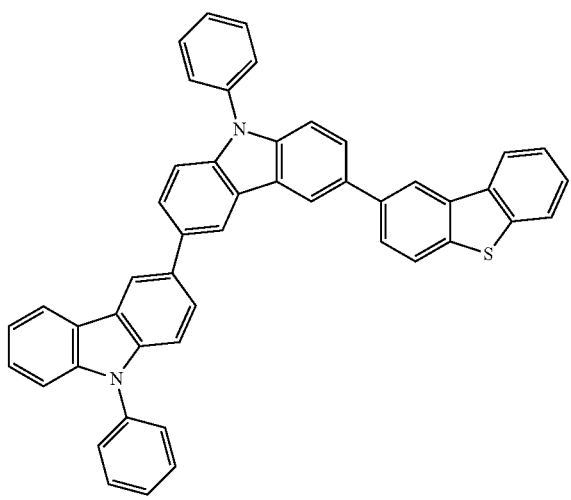
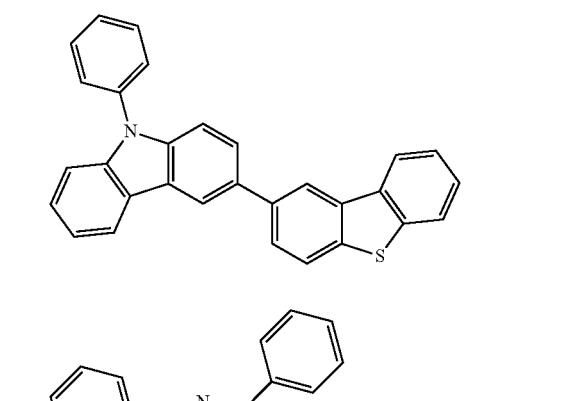
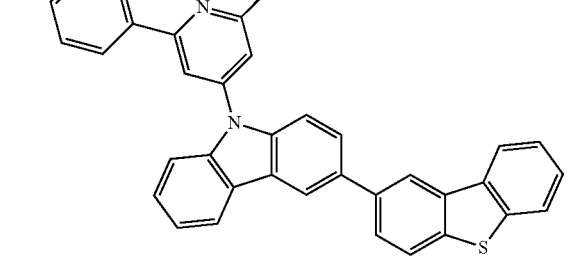
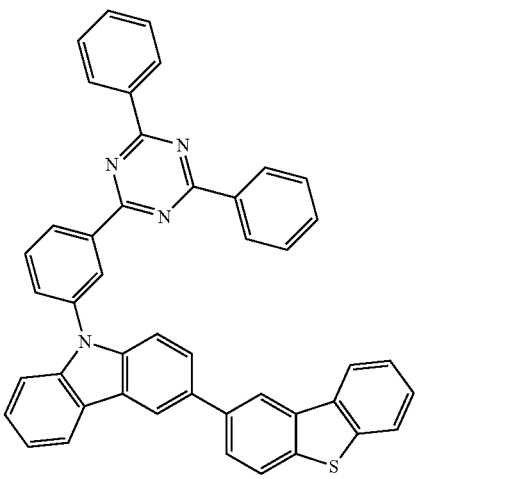
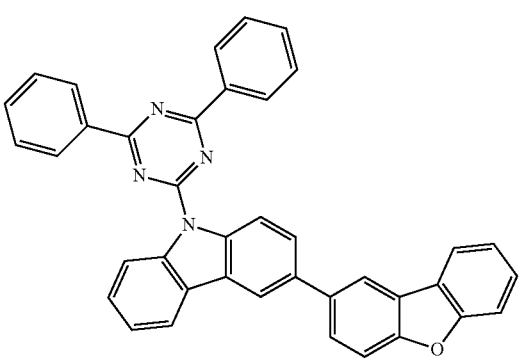
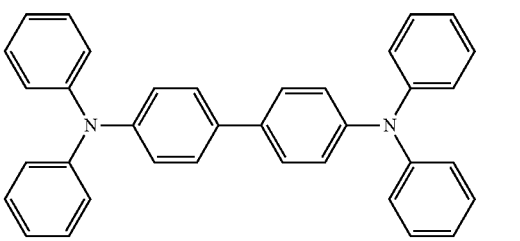
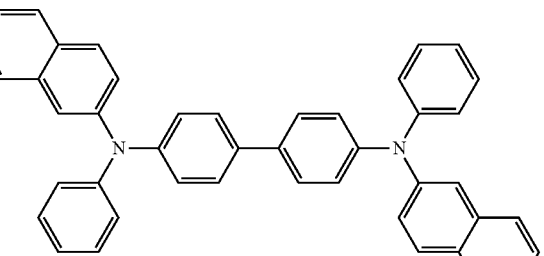
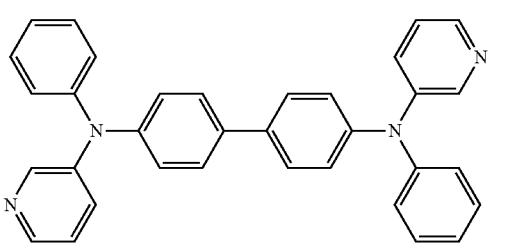

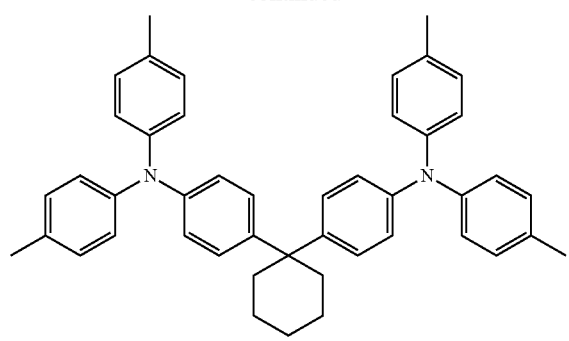
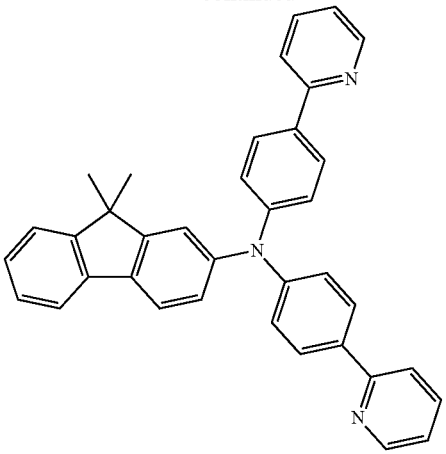
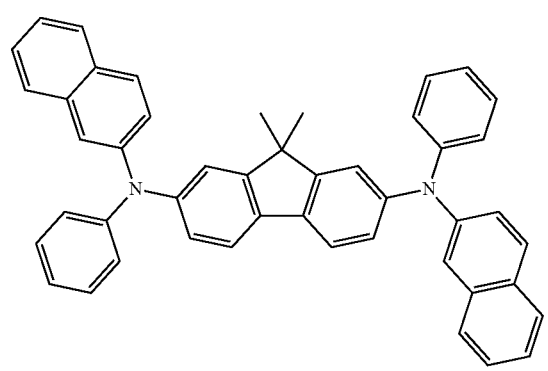
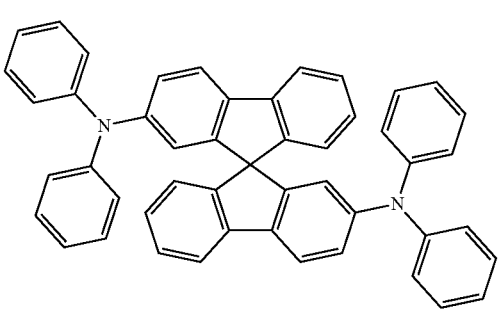
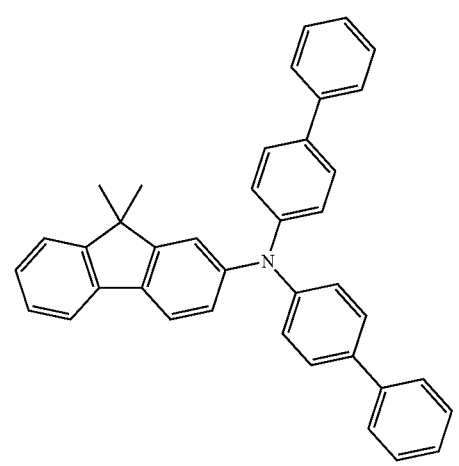
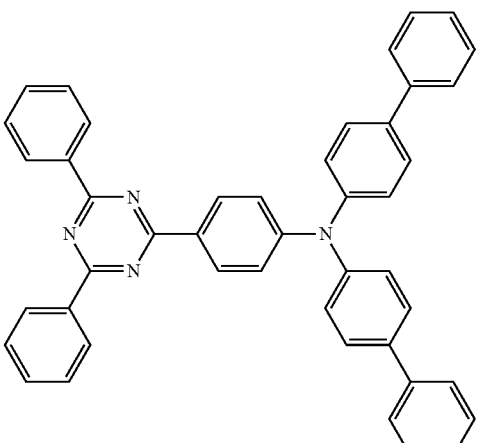
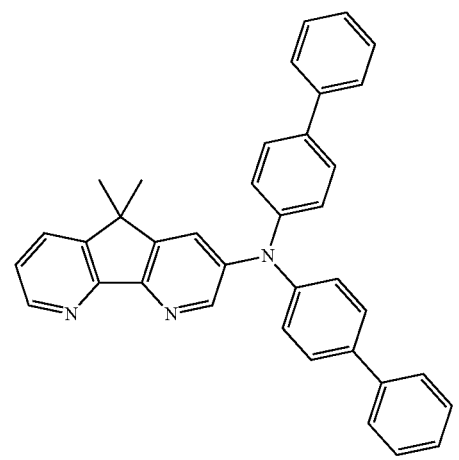
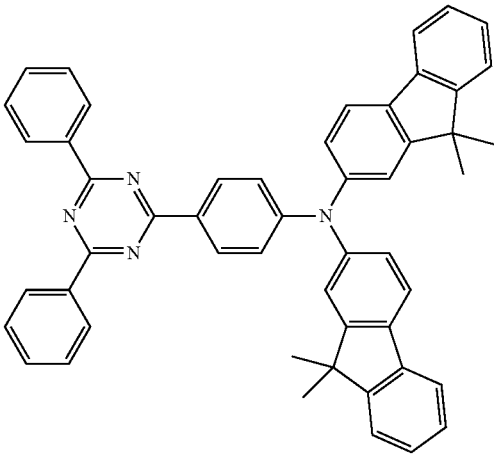

-continued

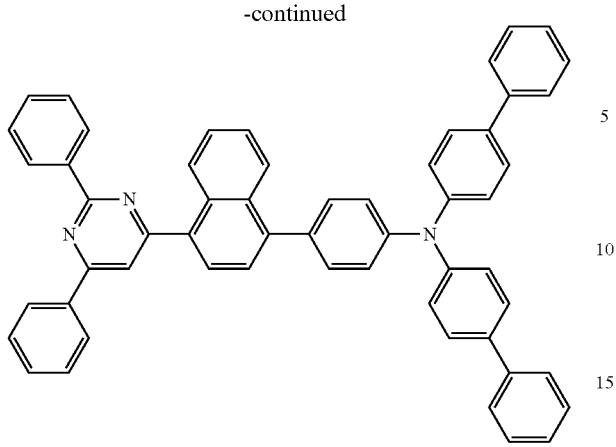

18. The organic light-emitting device as claimed in claim 1, wherein the organic layer is formed by performing a wet process.

19. A flat panel display comprising the organic light-emitting device as claimed in claim 1, wherein the first electrode of the organic light-emitting device is electrically connected to a source electrode or a drain electrode of a thin film transistor.

20. An organic light-emitting device, comprising:
an anode;
a cathode; and
an organic layer between the anode and the cathode, the organic layer including:
an emission layer (EML), the EML including a first host and a second host that are different from one another,
a hole transport region between the anode and the EML, the hole transport region including at least one of a hole injection layer (HIL), a hole transport layer (HTL), a buffer layer, or an electron blocking layer (EBL),
an electron transport region between the EML and the cathode, the electron transport region including at least one of a hole blocking layer (HBL), an electron transport layer (ETL), or an electron injection layer (EIL), and
an intermediate layer between the EML and the electron transport region;
wherein the intermediate layer includes a compound having an electron affinity of more than 0 eV and less than 2.5 eV, and
wherein:
the intermediate layer compound has a triplet energy of at least 2.2 eV when the EML emits red phosphorescence,
the intermediate layer compound has a triplet energy of at least 2.4 eV when the EML emits green phosphorescence, and
the intermediate layer compound has a triplet energy of at least at least 2.6 eV when the EML emits blue phosphorescence.

21. An organic light-emitting device, comprising:
an anode;
a cathode; and
an organic layer between the anode and the cathode, the organic layer including:
an emission layer (EML), the EML including a first host and a second host that are different from one another,
a hole transport region between the anode and the EML, the hole transport region including at least one of a hole injection layer (HIL), a hole transport layer (HTL), a buffer layer, or an electron blocking layer (EBL),
an electron transport region between the EML and the cathode, the electron transport region including at least one of a hole blocking layer (HBL), an electron transport layer (ETL), or an electron injection layer (EIL), and
an intermediate layer between the EML and the electron transport region;
wherein the intermediate layer includes a compound having an electron affinity of more than 0 eV and less than 2.5 eV, and
wherein the intermediate layer compound is represented by Formula 1 below:

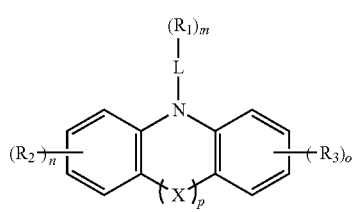

<Formula 1> wherein, in Formula 1,
X is a single bond or $NR_4$;
$R_1$ to $R_4$ are each independently a hydrogen, a deuterium, a substituted or unsubstituted $C_1$-$C_{30}$ alkyl group, a substituted or unsubstituted $C_1$-$C_{30}$ heteroalkyl group, a substituted or unsubstituted $C_6$-$C_{30}$ arylamine group, or a group represented by one of Formulae 2a to 2x below;
L is a single bond, a substituted or unsubstituted $C_6$-$C_{60}$ arylene group, a substituted or unsubstituted $C_1$-$C_{60}$ heteroarylene group, or a linkage connecting 2 to 5 of the arylene groups or the heteroarylene groups;
$R_{51}$ and $R_{52}$ are each independently a substituted or unsubstituted $C_1$-$C_{60}$ alkyl group, a substituted or unsubstituted $C_1$-$C_{60}$ heteroalkyl group, a substituted or unsubstituted $C_6$-$C_{60}$ aryl group, a substituted or unsubstituted $C_2$-$C_{60}$ heteroaryl group, a substituted or unsubstituted $C_6$-$C_{60}$ condensed polycyclic group, or a $C_6$-$C_{30}$ arylamine group;
m, n, and o are each independently an integer selected from 1 to 4, and when any of m, n, and o is 2 or greater, $R_1$ to $R_3$ are the same or different from each other; and
p is an integer selected from 0 and 1, and when p is 0, a benzene moiety substituted with $R_2$ and a benzene moiety substituted with $R_3$ are not connected in an X-shape,

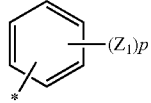

2a

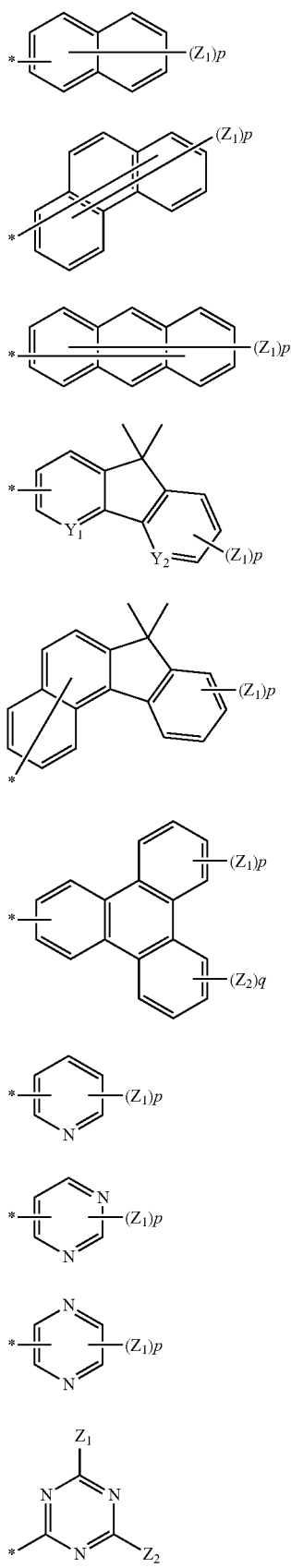
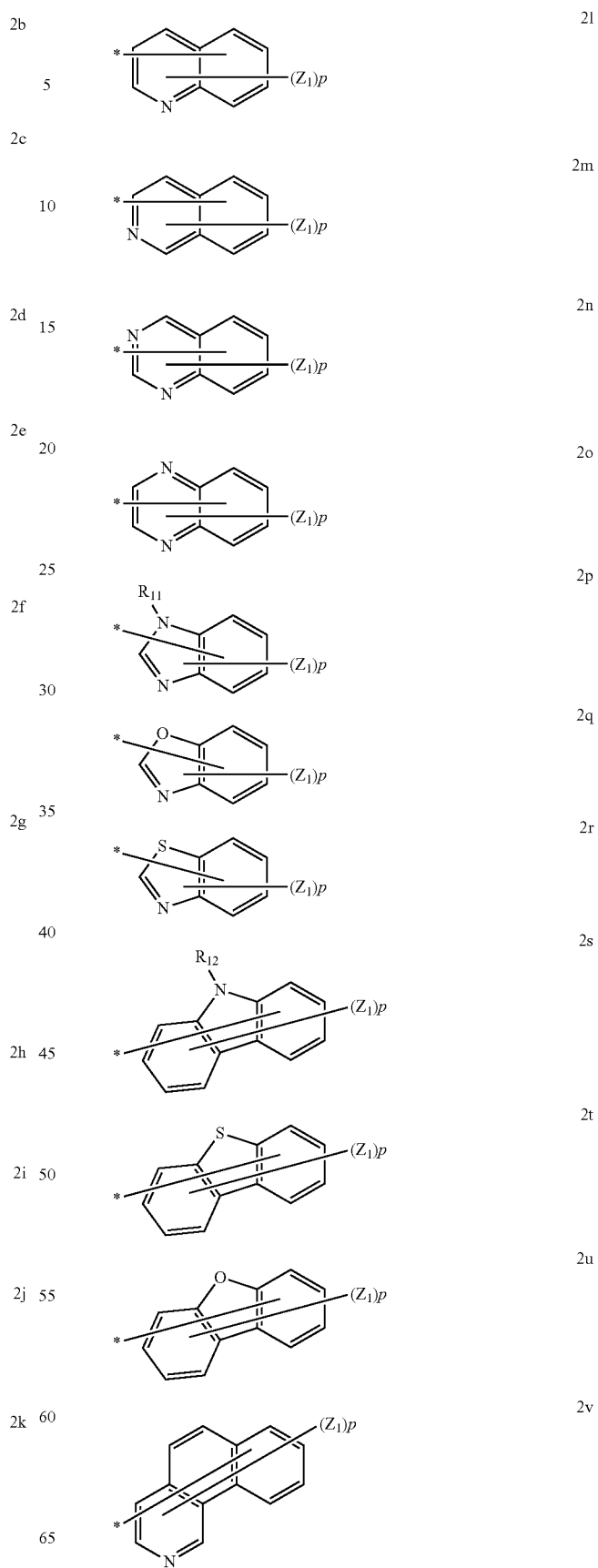

-continued

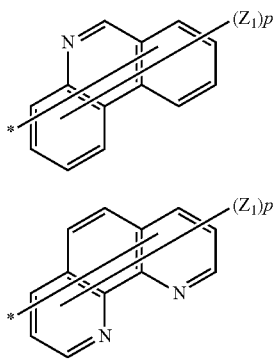

wherein, in Formulae 2a to 2x,
$R_{11}$, $R_{12}$, $Z_1$, and $Z_2$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted monovalent non-aromatic condensed polycyclic group, and a substituted or unsubstituted monovalent non-aromatic hetero-condensed polycyclic group;

$Y_1$ and $Y_2$ are each independently CH or N;

p and q are each independently an integer selected from 1 to 9;

when p or q is 2 or greater, a plurality of $Z_1$ or $Z_2$ are identical to or different from each other; and

* indicates a binding site with a neighboring atom.

* * * * *